(12) United States Patent
Murakami

(10) Patent No.: US 8,373,170 B2
(45) Date of Patent: Feb. 12, 2013

(54) DISPLAY APPARATUS, MANUFACTURING METHOD THEREOF, AND ELECTRONIC EQUIPMENT

(75) Inventor: Akishige Murakami, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 105 days.

(21) Appl. No.: 12/877,433

(22) Filed: Sep. 8, 2010

(65) Prior Publication Data

US 2011/0057191 A1 Mar. 10, 2011

(30) Foreign Application Priority Data

Sep. 8, 2009 (JP) ................. 2009-207087
Feb. 19, 2010 (JP) ................. 2010-035335
Aug. 27, 2010 (JP) ................. 2010-190369

(51) Int. Cl.
*H01J 63/04* (2006.01)
*H01L 33/00* (2010.01)

(52) U.S. Cl. ............... 257/72; 257/88; 257/E33.064; 313/500; 313/505

(58) Field of Classification Search ............ 313/500, 313/505; 257/72, 88, E33.064
See application file for complete search history.

(56) References Cited

U.S. PATENT DOCUMENTS

| | | | |
|---|---|---|---|
| 6,614,174 B1 | 9/2003 | Urabe et al. | |
| 7,219,976 B2 * | 5/2007 | Mori et al. | 347/33 |
| 7,573,068 B2 | 8/2009 | Shimoda et al. | |
| 7,683,537 B2 | 3/2010 | Yoshida et al. | |
| 2008/0311285 A1 | 12/2008 | Hirai et al. | |

FOREIGN PATENT DOCUMENTS

| | | |
|---|---|---|
| JP | 2001-148291 | 5/2001 |
| JP | 2002-237389 | 8/2002 |
| JP | 2004-119219 | 4/2004 |
| JP | 2005-79064 | 3/2005 |
| JP | 2005-197027 | 7/2005 |
| JP | 2006-119618 | 5/2006 |
| JP | 2006-260954 | 9/2006 |
| JP | 2007-101713 | 4/2007 |
| JP | 2007-264445 | 10/2007 |
| JP | 2008-87457 | 4/2008 |
| JP | 2008-91070 | 4/2008 |
| JP | 2008-218250 | 9/2008 |
| JP | 2008-304945 | 12/2008 |
| JP | 2009-21552 | 1/2009 |
| JP | 2009-36948 | 2/2009 |
| JP | 4328383 | 6/2009 |
| JP | 2009-200049 | 9/2009 |
| KR | 10-2005-0075352 | 7/2005 |

OTHER PUBLICATIONS

Mar. 14, 2012 Korean official action (with English translation) in connection with a counterpart Korean patent application.
Korean official action dated Sep. 26, 2012 in corresponding Korean Patent Application No.10-2010-0088161.

* cited by examiner

*Primary Examiner* — Minh-Loan T Tran
(74) *Attorney, Agent, or Firm* — Cooper & Dunham LLP

(57) ABSTRACT

A display apparatus is disclosed. The display apparatus includes a transistor formed on a substrate; an interlayer insulator formed on the transistor; a pixel electrode formed on the interlayer insulator; a first partition located above a contact hole which penetrates the interlayer insulator; and a second partition which intersects with the first partition, or which is located on a straight line intersecting with the first partition, and which brings a width value of the pixel electrode to a predetermined value.

9 Claims, 50 Drawing Sheets

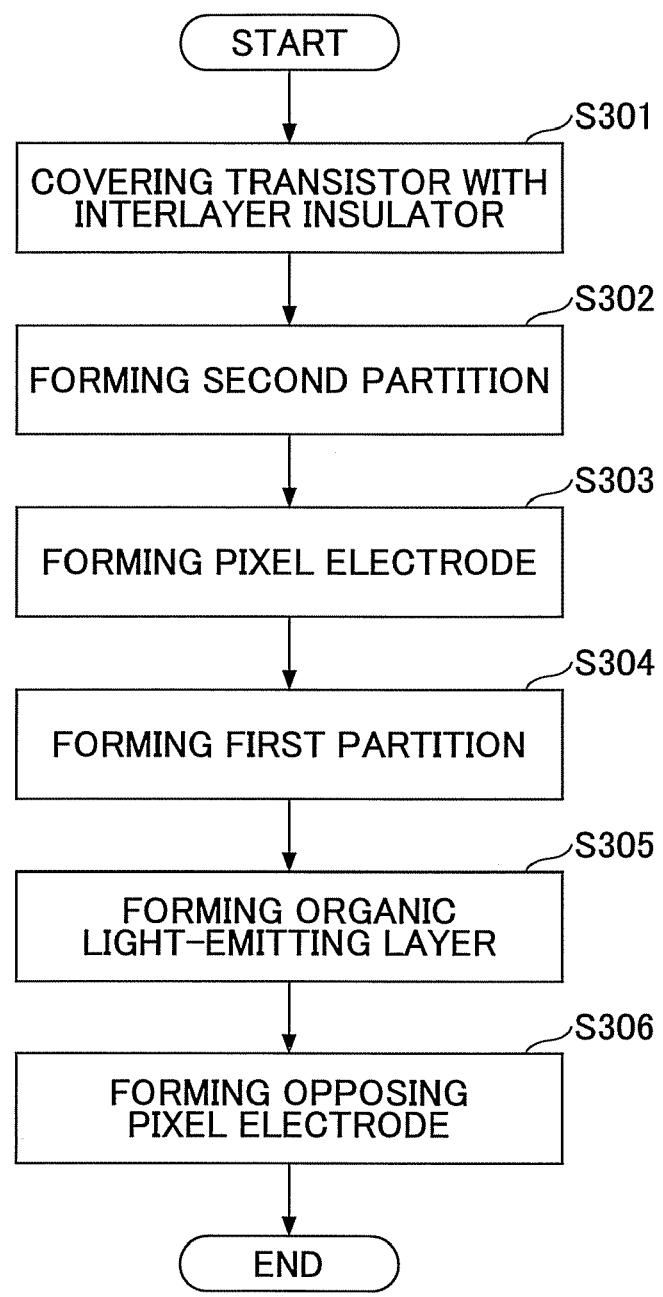

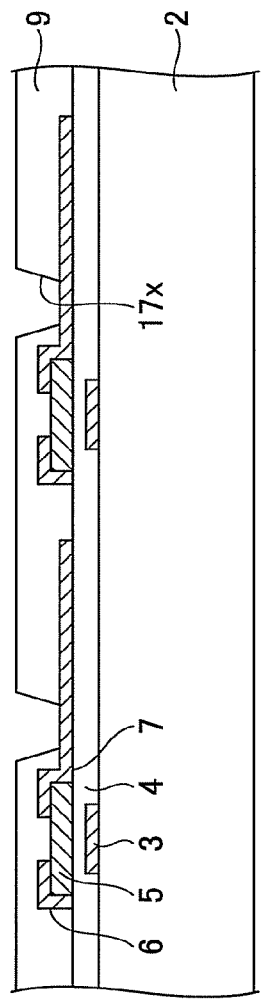
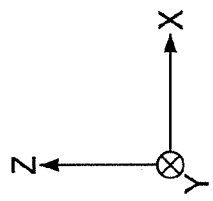
FIG.8A
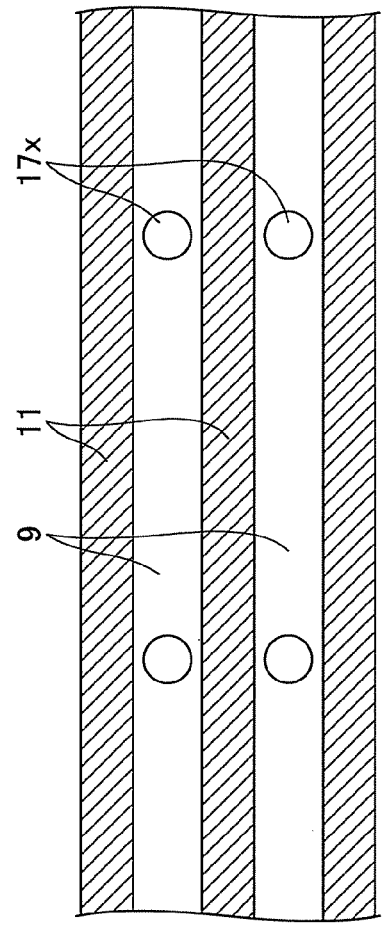
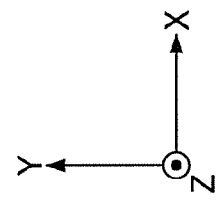
FIG.8B

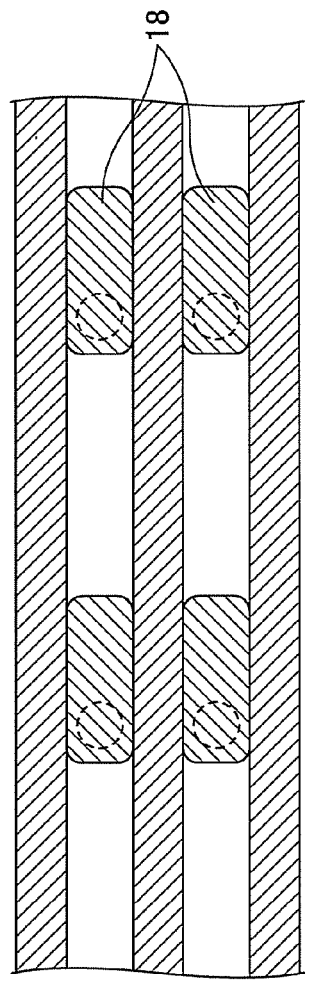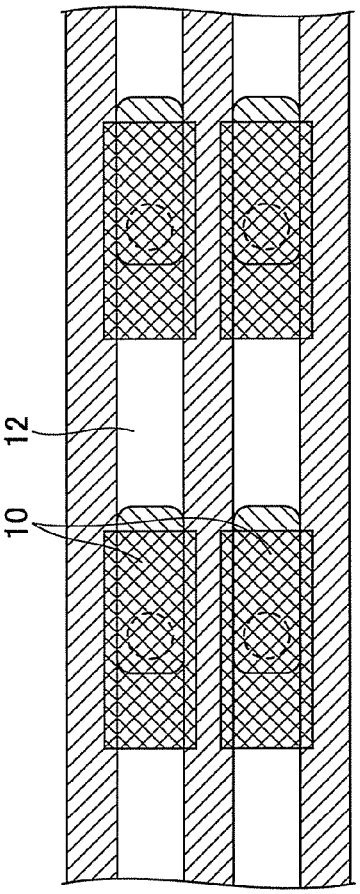
FIG.8C
FIG.8D

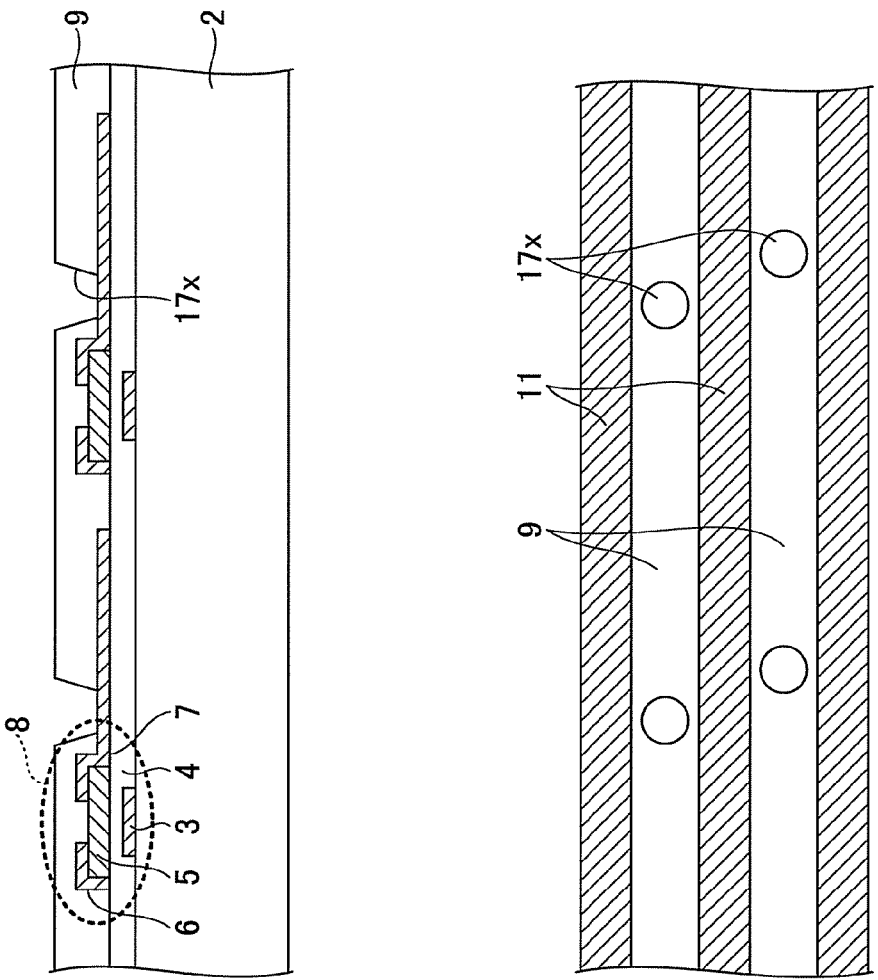

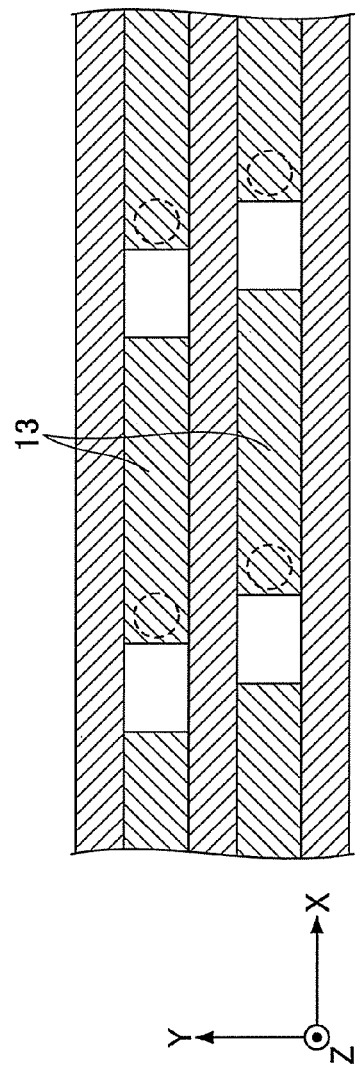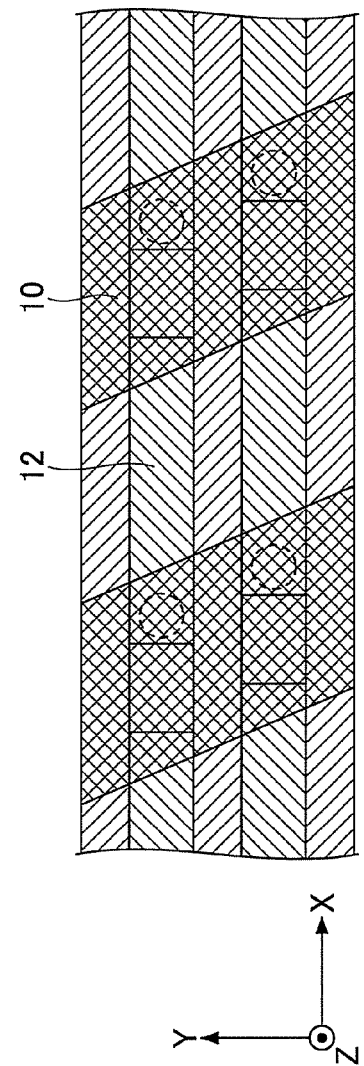

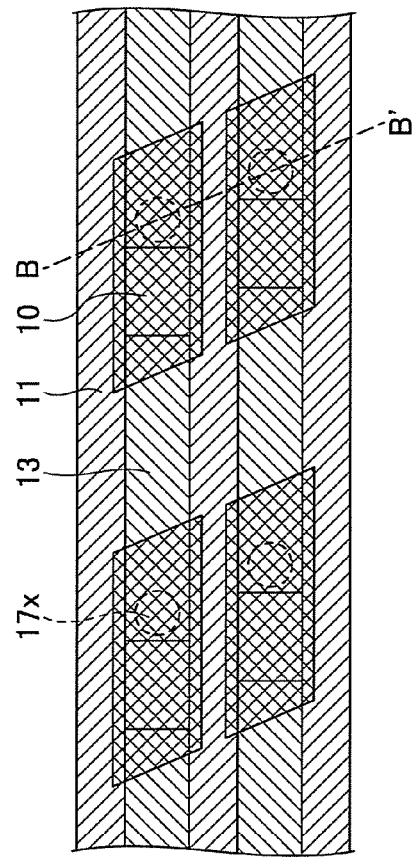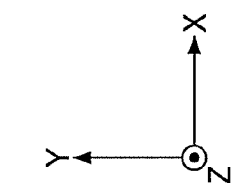
FIG.13C
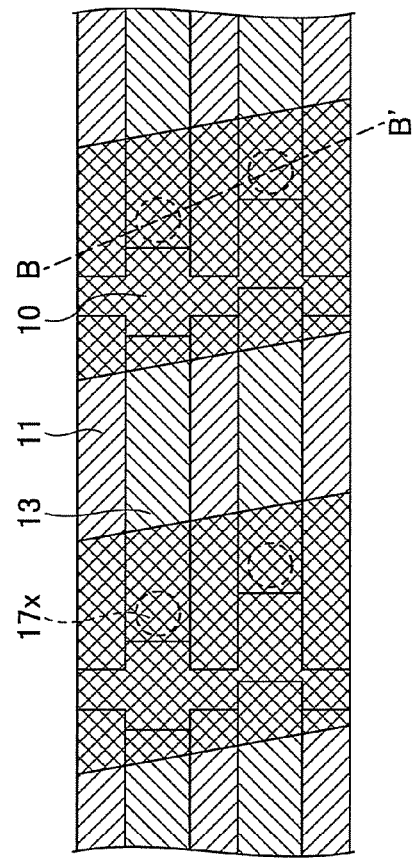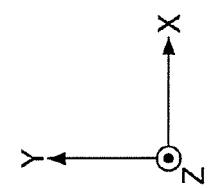
FIG.13D

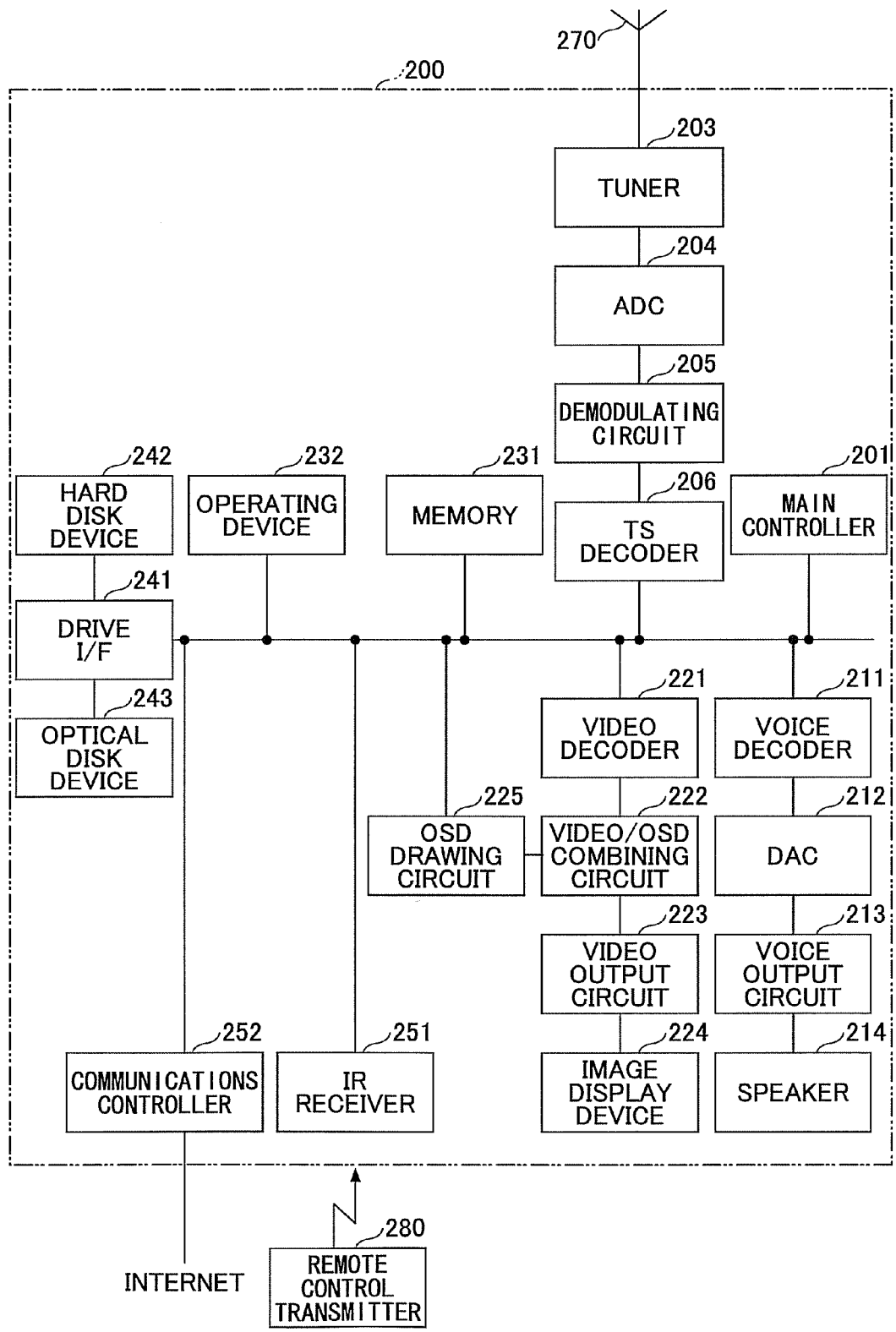

LIGHT

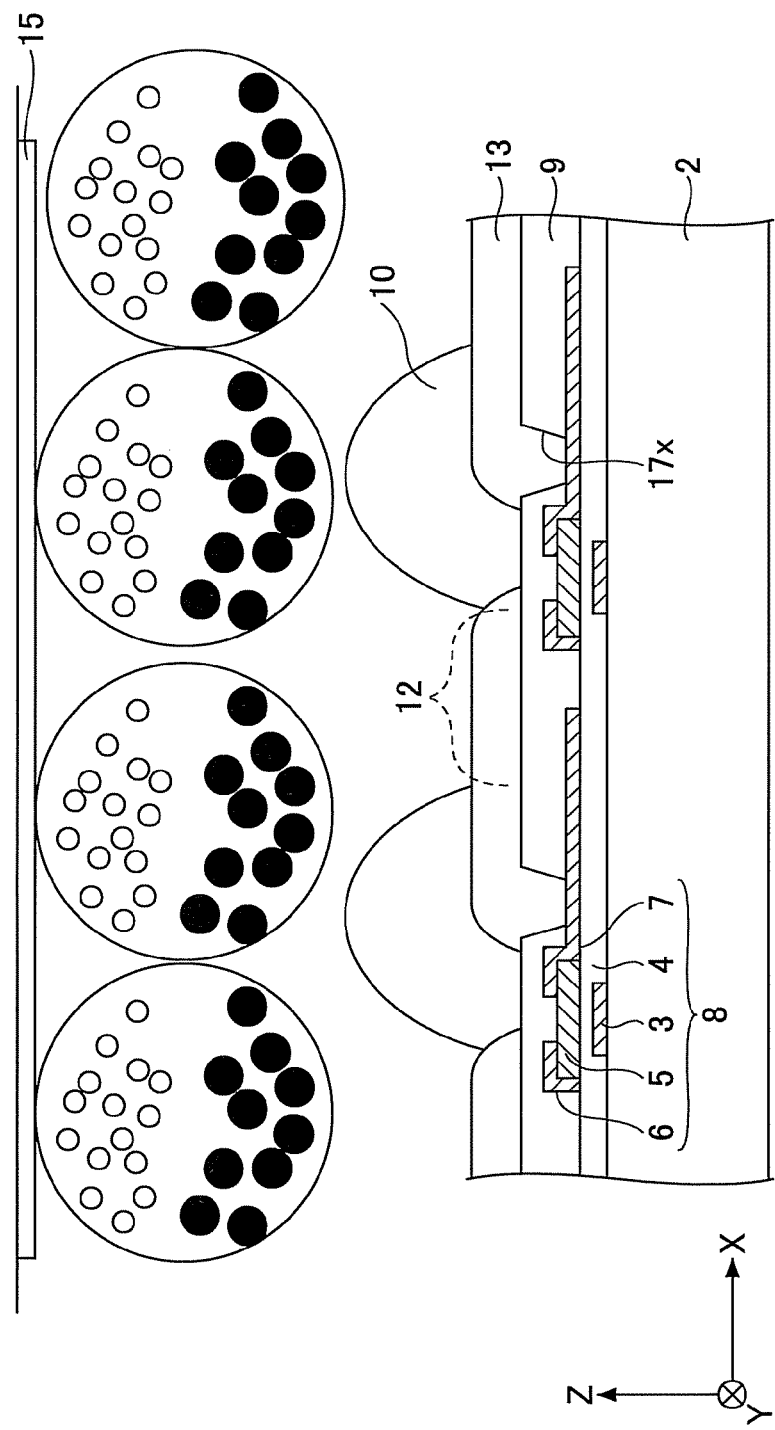

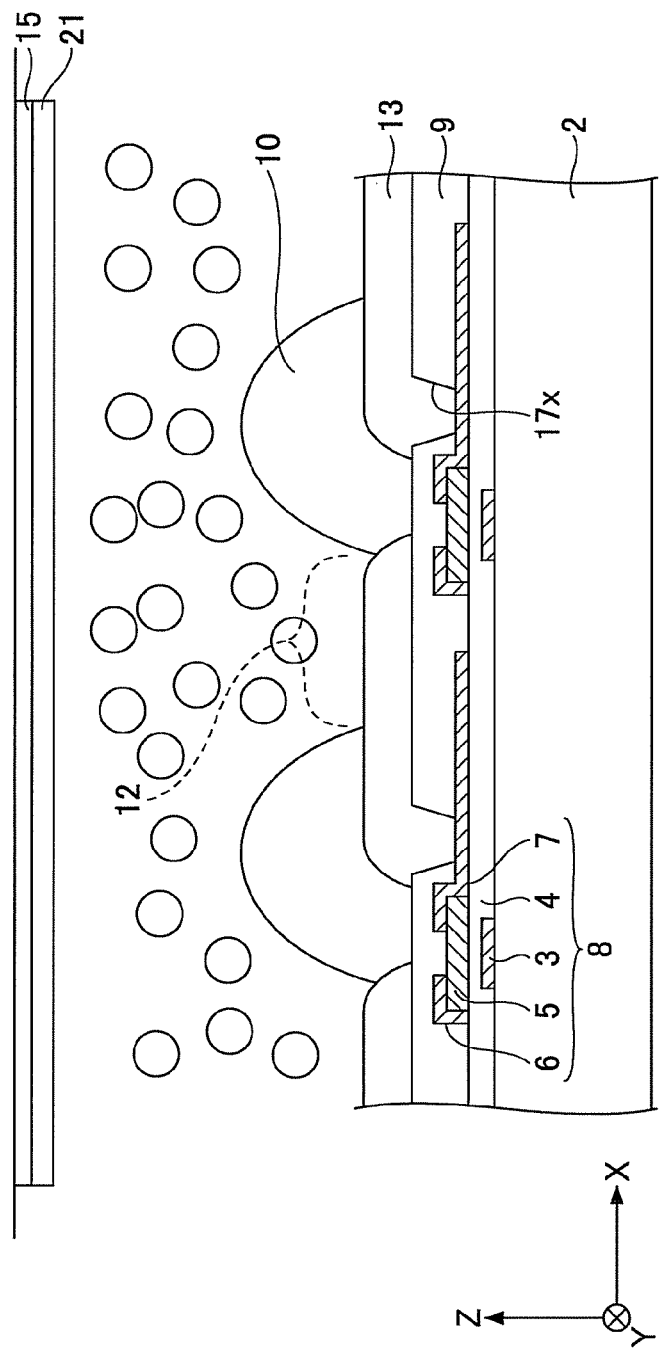

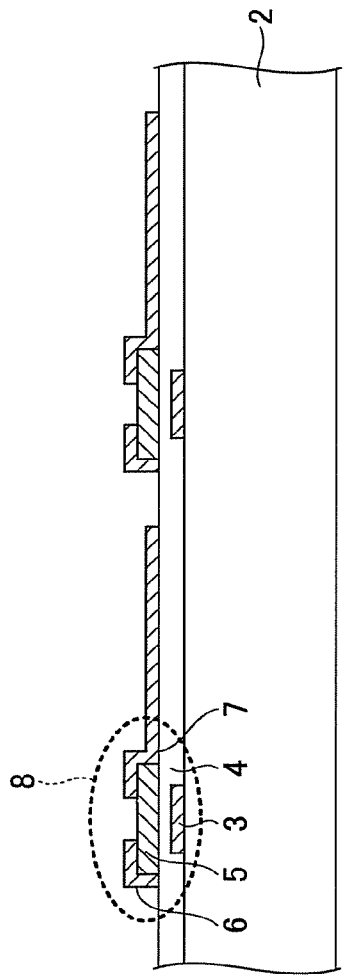
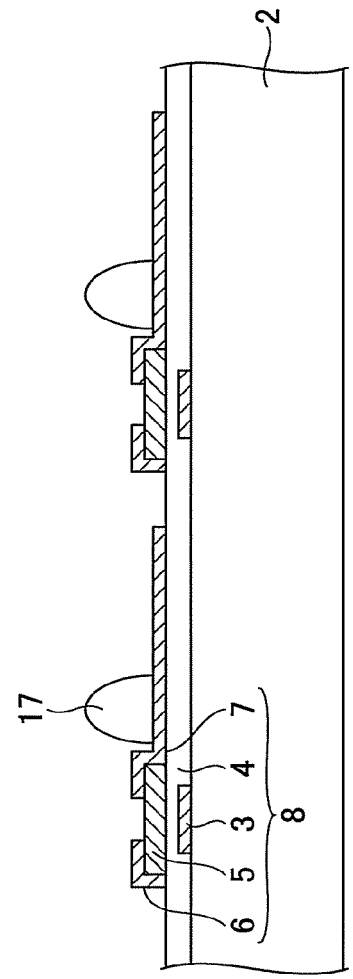
FIG.27A
FIG.27B

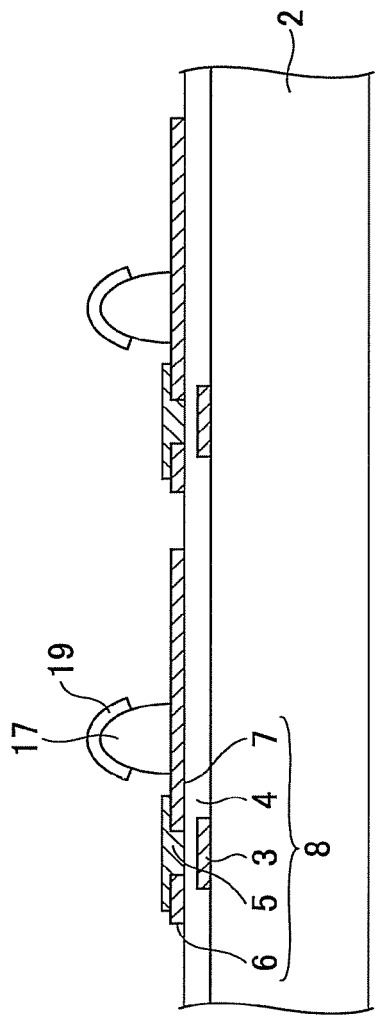
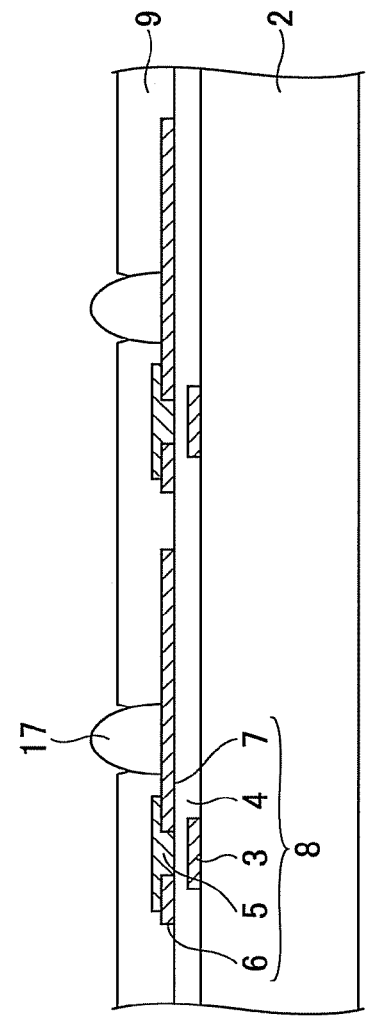
FIG.30C
FIG.30D

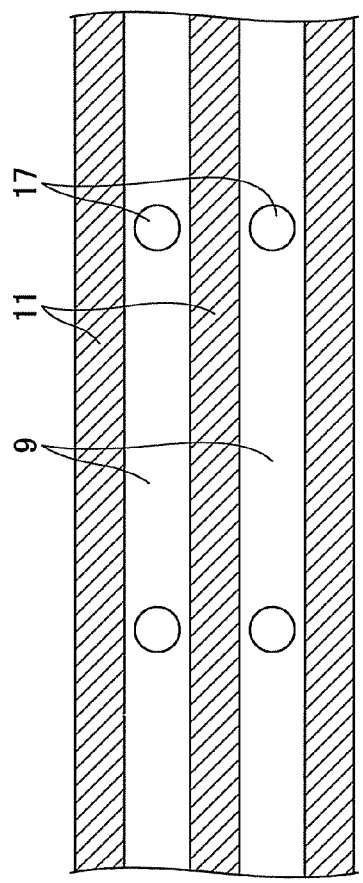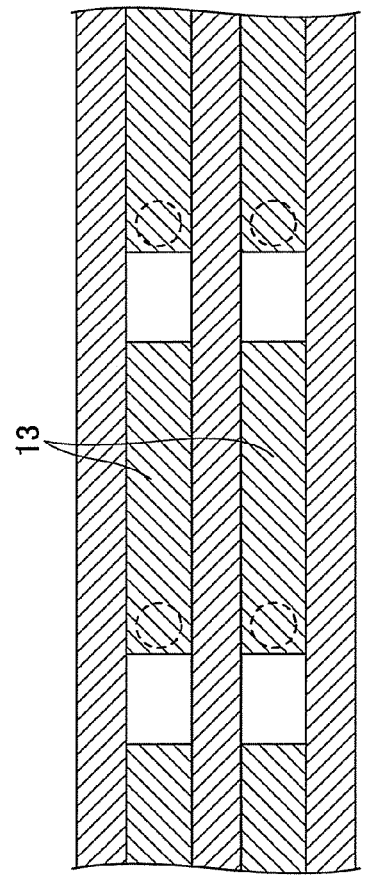
FIG.31A
FIG.31B

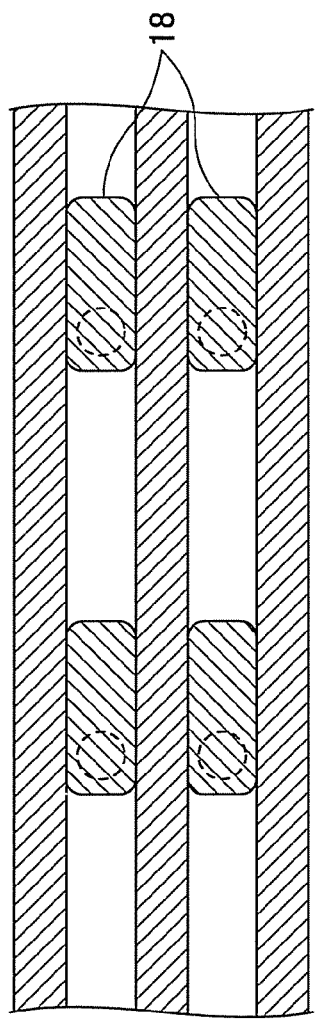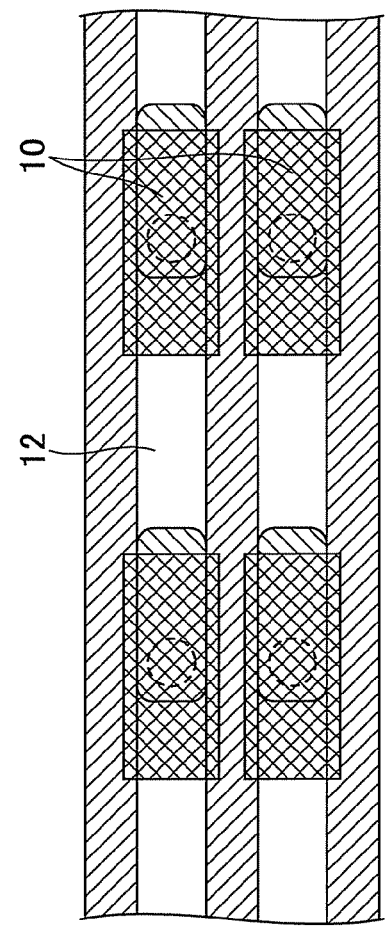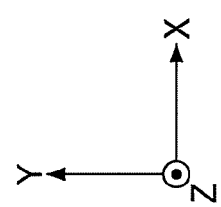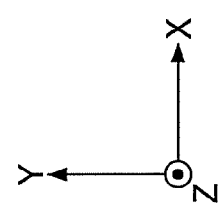
FIG.36A
FIG.36B

DISPLAY APPARATUS, MANUFACTURING METHOD THEREOF, AND ELECTRONIC EQUIPMENT

TECHNICAL FIELD

The present invention relates to display technologies using a top emission organic EL device.

BACKGROUND ART

An organic EL (Electro Luminescence) device, which has a structure such that a cathode, an organic light emitting layer, and an anode are laminated, is a device such that a positive hole injected from the anode and an electron injected from the cathode are re-coupled at an organic light emitting layer, so that excitation energy is released as light emission.

The related art techniques are primarily of a bottom emission type such that a switching device such as a TFT (Thin Film Transistor), etc., is formed on a glass substrate; an organic EL device which has laminated an ITO (Indium Tin Oxide) electrode, an organic light emitting layer, and a metal cathode in that order is arranged adjacent to the switching device; and light is taken out through a transparent substrate.

There is a problem with the bottom emission type that the TFT and the organic EL device need to be lined up on the glass substrate, so that an aperture rate remains around 10-30%, as it is not possible to increase the aperture rate theoretically.

Thus, a top emission type is being zealously studied such that the TFT is covered with an interlayer insulator, on which an organic EL device is formed.

The top emission type has an advantage that the aperture rate may be made greater relative to the bottom emission type as the TFT and the organic EL device are connected through a contact hole provided at the interlayer insulator; on the interlayer insulator, individual layers are laminated in the order of the cathode, the organic light emitting layer, and an transmissive anode; and light is taken out through the transmissive anode on the top layer.

Moreover, low molecular type organic light emitting layer is formed by vacuum deposition method in the related art, and when the display size is larger, a low level of efficiency of use of material, generation of particles from a mask, and an alignment error of a shadow mask are severer. Therefore a high molecular type organic EL device such that a high molecular type organic light-emitting layer is formed by an inkjet method is attracting special attention.

In present inkjet devices, it is difficult to properly print a different high molecular organic light-emitting material of R, G, and B only on a predetermined cathode separately, so that a method is used of providing a partition (bank) around the cathode formed on the interlayer insulator, and making the partition water-repellent using $CF_4$ plasma processing to control wettability, thus dropping the high molecular organic light-emitting material into an aperture within the partition.

In the top emission type, a contact hole is needed to connect the TFT and the organic EL device. When a cathode material is deposited, using sputtering and vacuum deposition, on the interlayer insulator on which the contact hole is provided, and the cathode is formed using photolithography, a dent is produced due to the contact hole on the cathode surface being directly above the contact hole. Thus, when the high molecular inorganic light-emitting material is printed on the cathode using the inkjet method, the film thickness of the organic light-emitting layer increases due to the dent of the cathode that is formed directly on top of the contact hole, so that uniformity of the film thickness is reduced. Thus, light emission becomes non-uniform within pixels surrounded by partitions, so that a good image quality is not obtained with the display device using the organic EL device.

In order to obtain good image quality, it is important to planarize the contact hole and the cathode. Thus, various proposals are being made in this regard.

For example, in Patent document 1, a contact hole is arranged to be provided beside a pixel electrode (a cathode), and a connecting wiring with the contact hole filled with an electro-conductive material is used to connect the TFT and the pixel electrode, and to have a part of a partition arranged on the contact hole.

In such a structure, the dent of the connecting wiring due to the contact hole is covered with the partition, so that it is separated from a light-emitting region, making it possible to form a flat cathode at least within an aperture surrounded by the partition.

Patent document 1 adopts a method of forming the partition having an aperture after forming a connecting wiring and a pixel electrode (cathode) in order to implement the above structure.

In a case of a low molecular organic EL device, a structure is already disclosed in Patent document 2 which provides a part of a partition on a contact hole. Moreover, in Patent document 3, a method is disclosed such that, a pixel electrode (cathode) is formed on the contact hole, then a dent of the pixel electrode is implanted with an insulator within a hole that has a liquid material filled in and cured, and then a partition is provided such that one part of the partition is arranged on the contact hole, or in other words, on the insulator within the contact hole. In the method of Patent document 3, the dent due to the contact hole is filled in with the insulator within the hole, so that a certain level of flatness is obtained, and the insulator within the hole is covered with the partition so that there is separation from a light-emitting region; therefore, the interior of the aperture surrounded by the partition becomes a flat cathode. In order to achieve the structure of Patent document 3, the method must be adopted which forms the partition having the aperture after forming the insulator within the hole and the pixel electrode (cathode).

A different method is disclosed in Patent document 4, for example. In Patent document 4, there are disclosed a first method of implanting a contact hole with an electro-conductive material, then flattening using polishing (a Damascene process), and then forming a pixel electrode (cathode) on the contact hole; and a second method of forming the pixel electrode on the contact hole, and then filling a dent produced on the pixel electrode with an insulating material such as silicon oxide, etc. Patent document 4 discloses that a method is adopted of forming a partition having an aperture on an interlayer insulator, and then forming a pixel electrode (cathode) in the aperture.

Moreover, compared to a photolithography method such that a resist pattern is formed on a film deposited by sputtering or vacuum deposition, an inkjet method is low cost, so that forming a high molecular organic EL device using the inkjet method contributes to a decreased cost of a display device. Moreover, a proposal is being made to seek a further decrease in cost by not only forming a high molecular organic EL device by the inkjet method, but also to form, by a printing method, a cathode formed by the photolithography method according to the related art.

For example, Patent document 5 discloses a method of applying by a printing method, as an electrode, a high molecule material, which is an electro-conductive fine particle such as indium, carbon, etc., dispersed. Patent document 6 discloses providing between a light-emitting layer and a main cathode, an electron injecting layer which includes metal complexes, applying, as the main cathode, PEDOT-PSS.

Various proposals are also made of a method of forming a contact hole by an inkjet method. For example, Patent document 7 discloses applying, by an inkjet method, a dot-shaped liquid repellant material to a location where a contact hole is to be formed to form a liquid-repellent section and then applying an insulating material around the liquid repellant section. The insulating material is repelled by the liquid repellant section to become a contact hole. Such a method as described above can be adopted to further decrease the cost of a top emission organic EL device.

However, Patent document 5 only discloses the structure of the organic EL device, and does not disclose the structure of the contact hole and a method of connecting with the TFT at all. Moreover, Patent document 6 discloses substrates using top emission type, but refers to related art cases which are all related to a bottom emission type, and does not disclose flattening of contact holes and cathodes at all.

Thus, when manufacturing the display device using the top emission type organic EL device, even when the cathode could be formed using Patent document 5 or 6, flattening of the contact hole and cathode that is important in top emission types is difficult, so that a method of flattening the contact hole and cathode of Patent documents 1, 3, and 4, etc., must be adopted.

Moreover, when the cathode is formed by the inkjet method, it is difficult to make the minimum space small because of curving of a head, meandering of the head, and ejection variation. In other words, a highly fine fabrication is difficult. In general, when forming the cathode by the inkjet method, the minimum space is 30-50 μm.

On the other hand, printing of a high molecular-type organic light-emitting material using the inkjet method uses a liquid-repellant partition to respond to the highly fine fabrication, so that, taking into account the process complexities, the method of using the previously-described partition is most desirable.

In the method as disclosed in Patent documents 1 and 3, the partition needs to be formed such as to cover the contact hole after forming the cathode and the connecting wiring on the contact hole, so that the partition for separating the high molecular organic light-emitting layer cannot be used when printing the cathode. Therefore, the minimum space of the cathode is determined by the resolution of the inkjet method. Thus, when the cathode is flattened by the methods disclosed in Patent documents 1 and 3, there is a disadvantage that the minimum space of the cathode cannot be reduced, so that the resolution of the cathode cannot be improved. In particular, in the method in Patent document 3, the process of forming the insulator within the hole is required, leading to an increased cost in the organic EL device.

Moreover, when flattening the contact hole and the cathode by the first method disclosed in Patent document 4, the electro-conductive material is filled into the contact hole, flattening is made by the Damascene method, then the partition is formed, and then the cathode is formed, so that it is possible to print the cathode by using the partition for separating the high molecular organic light-emitting layer; in other words, a highly fine fabrication of the cathode may be realized using the printing method. However, in order to flattering the contact hole by the Damascene method, a polishing machine, a machine for depositing an electro-conductive material to be filled, and a cleaning machine after the polishing is necessary. The polishing process causes dust emission therefrom so that separation from other areas becomes necessary, making an increased cost such as an additional clean room required, etc., so that it is difficult to manufacture the display device at low cost.

Moreover, when the cathode is flattened by the second method disclosed in Patent document 4, the insulating material which is filled in the dent of the cathode does not function as an electrode, so that the area of the cathode becomes substantially small, decreasing the uniformity within in the pixel area and the brightness of the display device. Moreover, a difference occurs in the density of electric currents which flow through individual organic EL devices, leading to decreasing the long-term reliability of the overall display device.

Furthermore, even when the contact hole is formed by a printing method by the method in Patent document 7, flattening of the contact hole and the cathode that is important in the top emission type cannot be realized, so that the method of flattening of the contact hole and the cathode of Patent documents 1, 3, and 4, etc., must be adopted. Moreover, in the method in Patent document 7, it is common for the insulating material not to stop at the edge of the liquid repellant section, and partially run onto the edge of the liquid repellant section, so that the bottom part of the contact hole is likely to become inversely tapered after removing the liquid repellant section. In particular, there is a disadvantage that, if the film thickness of the liquid repellant section is large, in case the contact hole is filled with the electro-conductive material, a void may occur in an inversely tapered portion, decreasing the long-term reliability of the contact hole.

As described above, in the top emission type organic EL device which forms the cathode and the high molecular organic light-emitting layer by the printing method, a technique of making the flattening of the cathode and the highly fine fabrication of the cathode compatible is yet to be proposed; thus, in order to realize, at low cost, a display device with a high aperture rate and a uniform image quality, the printing technique of the cathode that makes it possible to make the flattening of the cathode and the highly fine fabrication of the cathode compatible is becoming very important. Moreover, for a further decrease in cost, development of a printing method which makes it possible to form a contact hole having long-term reliability is also important.

Patent Document 1 JP2004-119219A
Patent Document 2 JP2001-148291A
Patent Document 3 JP2009-36948A
Patent Document 4 JP2005-197027A
Patent Document 5 JP2002-237389A
Patent Document 6 JP2005-79064A
Patent Document 7 JP2009-21552A

DISCLOSURE OF THE INVENTION

In light of what is described in the above, the present invention is aimed at providing a display apparatus, a manufacturing method thereof, and an electronic equipment unit such that flattening of a cathode and highly fine fabrication of the cathode are realized in a display device having a top emission organic EL device. At the same time, the present invention is aimed at providing a display apparatus, a manufacturing method thereof, and an electronic equipment unit that have a low cost and a high long-term reliability contact hole structure.

In an embodiment of the present invention, a display apparatus is provided, including
a transistor formed on the substrate;
an interlayer insulator formed on the transistor;
a pixel electrode formed on the interlayer insulator;

a first partition located above a contact hole which penetrates the interlayer insulator; and a second partition which intersects with the first partition, or which is located on a straight line intersecting with the first partition, and which brings a width value of the pixel electrode to a predetermined value.

In another embodiment of the present invention, the contact hole is an electro-conductive post including an electro-conductive material.

In another embodiment of the present invention is provided a method of manufacturing a display apparatus, the method including the steps of:

forming a transistor having a source electrode and a drain electrode;

covering, on the transistor, an interlayer insulator which includes a contact hole located on one of the source electrode and the drain electrode;

forming one or more first partition on the interlayer insulator;

forming a pixel electrode which is located between the first partitions on the interlayer insulator which has the contact hole; and forming a second partition which intersects with the first partition or which is located on a straight line intersecting with the first partition, and which is formed on the pixel electrode which is located above the contact hole.

In a further embodiment of the present invention is provided a method of manufacturing a display apparatus, the method including the steps of:

the contact hole is refilled with an electro-conductive post which includes an electro-conductive material;

and wherein the step of covering, on the transistor, the interlayer insulator which includes the contact hole includes forming the electro-conductive post on the one of the source electrode and the drain electrode; and applying a liquid material forming the interlayer insulator to cover the transistor with the interlayer insulator and make the electro-conductive post protrude from a surface of the interlayer insulator.

The embodiments of the present invention make it possible to provide a display apparatus, a manufacturing method thereof, and an electronic equipment unit such that flattening of a cathode and highly fine fabrication of the cathode are realized in a display device having a top emission organic EL device; and, at the same time, provide a display apparatus, a manufacturing method thereof, and an electronic equipment unit that have a low cost and a high long-term reliability contact hole structure.

BRIEF DESCRIPTION OF THE DRAWINGS

Other objects, features, and advantages of the present invention will become more apparent from the following detailed descriptions when read in conjunction with the accompanying drawings, in which:

FIG. 4 is a flowchart illustrating the example of the method of manufacturing the display device of the first embodiment of the present invention;

FIG. 8A through 8F are diagrams illustrating the example of the method of manufacturing the display device of the third embodiment of the present invention;

FIGS. 12A through 12E are diagrams illustrating the example of the method of manufacturing the display device of the fifth embodiment of the present invention;

FIGS. 13A through 13D are diagrams illustrating an exemplary structure of a first partition and a second partition in a display device of a sixth embodiment of the present invention;

FIG. 17 is a block diagram of a configuration of a television device according to an eighth embodiment of the present invention;

FIGS. 24A through 24C are cross-sectional diagrams of the display device according to a tenth embodiment of the present invention;

FIGS. 27A through 27D are first diagrams illustrating an example of a method of manufacturing the display device according to the eleventh embodiment of the present invention;

FIGS. 30A through 30D are first diagrams illustrating an example of a method of manufacturing the display device according to a first variation of the eleventh embodiment of the present invention;

FIGS. 31A through 31D are second diagrams illustrating the example of the method of manufacturing the display device according to the first variation of the eleventh embodiment of the present invention;

FIGS. 36A through 36D are diagrams illustrating an example of a method of manufacturing the display device of the thirteenth embodiment of the present invention;

BEST MODE FOR CARRYING OUT THE INVENTION

Descriptions are given next, with reference to the accompanying drawings, of embodiments of the present invention.

The present invention is not limited to the specifically disclosed embodiments, but variations and modifications may be made without departing from the scope of the present invention.

Embodiments according to the present invention are described, referring to FIG. 1 through FIG. 38C.

First Embodiment

Figure 1:
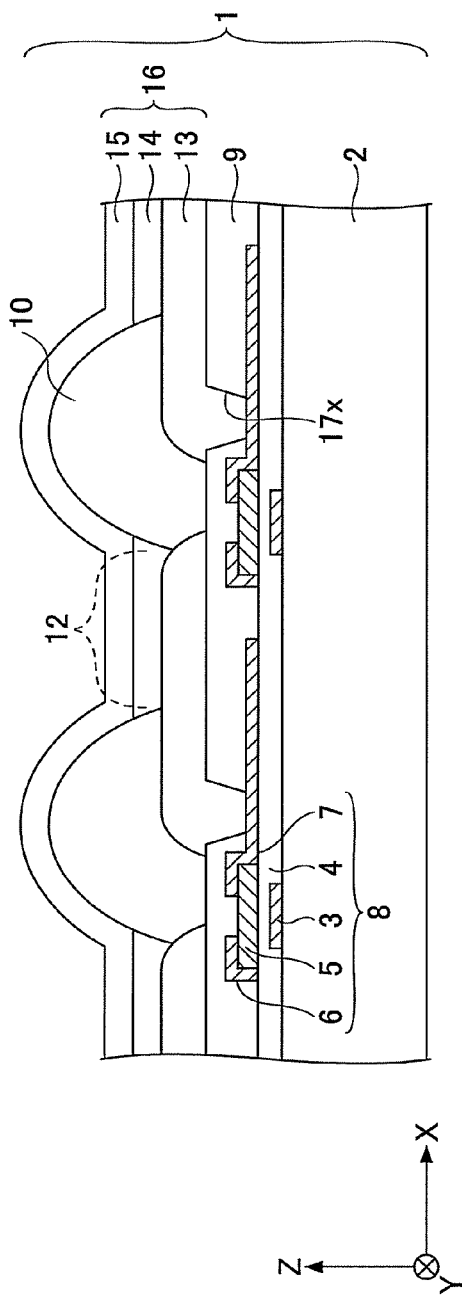
FIG. 1 is a cross-sectional diagram of an example of a display device of a first embodiment of the present invention.
Figure 2:
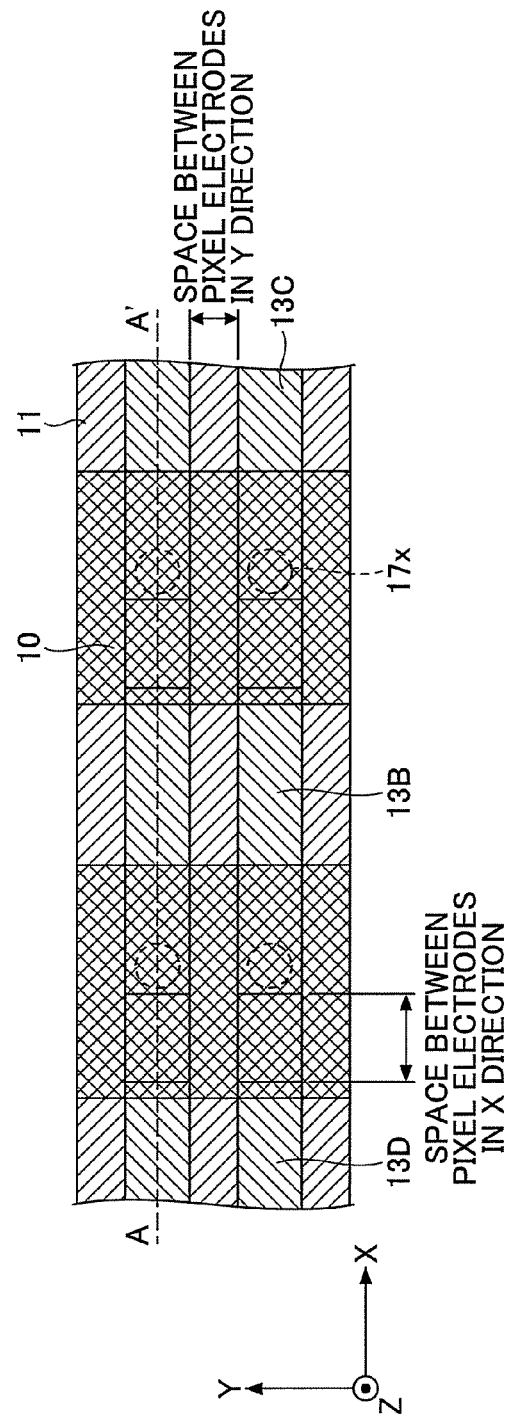
FIG. 2 is a plan view of an example of a display device of a first embodiment of the present invention.

An example of a display device of a first embodiment of the present invention is shown in FIGS. 1 and 2. FIG. 1 is a cross-sectional diagram illustrating an example of a display device 1, while FIG. 2 is a plan view illustrating an example of a display device 1 with an organic light-emitting layer 14 and an opposing electrode 15 omitted. The cross-sectional diagram in FIG. 1 shows a cross section at A-A' in FIG. 2.

With reference to FIG. 1, a display device 1 according to the present embodiment is a display device which has thin-film transistors (below called TFTs) 8 arranged in a matrix shape on a substrate 2. The TFT 8 includes a gate electrode 3, a gate insulator 4, an active layer 5, a source electrode 6, and a drain electrode 7. The TFT 8 is covered with an interlayer insulator 9, on which is provided a line-shaped first partition 10, which extends on the interlayer insulator 9 in a Y direction.

Moreover, with reference to FIGS. 1 and 2, the TFT 8 is covered with the interlayer insulator 9, on which are arranged apertures 12 in a matrix, each of which apertures is formed by the line-shaped first partitions 10 which extend in a Y direction and by line-shaped second partitions 11, which are arranged to be generally orthogonal to the first partitions 10, and which are extending in a X direction.

Moreover, with reference to FIG. 1, within the aperture 12 are arranged pixel electrodes 13 which are separated in the Y direction by the second partitions 11 which extend in the X direction. On the pixel electrodes 13, the organic light-emitting layers 14, which are separated by the first partitions 10 and the second partitions 11 are arranged in a matrix shape. Moreover, on the organic light-emitting layers 14 is arranged the light-transmissive opposing electrode 15 as a common electrode. An organic EL device 16 includes the pixel electrode 13, an organic light-emitting layer 14, and the opposing electrode 15.

Moreover, the pixel electrode 13 of the organic EL device 16 is connected to the drain electrode 7 of the TFT 8 through a contact hole 17x formed to penetrate through the interlayer insulator 9. When the TFT 8 is turned on by a potential applied on the gate electrode 3 of the TFT 8, electric current flows through the contact hole 17x to the organic EL device 16, which emits light.

With reference to FIGS. 1 and 2, the contact hole 17x is covered with a portion of the first partition 10 which extends in the Y direction.

As shown in FIG. 2, in the Y direction, the pixel electrodes 13 in the present embodiment are separated by the second partitions 11, extending in the X direction. Thus, in the Y direction, a structure is taken such that an edge of the pixel electrode 13 is in contact with an edge of the second partition 11, or the edge of the pixel electrode 13 runs over the edge of the second partition 11. On the other hand, as shown in FIG. 1, the pixel electrode 13 in the X direction takes a structure such that it slips into the bottom of the line-shaped first partition 10.

When the structure of the present embodiment is adopted, the contact hole 17x is covered with the first partition 10 extending in the Y direction, and which is separated from the aperture 12 which contributes to light emission, and a dent does not occur on the cathode which contributes to light emission, making it possible to form a highly flat cathode. Thus, the film thickness of the organic light-emitting layer 14 becomes uniform, making it possible to realize a display device and an organic EL device which has uniform light emission within the device and within the pixel area.

Moreover, in the Y direction, the pixel electrodes 13 are separated by the second partitions 11 extending in the X direction with respect to the Y direction, so that the resolution of the pixel electrode 13 is not limited by a minimum resolution space of the inkjet machine used in printing the pixel electrode 13, and is determined by the resolution of the second partition 11.

In other words, the partition 11, which is formed using a photosensitive resin such as photosensitive polyimide material, photosensitive acrylic material, etc., has a maximum line width of not more than 5 um.

On the other hand, a minimum resolution space for an inkjet method when a partition is not used is 30-50 um; the structure of the present embodiment can realize fabrication which has several times finer design relative to a related-art in the Y direction, and decrease the space between pixel electrodes 13, so that the aperture rate is improved.

In the X direction, a pixel electrode 13B connected to the contact hole 17x needs to be separated from the neighboring pixel electrodes 13C and 13D (see FIG. 2); here, it suffices to make the space between the pixel electrodes 13 to correspond to the minimum resolution space (30-50 um) of the inkjet machine used in printing the pixel electrode 13.

In FIG. 1, while a selector line, a signal line, a power line, and a capacitance are omitted to simplify the figure, a 2-transistor, 1-capacitor structure which includes a switching device, a drive device, and a capacitance is required in the organic EL device 16. Moreover, in order to provide a circuit for compensating for a shift of a threshold voltage, structures which use more TFTs 8 and capacitances are more desirable.

Figure 3A:
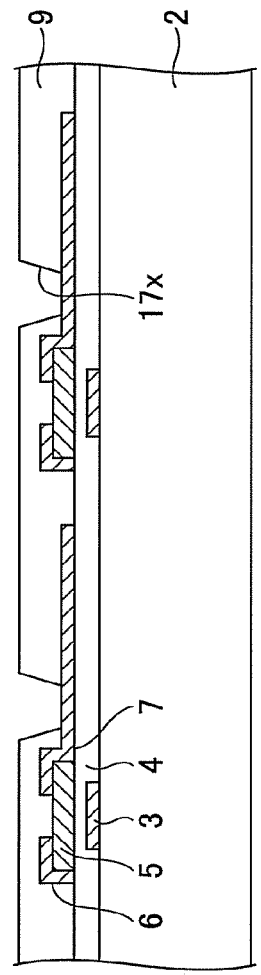
FIGS. 3A through 3E are diagrams illustrating an example of a method of manufacturing the display device of the first embodiment of the present invention.
Figure 3B:
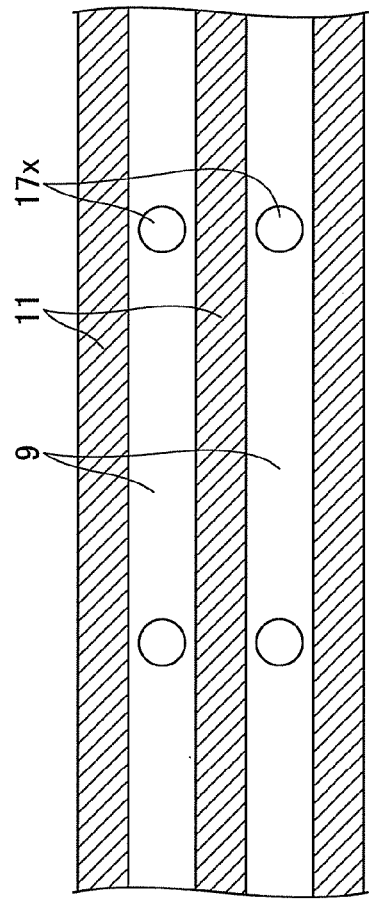
Figure 3C:
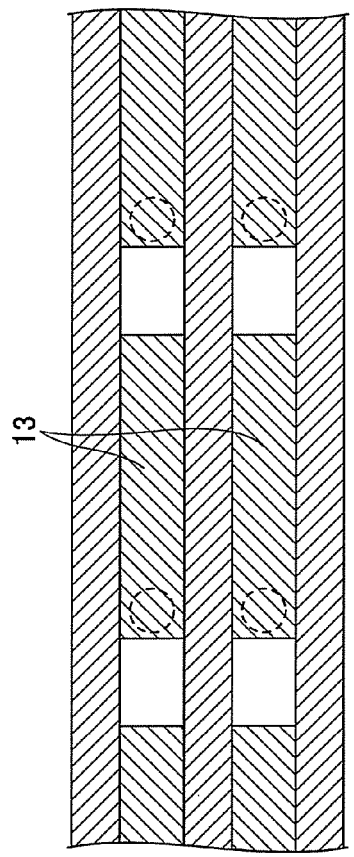
Figure 3D:
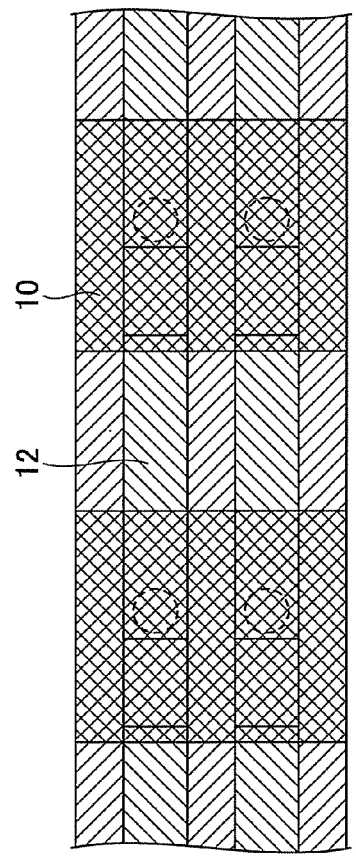
Figure 3E:
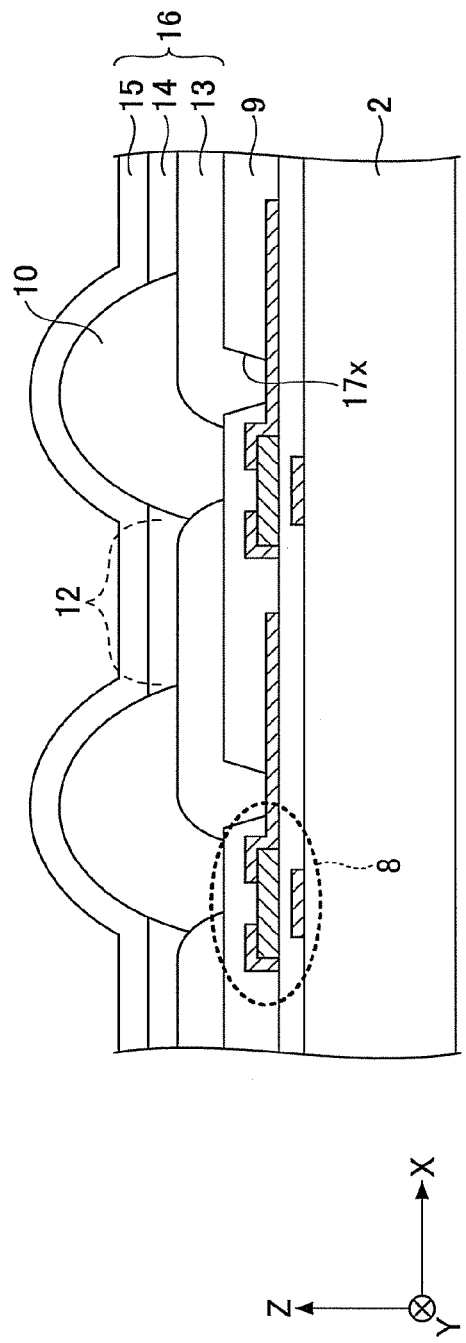

Next, a method of manufacturing a display device according to the present embodiment is described according to FIGS. 3A through 3E and FIG. 4. FIGS. 3A and 3E show cross-sectional diagrams, while FIGS. 3B, 3C, and 3D show front views. FIG. 4 is a flowchart of the above mentioned method of manufacturing.

As shown in FIG. 3A, on a substrate 2 which is a glass substrate, for example, is formed in a matrix shape, a TFT 8 which has amorphous silicon (a-Si) as an active layer 5. First, Cr is deposited on a glass substrate by sputtering method, and a gate electrode 3 is formed by photolithography. Then, $SiO_2$ is deposited by a plasma CVD method to yield a gate insulator 4. Then a-Si is deposited by the CVD method, individualization is performed by a photolithography method to yield an active layer 5, and then Al—Si is deposited by sputtering method, a source electrode 6 and a drain electrode 7 are formed by the photolithography method, and the TFT 8 is completed which is arranged in a matrix shape having a density of 140 ppi. Moreover, as needed, the transistor characteristic may be improved by an annealing process after forming the transistor.

After the TFT 8 is formed, the interlayer insulator 9 which includes SiON is deposited by a plasma CVD method and the TFT 8 is covered. The thickness of the interlayer insulator 9 is made as 0.5-2 um. Then, by the photolithography, the contact hole 17x of a diameter 10 um is formed on the drain electrode 7 (S301 in FIG. 4).

Next, as shown in FIG. 3B, after the contact hole 17x is formed, a water-repellant photosensitive resin is applied, exposure is performed using a photo mask which has a pattern of a second partition 11, development is performed using a tetramethyl ammonium solution, and curing is performed to form a second partition 11 (S302 in FIG. 4). The second partition is shaped as a line extending in the X direction; alignment of a photo mask having a pattern of the second partition 11 is performed such that the contact holes 17x are arranged between the second partitions 11. The second partition 11 has a width of 10-30 µm and a film thickness of 1-3 µm.

Then, a sample is UV ozone treated, and the surface of the interlayer insulator 9 is hydrophilized, and the surface of the second partition 11 is made liquid repellant.

Taking into account printing of pixel electrodes 13 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or above, and desirably between 60 to 110 degrees.

As a water-repellant photosensitive resin, a photosensitive resin may be used which has a fluorine group introduced at the tail of photosensitive acrylic resin, photosensitive polyimide resin, photosensitive epoxy resin, etc., or which has introduced polysiloxane, polysilane, polysiloxane resin-network, etc.

Moreover, photosensitive acrylic resin, photosensitive polyimide resin, photosensitive epoxy resin, etc., may be used to form a second partition 11, and then the whole surface of the interlayer insulator 9 and the second partition 11 may be hydrophilized by $O_2$ plasma process, and then only the second partition 11 may be selectively made liquid repellant by $CF_4$ plasma process. Either a low pressure method or a normal pressure method may be adopted for the $O_2$ plasma process and the $CF_4$ plasma process.

Thereafter, as shown in FIG. 3C, printing and burning of ink in which nano Ag particles are dispersed in a polar solvent is performed using an inkjet device to form pixel electrodes 13 (S303 in FIG. 4). The pixel electrode 13, which also fills in the contact hole 17x, is connected with the drain electrode 7 of the TFT 8 through the contact hole 17x. The film thickness of the pixel electrode 13 is arranged to be 50-200 nm.

In the Y direction, the surface of the second partition 11 is water repellant, so that the edge of nano Ag ink stops at the second partition 11 and is separated in a self-aligning manner. In the present embodiment, the width of the second partition 11 is 10-30 um. On the other hand, there is no partition in the X direction, so that the space between the pixel electrodes 13 must be made larger than the minimum resolution space of the inkjet device. In the present embodiment, the space between the pixel electrodes 13 in the X direction is arranged to be 30-50 um.

The polar solvent used for the ink in the present embodiment includes alcohol, ethylene glycol, ethylene glycol ether, etc. Moreover, in the present embodiment, while ink in which nano Ag is dispersed in the polar solvent is used, any known electro-conductive fine particles such as nano Au, nano Pd, nano Cu, etc., besides nano Ag may be used as electro-conductive fine particles to be dispersed in the polar solvent.

As shown in FIG. 3D, after the pixel electrodes 13 are formed, a water-repellant photosensitive resin is applied again, exposure is performed using a photo mask which has a pattern of a first partition 10, development is performed using a tetramethyl ammonium solution, and curing is performed to form a first partition 10 (S304 in FIG. 4). The first partition 10 is shaped as a line extending in the Y direction, alignment is performed of a photo mask having a pattern of a first partition 10 such that the contact hole 17x is covered. The first partition 10 is arranged to have a width of 40-60 um and a film thickness of 1-3 um.

Then, a sample is again UV ozone processed to hydrophilize the surface of the pixel electrode 13, and make the surface of the first partition 10 and the second partition liquid repellant. Taking into account printing of an organic light-emitting layer 14 by the inkjet method in the following process, the hydrophilicity of the pixel electrode 13 is preferably such that an angle of contact with respect to pure water is not more than 30 degrees, and desirably not more than 20 degrees, and the liquid repellant property of the first partition 10 and the second partition 11 is preferably such that an angle of contact with respect to pure water is between 50 to 130 degrees or above, and desirably between 60 to 110 degrees.

As a water-repellant photosensitive resin, as in a manner similar to the second partition 11, a photosensitive resin may be used which has a fluorine group introduced at the tail of photosensitive acrylic resin, photosensitive polyimide resin, photosensitive epoxy resin, etc., or which has introduced polysiloxane, polysilane, polysiloxane resin-network, etc.

Moreover, photosensitive acrylic resin, photosensitive polyimide resin, photosensitive epoxy resin, etc., may be used to form a first partition 10, and then the whole surface of the pixel electrode 13, the first partition 10, and the second partition 11 may be hydrophilized by an $O_2$ plasma process, and then only the first partition 10 and the second partition 11 may be selectively made liquid repellant by a $CF_4$ plasma process. Either a low pressure method or a normal pressure method may be adopted for the $O_2$ plasma process and the $CF_4$ plasma process.

As shown in FIG. 3E, after a first partition 10 is formed, an organic light-emitting layer 14 is formed using an inkjet machine within an aperture 12 surrounded by the first partition and the second partition 11 (S305 of FIG. 4). The organic light-emitting layer 14 is formed such that each of three types that emit light of R, G, and B, are separately applied for each column in the X direction. For the organic light-emitting layer 14, a common high molecular light-emitting material may be used; for example, polythiophenes, polyparaphenylenes, polyparaphenylene vinylenes, polyfluorenes, or iridium complexes may be dissolved in the polar solvent to yield ink, and the organic light-emitting layer may be formed by printing, drying, and curing using the ink jet machine. In the present embodiment, by the UV ozone process shown in FIG. 3D, the surface of the first partition 10 and the second partition 11 is made liquid-repellant, and the surface of the pixel electrode 13 is hydropholized, so that the edge of the high molecular organic light-emitting material dissolved by the polar solvent stops at the partition edge, so that the high molecular organic light-emitting material may be printed within the aperture 12 even when there is a head curving, a head meandering, and ejecting variation in the inkjet machine. The film thickness of the organic light-emitting layer 14 is arranged to vary between 50 and 150 nm, taking into account the light-emitting efficiency of R, G, and B.

Then, using sputtering method, on the whole face of the partitions and the organic light-emitting layer 14 is deposited, as an opposing electrode 15, a transparent electro-conductive film including $In_2O_3.SnO_2$. The opposing electrode 15 is a common electrode, so that it is patterned using a shadow mask in sputtering process. The film thickness of the pixel electrode 15 is arranged to be 50-200 nm.

For increasing the efficiency of carrier injection, it is more desirable to form an electron injecting layer between the pixel electrode 13 and the organic light-emitting layer 14, and a hole injecting layer between the organic light-emitting layer 14 and the opposing electrode 15.

For the electron injecting layer, known materials such as cyclopentadien derivative, oxadiazole derivative, bistyrylbenzene derivative, etc. may be used, while, for the hole injecting layer, PEDOT/PSS, etc., may be used. The electron injecting layer and the hole injecting layer may also be formed by printing, by an inkjet machine, a solution which is made into ink by dissolving in the polar solvent, and then performing drying thereof.

Finally, a display device 1, which layers the organic EL device 16 on the TFT 8, is completed by applying light-curing epoxy resin to an outer periphery portion, and adhering cap glass for sealing (not shown).

The display device manufactured with the present method realizes an expansion of a light-emitting region relative to a related-art display device which forms, by one-time exposure and development, the partition having the aperture 12 due to a high aperture rate as the width of the pixel electrode 13 is large in the Y direction.

Moreover, when the display device manufactured with the present method is provided with a flexible tape on which a driving IC is mounted using an anisotropic electro-conductive film, and an image evaluation test is performed, uneven light emission due to the contact hole 17x is not observed at all, so that light emission which is uniform within the display area is seen for R, G, and B.

In the present embodiment, a glass substrate is used as a substrate 2; however, as the display apparatus of the present invention is a top-emission type, transparency is not indispensable, so that other various substrates may be adopted. For example, semiconductor substrates such as Si, GaAs, etc., plastic substrates such as PET (polyethylene terephthalate), PI (polyimide), PES (poly ether sulfone), PEN (poly ethylene naphthalate), etc., quartz substrates, ceramic substrates may be used, and thin-film metals, such as SUS, Al, etc., which are insulated by coating the process face with organic resin.

Moreover, in the present embodiment, a-Si is used as an active layer 5 of the TFT 8, but the display device of the present invention is not limited thereto, so that the substrate itself may be used as the active layer 5 in cases where a semiconductor substrate of an oxide semiconductor such as IGZO, organic semiconductor, or polysilicon are used.

Furthermore, while the TFT 8 is adopted using a bottom-gate, top-contact field effect transistor in the present embodiment, the present invention is not necessarily limited to the above structure, so that, depending on the type of the active layer 5, a known field effect transistor such as top-gate, top-contact, etc., a junction transistor, a static induced transistor, etc., may be adopted.

Moreover, a discretely ejectable inkjet method is used for printing the organic light-emitting layer 14 according to the present embodiment; as the aperture 12 is surrounded by the liquid-repellant first partition 10 and second partition 11, the high molecular organic light-emitting material ejected on the first partition 10 and the second partition 11 gets into the aperture 12 in a self-aligning manner even when a dispenser method or a nozzle printing method that yields continual ejection is used, such a device as described above may be used. The nozzle printing method is an organic EL material applying scheme using a small nozzle that has been put into practical use by Dainippon Screen Manufacturing, Co., Ltd.

Second Embodiment

Next, the second embodiment of the present invention is described.

Figure 5A:
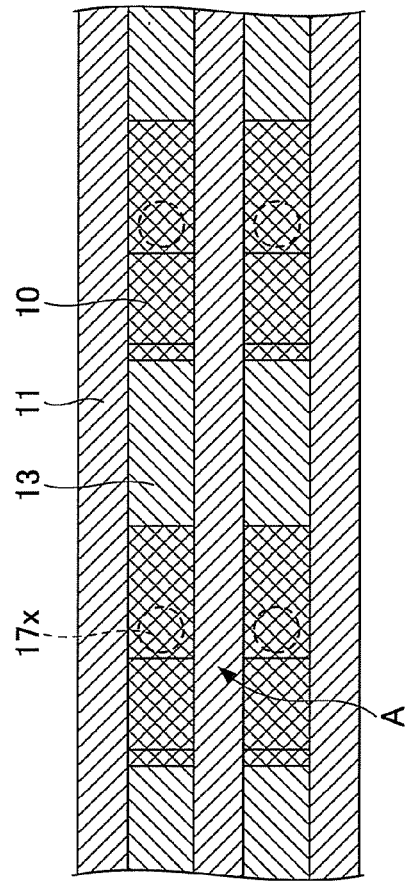
FIG. 5A through 5C are diagrams illustrating an exemplary structure of a first partition and a second partition in a display device of a second embodiment of the present invention.
Figure 5B:
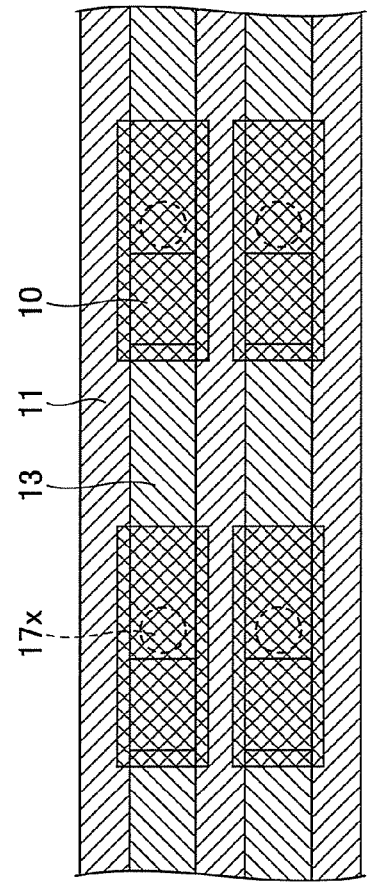
Figure 5C:
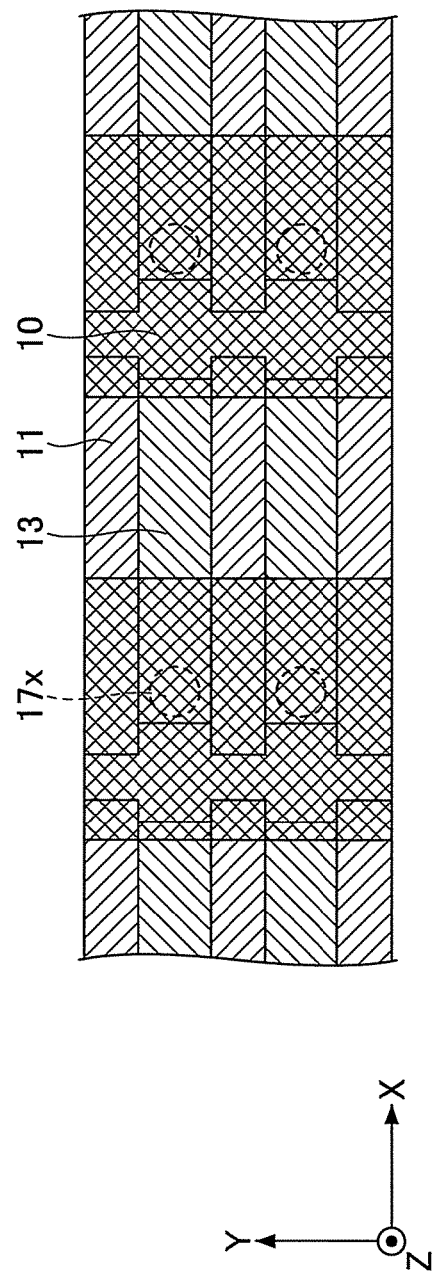

An example of the structure of the display device of the present embodiment is shown in FIGS. 5A through 5C.

The structure shown in FIG. 5A is arranged to be a structure such that the second partition 11 extends in the X direction in a line shape, the first partition 10 is arranged in the Y direction in a dot shape, and the first partition 10 is arranged between the second partitions 11. When the present structure is adopted, the first partition 10 is not formed on the second partition 11, so that the film thickness of the intersecting portion (shown as A) of the partitions may be made thinner relative to the structure of the first embodiment such that the second partition 11 and the first partition 10 having a line shape intersect, so that the film thickness variation as a whole of the partitions becomes small. As a result, a disconnection of opposing electrodes due to the partitions may be reduced. Moreover, the film thicknesses of the first partition 10 and the second partition 11 may be made almost the same to further reduce the disconnection of the opposing electrodes.

The structure shown in FIG. 5B is arranged to be a structure such that the second partition 11 extends in the X direction in a line shape, the first partition 10 is arranged in the Y direction in a dot shape, the first partition 10 is arranged between the second partitions 11, and, moreover, the first partition 10 has an overlap with the second partition 11. If the present structure is adopted, even when an alignment error occurs in an exposure process of the first partition 10 and the second partition 11, as the first partition 10 has the overlap with the second partition 11, the first partition 10 partially runs onto the second partition 11, so that a desired aperture 12 may be formed, in addition to the effect of FIG. 5A.

In order to expect the effects as described above, it is preferable to arrange the overlap between the first partition 10 and the second partition 11 to be larger than the alignment error in the exposure process taking account of a design rule.

The structure shown in FIG. 5C is arranged to be a structure such that the first partition 10 extends in the Y direction in a line shape, the second partition 11 is arranged in the X direction in a dot shape, the first partition 10 is arranged between the second partitions 11, and, moreover, the first partition 10 has an overlap with the second partition 11.

Even when the present structure is adopted, the effect of FIG. 5B may be achieved. In the present structure, in order to separate the Y direction of the pixel electrode 13 with the second partition 11 in a self-aligning manner, it is necessary to arrange the length of the second partition 11 in the X direction to be larger than the length of the pixel electrode 13 in the X direction.

Third Embodiment

Next, the third embodiment of the present invention is described.

Figure 6:
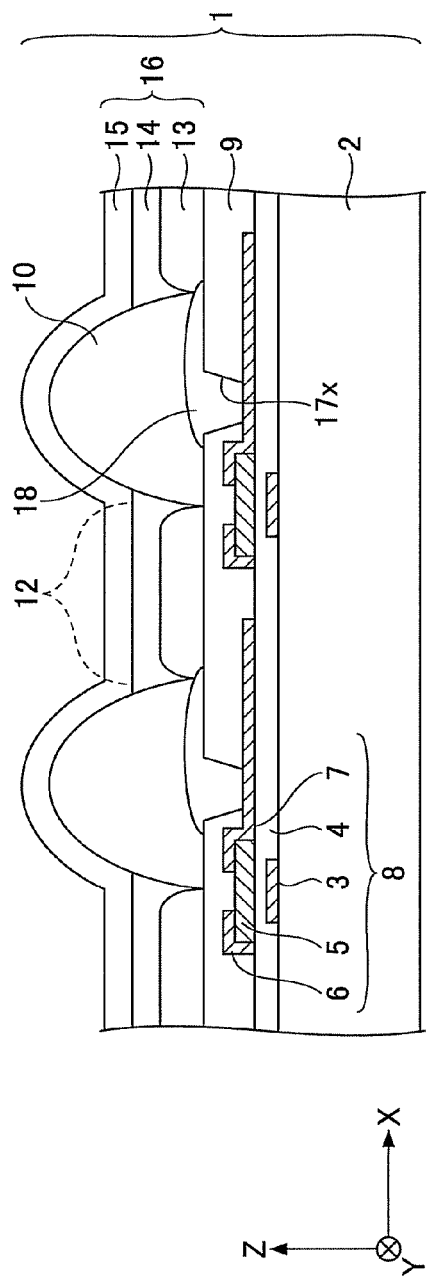
FIG. 6 is a cross-sectional diagram of an example of a display device of a third embodiment of the present invention.
Figure 7:
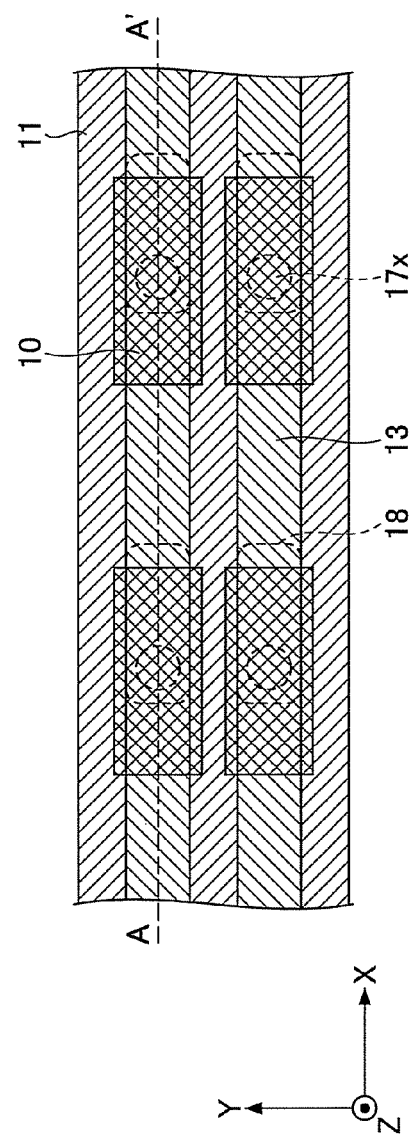
FIG. 7 is a plan view of the example of the display device of the third embodiment of the present invention.

An example of the structure of the display device of the present embodiment is shown in FIGS. 6 and 7. FIG. 6 is a cross-sectional drawing of the display device, while FIG. 7 is a plan view of the display device with the organic light-emitting layer 14 and the opposing electrode 15 omitted. FIG. 6 is a cross sectional view cut along A-A' of FIG. 7.

With reference to FIG. 6, the display device 1 of the present embodiment has arranged on a substrate 2 in a matrix shape thin-film transistors (TFT) 8, each of which includes a gate electrode 3, a gate insulator 4, an active layer 5, a source electrode 6, and a drain electrode 7.

Moreover, with reference to FIGS. 6 and 7, the TFTs 8 are covered with the interlayer insulator 9, on which are arranged apertures 12 in a matrix, each of which apertures is formed by line-shaped second partitions 11 which extend in an X direction and by first partitions 10, arranged in a dot shape such that they are orthogonal to the second partition 11, the first partitions 10 being arranged between the second partitions 11. The first partition 10 has an overlap with the second partition 11.

Moreover, with reference to FIG. 6, the organic EL devices 16 are arranged such that in a matrix shape are arranged pixel electrodes 13 which, in the apertures 12, are separated by the second partitions 11 extending in the X direction and which are separated by the first partitions 10 in the Y direction, on which pixel electrodes 13 are arranged, in a matrix shape, organic light-emitting layers 14 separated by the first partitions 10 and the second partitions 11, and, on which organic light-emitting layers are further arranged light-transmissive opposing electrodes 15 as common electrodes.

Moreover, the contact hole 17x is formed such that it penetrates through the interlayer insulator 9, on which contact hole 17x is provided an auxiliary electrode 18. Moreover, the auxiliary electrode 18 is structured such that a portion thereof protrudes into the aperture 12 which is formed by the first partitions 10 and the second partitions 11 to be connected with the pixel electrode 13, which pixel electrode 13 is connected to the drain electrode 7 of the respective TFT 8 through the auxiliary electrode 18.

Moreover, with reference to FIGS. 6 and 7, the contact hole 17x is covered with a portion of a dot-shaped first partition 10 which extends in the Y direction.

In the structure of the present embodiment, in the Y direction, the pixel electrodes 13 are separated by the second partitions 11 which extend in the X direction. Thus, in the Y direction, a structure is taken such that an edge of the pixel electrode 13 is in contact with the second partition 11 (see FIG. 7), or the edge of the pixel electrode 13 runs over the edge of the second partition 11 (not shown).

Moreover, the pixel electrodes 13 in the X direction are separated by the dot-shaped first partitions 10 arranged in the Y direction. Thus, in the X direction, a structure is taken such that an edge of the pixel electrode 13 is in contact with the first partition 10, or the edge of the pixel electrode 13 runs over the edge of the first partition 10.

When the structure of the present embodiment is adopted, as in the first embodiment, the contact hole 17x is covered with the first partition 10 extending in the Y direction, and which is separated from the aperture 12 contributes to light emission, so that a dent does not occur on the cathode which contributes to light emission, making it possible to form a highly flat cathode. Thus, the film thickness of the organic light-emitting layer 14 becomes uniform, making it possible to realize a display device and an organic EL device 16 having uniform light emission within the device and within the pixel area.

Moreover, in the Y direction, the pixel electrodes 13 are separated by the second partitions 11 extending in the X direction, and, in the X direction, the pixel electrodes 13 are separated by the dot-shaped first partitions 10 extending in the Y direction; the resolution of the pixel electrode 13 is not limited by a minimum resolution space of the inkjet machine used in printing the pixel electrode 13, and is determined by the resolution of the first partition 10 and the second partition 11.

In other words, the partition, which is formed using a photosensitive resin such as photosensitive polyimide material, photosensitive acrylic material, etc., has a minimum line width of not more than 5 um. The minimum resolution space in an inkjet method when the partition is not used is 30-50 um, so that adopting the structure of the present embodiment makes it possible to achieve a realization of the fabrication which has a several times finer design fabrication in the X and Y directions relative to the related art.

In the Y direction, the auxiliary electrode 18, which is for connecting the drain electrode 7 and the pixel electrode 13, is separated in a self-aligning manner by a line-shaped partition which extends in the X direction, so that it may be formed such that the length in the X direction has the length sufficient to protrude into the aperture 12 formed by the first partitions 10 and the second partitions 11. Therefore, in the X direction, a distance between the auxiliary electrodes 18 may be arranged such that it is greater than the distance between the pixel electrodes 13 in the first embodiment as described above, making it possible to substantially reduce shorting between neighboring auxiliary electrodes 18, or, in other words as a function, shorting between neighboring pixel electrodes 13.

Also in FIG. 6, the selector line, the signal line, the power line, and the capacitance are omitted in order to simplify the figure, but in order to put in the 2-transistor, 1-capacitor structure and the compensating circuit, etc., a structure is desirable which uses a larger number of TFTs 8 and capacitances.

Figure 8E:
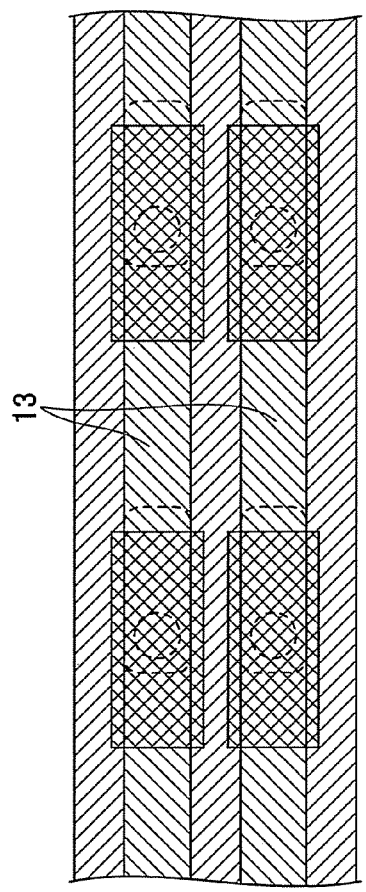
Figure 8F:
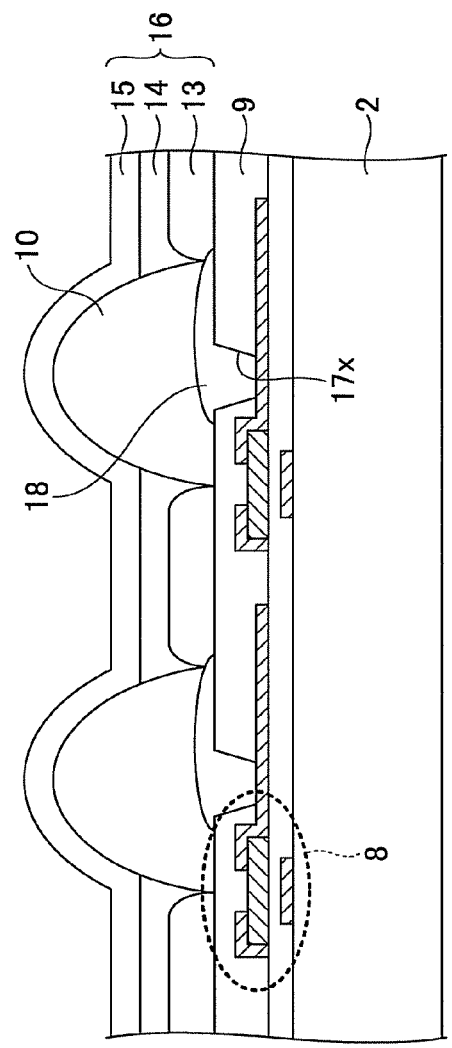
Figure 9:
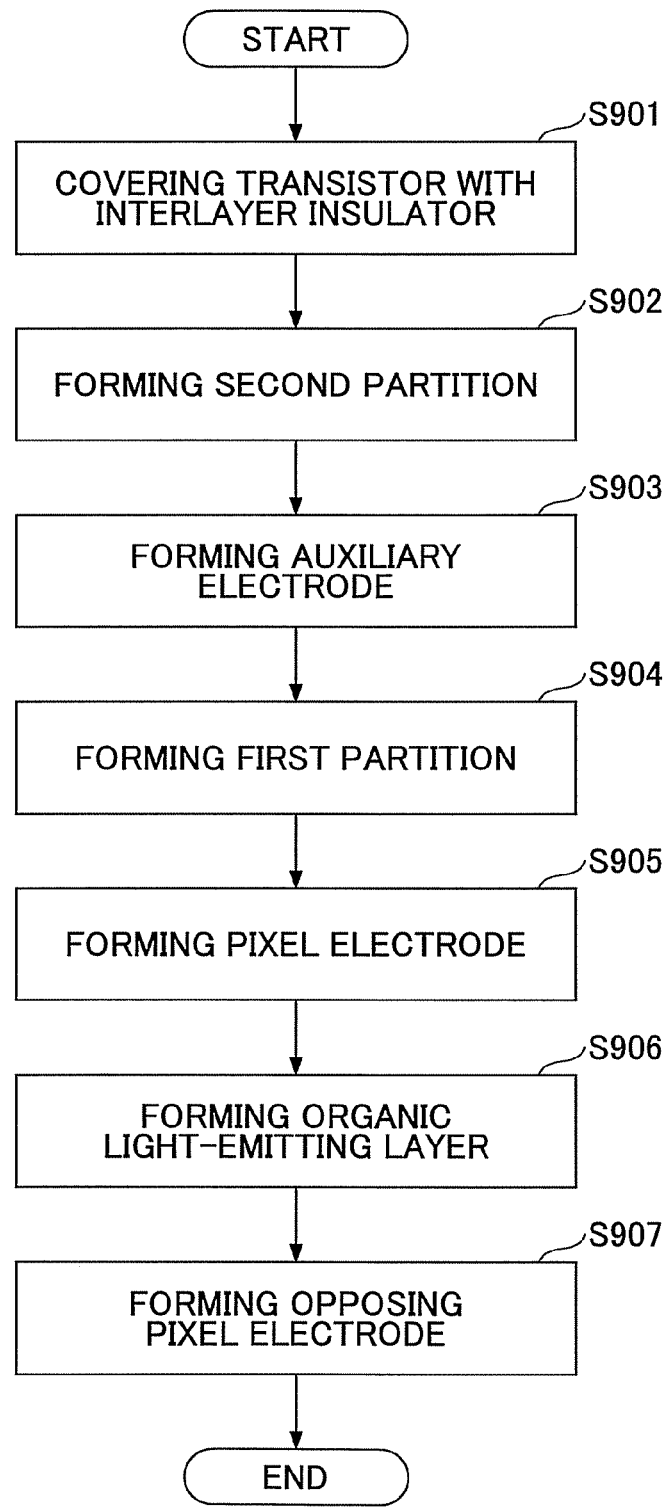
FIG. 9 is a flowchart illustrating the example of the method of manufacturing the display device of the third embodiment of the present invention.

Next, a method of manufacturing the display device according to the present embodiment is described according to FIGS. 8A through 8F and FIG. 9. FIGS. 8A and 8F show cross-sectional diagrams, while FIGS. 8B, 8C, 8D, and 8E show front views. FIG. 9 is a flowchart of the above mentioned method of manufacturing.

First, as shown in FIG. 8A, using a method similar to the above-described first embodiment, on a glass substrate as a substrate 2 are formed in a matrix shape TFTs 8 with amorphous silicon (a-Si) as an active layer 5. Then, using a plasma CVD method, an interlayer insulator 9 which includes SiON having the thickness of 0.5-2 um is deposited to cover the TFT 8, and, moreover, using a photolithography method, a contact hole 17x having a diameter of 10 um is formed on the drain electrode 7 (S901 in FIG. 9).

Next, as shown in FIG. 8B, after the contact hole 17x is formed, a water-repellant photosensitive resin is applied, exposure is performed using a photo mask which has a pattern of a second partition 11, development is performed using a tetramethyl ammonium solution, and curing is performed to form the second partitions 11 (S902 in FIG. 9). The second partition 11 is shaped as a line extending in the X direction; alignment of a photo mask having a pattern of the second partition 11 is performed such that the contact hole 17x is arranged between the second partitions 11. The second partition 11 is arranged to have a width of 10-30 um and a film thickness of 1-3 um. Then, a sample is UV ozone treated, the surface of the interlayer insulator 9 is hydrophilized, and the surfaces of the second partitions 11 are made water repellant.

Taking in account printing of an auxiliary electrode 18 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or above, and desirably between 60 to 110 degrees.

As the water-repellant photosensitive resin, a material used in the first embodiment may be used. Moreover, photosensitive resin, etc., may be used to form the second partitions 11, and then the whole surface of the interlayer insulator 9 and the second partitions 11 may be hydrophilized by $O_2$ plasma process, and then only the second partitions 11 may be selectively made liquid repellant by $CF_4$ plasma process.

Thereafter, as shown in FIG. 8C, printing and burning of ink in which nano Ag particles are dispersed in a polar solvent between the second partitions 11 is performed using an inkjet device to form auxiliary electrodes 18 (S903 in FIG. 9). The auxiliary electrode 18 also fills in the contact hole 17x, and a portion thereof is formed such that it protrudes into the aperture 12 surrounded by the first partitions 10 and the second partitions 11, and formed after a formation of the first partitions 10 in the following process. The film thickness of the auxiliary electrode 18 is arranged to be 30-100 nm.

In the Y direction, the surface of the second partition 11 is water repellant, so that the edge of the nano Ag ink stops at the second partition 11 and is separated in a self-aligning manner. In the present embodiment, the width of the second partition 11 is arranged to be 10-30 um. On the other hand, there is no partition in the X direction, so that the space between the auxiliary electrodes 18 must be made larger than the minimum resolution space of the inkjet machine. In the present embodiment, the space between the auxiliary electrodes 18 in the X direction is arranged to be 125-140 um.

The polar solvent used for ink in the present embodiment includes alcohol, ethylene glycol, ethylene glycol ether, etc., in a manner similar to ink used in printing the pixel electrode 13 of the first embodiment. Moreover, as the electro-conductive fine particles to be dispersed in the polar solvent, a known electro-conductive fine particle such as nano Au, nano Pd, and nano Cu, etc., besides nano Ag may be used.

As shown in FIG. 8D, after the auxiliary electrode 18 is formed, a water-repellant photosensitive resin is applied again, exposure is performed using a photo mask having a pattern of the first partition 10, development is performed using a tetramethyl ammonium solution, and curing is performed to form the first partition 10 (S904 in FIG. 9). The first partitions 10 are dot shape arranged in the Y direction; alignment is performed of a photo mask having a pattern of the first partitions 10 such that the contact holes 17x are covered between the second partitions 11. The first partition 10 is arranged to have a width of 10-30 um in the X direction and a film thickness of 1~3 um.

Then, a sample is UV ozone processed again to hydrophilize the surface of the interlayer insulator 9 that is in a region not covered with the auxiliary electrode 18 in the aperture 12, and the auxiliary electrode 18, and make the surface of the first partitions 10 and the second partitions 11 liquid-repellant.

Again in the present embodiment, taking into account printing of an organic light-emitting layer 14 and pixel electrode 13 by the inkjet method in the following process, the hydrophilicity of the surface of the interlayer insulator 9 that is in the region not covered with the auxiliary electrode 18 in the aperture 12 and the auxiliary electrode 18 is preferably such that an angle of contact with respect to pure water is not more than 30 degrees, and desirably not more than 20 degrees, and the liquid repellant property of the first partition 10 and the second partition 11 is preferably such that an angle of contact with respect to pure water is between 50 to 130 degrees or above, and desirably between 60 to 110 degrees.

As the water-repellant photosensitive resin, a material used in the first embodiment may be used. Moreover, after the photosensitive resin, etc., is used to form the first partitions 10, the whole surface of the partitions and the interlayer insulator 9 not in the region not covered with the auxiliary electrode 18 in the aperture 12 may be hydrophilized, and then only the first partitions 10 and the second partitions 11 may selectively made liquid-repellant by the $CF_4$ plasma process.

As shown in FIG. 8E, after a first partition 10 is formed, a pixel electrode 13 is formed using an inkjet machine within an aperture 12 surrounded by the second partitions 11 and the first partitions 10 (S905 of FIG. 9). For printing the pixel electrode 13, in a manner similar to the auxiliary electrode 18, ink, which is nano Ag particles dispersed in a polar solvent, may be printed and burned. The film thickness of the pixel electrode 13 is arranged to be 50-200 nm.

The polar solvent used for ink in the present embodiment includes alcohol, ethylene glycol, and ethylene glycol ether, etc. Moreover, as the electro-conductive fine particles to be dispersed in the polar solvent, a known electro-conductive fine particle such as nano Au, nano Pd, and nano Cu, etc., besides nano Ag may be used.

While flatness of the cathode may decrease somewhat due to a part of the auxiliary electrode 18 protruding into the aperture 12, the decrease is much smaller relative to the dent of the cathode made by a contact hole 17x, that has been a problem of the prior art. From the point of view of the uniformity of the image quality, taking account of an alignment margin, it is desirable that the auxiliary electrode 18 be arranged not to significantly protrude into the aperture 12 as much as possible. In the present embodiment, the length of the auxiliary electrode 18 which protrudes into the aperture 12 is arranged to in between 5-15 um.

As shown in FIG. 8F, after the pixel electrode 13 is formed, the organic light-emitting layer 14 is formed using the inkjet method (S906 in FIG. 9). The organic light-emitting layer 14 is formed such that each of three types that emit light of R, G, and B, are separately applied for each column in the X direction. For the organic light-emitting layer 14, as in the first embodiment, a common high molecular light-emitting material may be used; for example, polythiophenes, polyparaphenylenes, polyparaphenylene vinylenes, polyfluorenes, or iridium complexes may be dissolved in the polar solvent to yield ink, and the organic light-emitting layer may be formed by printing, drying, and curing using the inkjet machine. The film thickness of the organic light-emitting layer 14 is arranged to vary between 50 and 150 nm, taking into account the light-emitting efficiency of R, G, and B.

Then, using sputtering method, on the whole face of the partitions and the organic light-emitting layer 14 is deposited, as an opposing electrode 15, a transparent electro-conductive film including $In_2O_3.SnO_2$. The opposing electrode 15 is a common electrode, so that it is patterned using a shadow mask in sputtering process. The film thickness of the pixel electrode 15 is arranged to be 50-200 nm.

For increasing the efficiency of carrier injection, it is more desirable to form an electron injecting layer between the pixel electrode 13 and the organic light-emitting layer 14, and a hole injecting layer between the organic light-emitting layer 14 and the opposing electrode.

For the electron injecting layer, known materials such as a cyclopentadien derivative, an oxadiazole derivative, a bistyrylbenzene derivative, etc. may be used, while, for the hole injecting layer, PEDOT/PSS, etc., may be used. The electron injecting layer and the hole injecting layer may also be formed by printing, by an inkjet machine, a solution which is made into ink by dissolving in the polar solvent, and then perform drying thereof.

Finally, a display device 1, which layers the organic EL device 16 on the TFT 8, is completed by applying light-curing epoxy resin to an outer periphery portion, and adhering cap glass for sealing (not shown).

The display device manufactured with the present method has a larger width of the pixel electrode 13 in the X direction relative to the display device of the above-described first embodiment, and an expansion of the light-emitting region due to a larger aperture rate is realized.

Moreover, when the display device manufactured with the present method is provided with a flexible tape on which a driving IC is mounted using an anisotropic electro-conductive film, and an image evaluation test is performed, as in the above-described first embodiment, uneven light emission due to the contact holes 17x is not observed at all, so that, relative to the first embodiment, light emission at a higher brightness and at a same level of uniformity within the display area is seen for R, G, and B.

Fourth Embodiment

As the fourth embodiment, a display device and an organic EL device 16 in the above-described first, second, and third embodiments may be provided in an electronic device such as a television receiver (TV set), a mobile phone handset, etc.

Fifth Embodiment

Next, the fifth embodiment of the present invention is described.

Figure 10:
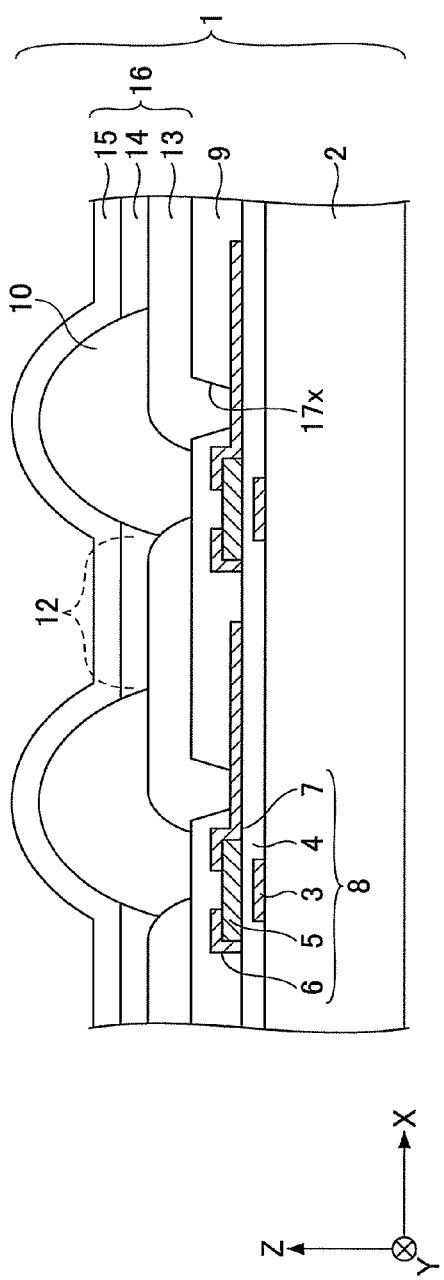
FIG. 10 is a cross-sectional diagram of an example of a display device of a fifth embodiment of the present invention.
Figure 11:
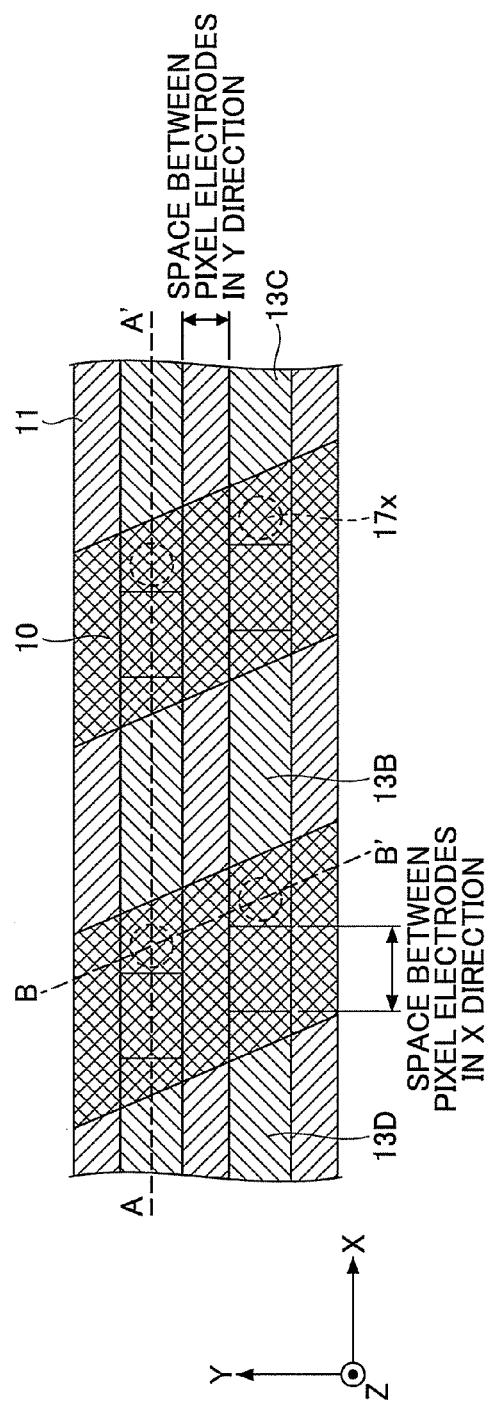
FIG. 11 is a plan view of the example of the display device of the fifth embodiment of the present invention.

Another example of the structure of the display device of the present embodiment is shown in FIGS. 10 and 11. FIG. 10 is a cross-sectional drawing of the display device 1, while FIG. 11 is a plan view of the display device 1 with the organic light-emitting layer 14 and the opposing electrode 15 omitted. The cross-sectional diagram in FIG. 10 shows a cross section at A-A' in FIG. 11.

With reference to FIG. 10, the display device 1 of the present embodiment has arranged on a substrate 2 in a matrix shape TFTs 8 each of which includes a gate electrode 3, a gate insulator 4, an active layer 5. a source electrode 6, and a drain electrode 7.

Moreover, with reference to FIGS. 10 and 11, the TFT 8 is covered with the interlayer insulator 9, on which is formed line-shaped first partitions 10 extending in a direction (direction B-B' shown) which is slanted with respect to the Y axis, and line-shaped second partitions 11 which extend in the X direction such that they are arranged to intersect with the first partitions 10, and apertures formed by the second partitions 11 and the first partitions 10 are arranged in a matrix shape.

Moreover, with reference to FIG. 10, the organic EL devices 16 are arranged such that in a matrix shape are arranged pixel electrodes 13 which, in the apertures 12, are separated by the second partitions 11 extending in the X direction, on which pixel electrodes 13 are arranged, in a matrix shape, organic light-emitting layers 14 separated by the first partitions 10 and the second partitions 11, and, on which organic light-emitting layers 14 are further arranged light-transmissive opposing electrodes 15 as common electrodes.

Moreover, the pixel electrode 13 of the organic EL device 16 is connected to the drain electrode 7 of the individual TFT 8 by the contact hole 17x formed to penetrate through the interlayer insulator 9. When the TFT 8 is turned on by a potential applied on the gate electrode 3 of the TFT 8, electric current flows through the contact hole 17x to the organic EL device 16, which emits light.

With reference to FIGS. 10 and 11, the contact hole 17x is covered with a portion of a first partition 10 which extends in the B-B' direction.

As shown in FIG. 11, in the Y direction, the pixel electrodes 13 in the present embodiment are separated by second partition 11, extending in the X direction. Thus, in the Y direction, a structure is taken such that an edge of the pixel electrode 13 is in contact with an edge of the second partition 11, or the edge of the pixel electrode 13 runs over the edge of the second partition 11. On the other hand, as shown in FIG. 10, the pixel electrode 13 in the X direction takes a structure such that it slips into the bottom of the line-shaped first partition 10.

When the structure of the present embodiment is adopted, the contact hole 17x is covered with a first partition 10, and which is separated from the aperture 12 which contributes to light emission; a dent does not occur on the cathode which contributes to light emission, making it possible to form a highly flat cathode. Thus, the film thickness of the organic light-emitting layer 14 becomes uniform, making it possible to realize a display device and an organic EL device having uniform light emission within the device and within the pixel area.

Moreover, with respect to the resolution of the pixel electrode 13, as in the first embodiment, in the Y direction, the pixel electrode 13 is separated by the second partitions 11 extending in the X direction, so that the space between the pixel electrodes 13 is not limited by a minimum resolution space of the inkjet machine used in printing the pixel electrode 13, and is determined by the resolution of the second partition 11.

In other words, the partition, which is formed using a photosensitive resin such as photosensitive polyimide material, photosensitive acrylic material, etc., has a minimum line width of not more than 5 um.

On the other hand, the minimum space for an inkjet method when the partition is not used is 30-50 um, so that adopting the structure of the present embodiment makes it possible to achieve a realization of the fabrication which has a finer design in the Y direction relative to the related art.

In the X direction, a pixel electrode 13B connected to the contact hole 17x needs to be separated from the neighboring pixel electrodes 13C and 13D (see FIG. 11); here, it suffices to make the space between the pixel electrodes 13 to correspond to the minimum resolution space (30-50 um) of the inkjet machine used in printing the pixel electrode 13.

Moreover, in the present embodiment, the first partition 10 intersects in a slanted manner with respect to the second partition 11 extending in the X direction, and the aperture 12 arranged in a matrix is lined up such that, in the Y direction, an X position coordinate is shifted. Therefore, in the Y direction, the pixel electrode 13 and the organic light-emitting layer 14 are also lined up such that, in the Y direction, an X position coordinate is shifted, making it possible to realize a display device 1 having a parallelogram-shaped display region.

In the present embodiment, while the second partition 11 is arranged to be shaped in a line extending in the X direction and the first partition 10 is arranged to be shaped in a line extending in a direction which is slanted with respect to the Y axis, the second partition 11 may be arranged to be shaped in a line slanted with respect to the X axis and the first partition 10 may be arranged to be shaped in a line extending in the Y direction, so that any structure which allows an arrangement of an aperture 12 surrounded by the first partitions 10 and the second partitions 11 is included in the present invention as long as the first partition 10 and the second partition 11 are not generally orthogonal with each other.

Figure 12E:
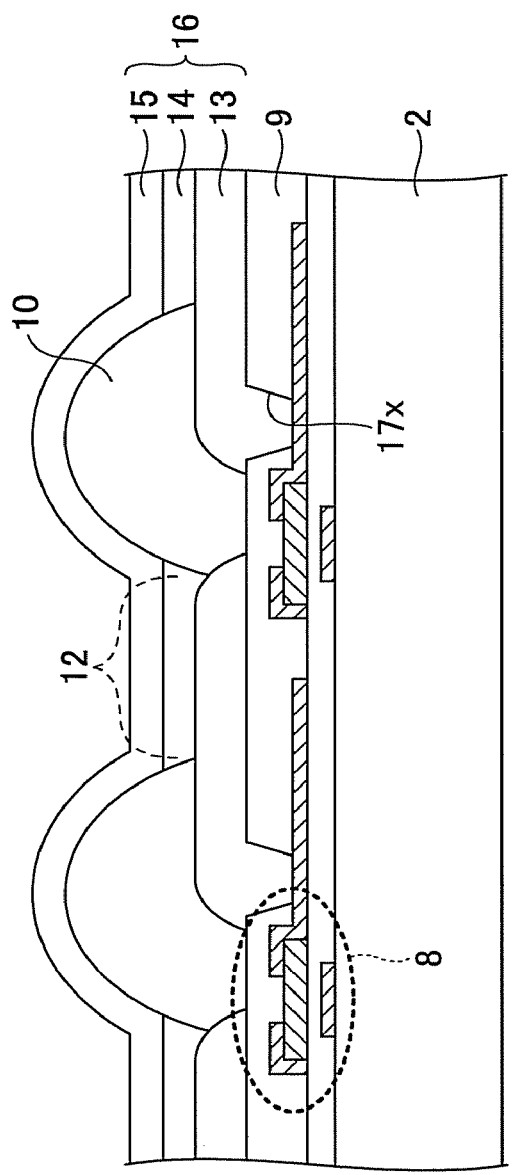

Next, a method of manufacturing the display device 1 according to the present embodiment is described according to FIGS. 12A through 12E. FIGS. 12A and 12E show cross-sectional diagrams, while FIGS. 12B, 12C, and 12D show front views.

As shown in FIG. 12A, on a substrate 2 which is a glass substrate, for example, is formed in a matrix shape, a TFT 8 which has amorphous silicon (a-Si) as an active layer 5. As in the first embodiment, Cr is deposited on the glass substrate 2 using sputtering method, and a gate electrode 3 is formed using a photolithography method. Then, $SiO_2$ is deposited by a plasma CVD method to yield a gate insulator 4. Then, a-Si is deposited by the CVD method, individualization is performed by the photolithography method to yield an active layer 5, and then Al—Si is deposited by sputtering method, a source electrode 6 and a drain electrode 7 are formed by the photolithography method, and the TFT 8 is completed which is arranged in a matrix shape having a density of 140 ppi. Moreover, as needed, the transistor characteristic may be improved by performing an annealing process after forming the transistor.

After the TFT 8 is formed, the interlayer insulator 9 which includes SiON is deposited by plasma CVD method and the TFT 8 is covered. The thickness of the interlayer insulator 9 is made as 0.5-2 um. Then, by the photolithography, the contact hole 17x of a diameter 10 um is formed on the drain electrode 7.

In the present embodiment, in order to arrange the first partition 10 in a manner slanted with respect to the Y axis, the contact hole 17x and the TFT 8 arranged in a matrix shape are, in the Y direction, also arranged to be lined up while shifting the X position coordinate.

Next, as shown in FIG. 12B, after the contact hole 17x is formed, a water-repellant photosensitive resin is applied, exposure is performed using a photo mask which has a pattern of a second partition 11 that is shaped as a line in the X direction, development is performed using a tetramethyl ammonium solution, and curing is performed to form a second partition 11. The second partition 11 is arranged to have a width of 10-30 um and a film thickness of 1-3 um.

Then, a sample is UV ozone treated, and surface of the interlayer insulator 9 is hydrophilized, and the surface of the second partition 11 is made liquid repellant.

Taking into account printing of a pixel electrode 13 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or above, and desirably between 60 to 110 degrees.

As a water-repellant photosensitive resin, a photosensitive resin may be used which has a fluorine group introduced at the tail of photosensitive acrylic resin, photosensitive polyimide resin, photosensitive epoxy resin, etc., or which has introduced polysiloxane, polysilane, polysiloxane resin-network, etc.

Moreover, photosensitive acrylic resin, photosensitive polyimide resin, photosensitive epoxy resin, etc., may be used to form a second partition 11, and then all of the surfaces of the interlayer insulator 9 and the second partitions 11 may be hydrophilized by $O_2$ plasma process, and then only the second partitions 11 may be selectively made liquid repellant by $CF_4$ plasma process. Either a low pressure method or a normal pressure method may be adopted for the $O_2$ plasma process and the $CF_4$ plasma process.

Thereafter as shown in FIG. 12C, printing and curing of ink, in which nano Ag particles are dispersed in a polar solvent between the second partitions 11, is performed using an inkjet device to form a pixel electrode 13. The pixel electrode 13, which is also filled within the contact hole 17x, is connected with a drain electrode 7 of the TFT 8 through the contact hole 17x. The film thickness of the pixel electrode 13 is arranged to be 50-200 nm.

In the Y direction, the surface of the second partition 11 is water repellant, so that the edge of the nano Ag ink stops at the second partition 11 and is separated in a self-aligning manner. In the present embodiment, the line width of the second partition 11 is 10-30 um. On the other hand, there is no partition in the X direction, so that the space between the pixel electrodes 13 must be made larger than the minimum resolution space of the inkjet device. In the present embodiment, the space between the pixel electrodes 13 in the X direction is arranged to be 30-40 um.

The polar solvent used for the ink in the present embodiment includes alcohol, ethylene glycol, ethylene glycol ether, etc. Moreover, in the present embodiment, ink in which nano Ag is dispersed in the polar solvent is used, and any known electro-conductive fine particles such as nano Au, nano Pd, nano Cu, etc., besides nano Ag may be used as the electro-conductive fine particles to be dispersed in the polar solvent.

As shown in FIG. 12D, after the pixel electrode 13 is formed, a water-repellant photosensitive resin is applied again, exposure is performed using a photo mask which has a pattern of a first partition 10 which is slanted with respect to the Y axis, development is performed using a tetramethyl ammonium solution, and curing is performed to form the first partition 10. An alignment is performed of a photo mask having a pattern of a first partition 10 such that the contact hole 17x is covered by the first partition 10. The first partition 10 is arranged to be shaped in a line which is slanted with respect to the Y axis and to have a line width of 50-60 um and a film thickness of 1-3 um.

Then, a sample is again UV ozone processed to hydrophilize the surface of the pixel electrode 13, and make the surface of the first partitions 10 and the second partitions 11 liquid repellant. Taking into account printing of an organic light-emitting layer 14 by the inkjet method in the following process, the hydrophilicity of the pixel electrode 13 is preferably such that an angle of contact with respect to pure water is not more than 30 degrees, and desirably not more than 20 degrees, and the liquid repellant property of the first partitions 10 and the second partitions 11 is preferably such that an angle of contact with respect to pure water is between 50 to 130 degrees or above, and desirably between 60 to 110 degrees.

As a water-repellant photosensitive resin, as in a manner similar to the second partition 11, a photosensitive resin may be used which has a fluorine group introduced at the tail of photosensitive acrylic resin, photosensitive polyimide resin, photosensitive epoxy resin, etc., or which has introduced polysiloxane, polysilane, polysiloxane resin-network, etc.

Moreover, photosensitive acrylic resin, photosensitive polyimide resin, photosensitive epoxy resin, etc., may be used to form a first partition 10, and then the whole surface of the pixel electrode 13, the first partitions 10, and the second partitions 11 may be hydrophilized by $O_2$ plasma process, and then only the first partitions 10 and the second partitions 11 may be selectively made liquid repellant by $CF_4$ plasma process. Either a low pressure method or a normal pressure method may be adopted for the $O_2$ plasma process and the $CF_4$ plasma process.

As shown in FIG. 12E, after a first partition 10 is formed, an organic light-emitting layer 14 is formed using an inkjet machine within an aperture 12 surrounded by the first partitions 10 and the second partitions 11. The organic light-emitting layer 14 is formed such that each of three types that emit light of R, G, and B, are separately applied for each column in the Y direction. For the organic light-emitting layer 14, a common high molecular light-emitting material may be used; for example, polythiophenes, polyparaphenylenes, polyparaphenylene vinylenes, polyfluorenes, iridium complexes, etc., may be dissolved in the polar solvent to yield ink, and the organic light-emitting layer may be formed by printing, drying, and curing using the inkjet machine. In the present embodiment, by the UV ozone process shown in FIG. 12D, the surface of the first partitions 10 and the second partitions 11 is made liquid-repellant, and the surface of the pixel electrode 13 is hydropholized, so that the edge of the high molecular organic light-emitting material dissolved by the polar solvent stops at the partition edge, so that the high molecular organic light-emitting material may be printed only within the aperture 12 even when there is a head curving, a head meandering, and ejecting variation in the inkjet machine. The film thickness of the organic light-emitting later 14 is arranged to vary between 50 and 150 nm, taking into account the light-emitting efficiency of R, G, and B.

Then, using sputtering method, on the whole face on the partitions and the organic light-emitting layer 14 is deposited, as an opposing electrode 15, a transparent electro-conductive film including $In_2O_3.SnO_2$. The opposing electrode 15 is a common electrode, so that it is patterned using a shadow mask in sputtering process. The film thickness of the pixel electrode 15 is arranged to be 50-200 nm.

For increasing the efficiency of carrier injection, it is more desirable to form an electron injecting layer between the pixel electrode 13 and the organic light-emitting layer 14, and a hole injecting layer between the organic light-emitting layer 14 and the opposing electrode 15.

For the electron injecting layer, known materials such as a cyclopentadien derivative, an oxadiazole derivative, a bistyrylbenzene derivative, etc., may be used, while, for the hole injecting layer, PEDOT/PSS, etc., may be used. The electron injecting layer and the hole injecting layer may also be formed by printing, by an inkjet machine, a solution which is made into ink by dissolving in the polar solvent, and then perform drying thereof.

Finally, a display device 1, which layers the organic EL device 16 on the TFT 8 is completed by applying light-curing epoxy resin to an outer periphery portion of a sample, and adhering cap glass for sealing (not shown).

Relative to a related-art display device 1 which forms, in one-time exposure and development, the partition having the aperture 12, the display device 1 manufactured with the present method can achieve an expansion of a light-emitting region because of a high aperture rate due the width of the pixel electrode 13 being large in the Y direction. Moreover, with respect to the Y direction, the light-emitting region is lined up while shifting the X position coordinate, forming a parallelogram-shaped display region.

Moreover, when the display device 1 manufactured with the present method is provided with a flexible tape on which a driving IC is mounted using an anisotropic electro-conductive film, and an image evaluation test is performed, as in the first embodiment, uneven light emission due to the contact holes 17x is not observed at all, so that light emission which is uniform within the display area is seen for R, G, and B.

Moreover, a discretely ejectable inkjet method is used for printing the organic light-emitting layer 14 according to the present embodiment; as the aperture 12 is surrounded by the liquid-repellant first partitions 10 and second partitions 11, the high molecular organic light-emitting material ejected on the first partitions 10 and the second partitions 11 gets into the aperture 12 in a self-aligning manner even if a dispenser method and nozzle printing method that yield continual ejection is used, so that such a device as described above may be used.

While, in the present embodiment, the first partition 10 and the second partition 11 are formed by the photolithography method using a water-repellant photosensitive resin, at least one of the partitions may be formed using a printing method such as a micro-contact print method, an inkjet method which uses ink containing water-repellant high molecular resin depending on the line width and shape of the first partition and the second partition 11, or at least one of the partitions may be formed using a printing method such as the micro-contact print method, an inkjet method using ink containing high molecular resin, and then made liquid-repellant by $CF_4$ plasma process, etc.

While a structure and a manufacturing method of a display device 1 having a rectangular or square-shaped display area are explained in the first embodiment, and a structure and a manufacturing method of a display device 1 using a parallelogram-shaped display region are explained in the fifth embodiment, the display device 1 of the first embodiment and of the fifth embodiment may be combined to also realize a display device 1 having various display regions, which display device 1 is also included in the present invention.

Sixth Embodiment

Next, the sixth embodiment of the present invention is described.

Different structures of the first partition 10 and the second partition 11 are shown in FIGS. 13A to 13D.

Figure 13A:
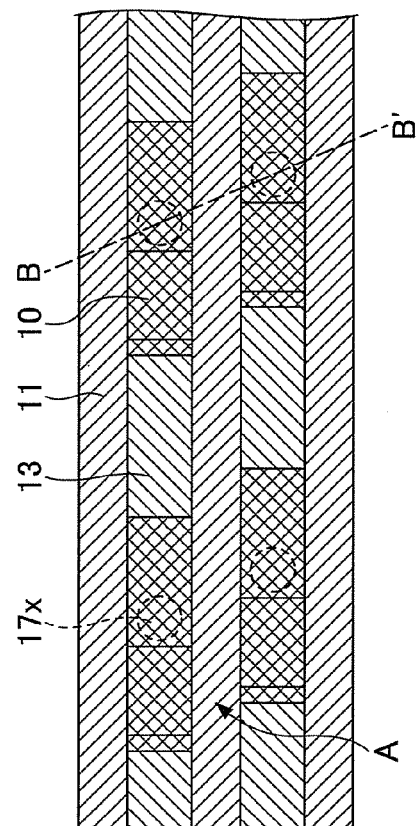

The structure shown in FIG. 13A is arranged to be a structure such that the second partition 11 extends in the X direction in a line shape, the first partition 10 is arranged in a dot shape on a straight line (B-B' shown) which is slanted with respect to the Y axis, and the first partition 10 is arranged between the second partitions 11.

In other words, a line-shaped second partition 11 on a straight line intersecting with the first partition 10 is arranged.

When the present structure is adopted, the first partition 10 is not formed on the second partition 11, so that the film thickness of the intersecting portion (shown as A) of the partitions may be made thinner relative to the structure of the fifth embodiment such that the second partition 11 and the first partition 10 having a line shape intersect, so that the film thickness variation as the whole of the partitions becomes small. As a result, a disconnection of opposing electrodes 15 due to the partitions may be reduced. Moreover, the film thicknesses of the first partition 10 and the second partition 11 may be made almost the same to further reduce the disconnection of the opposing electrodes 15.

Figure 13B:
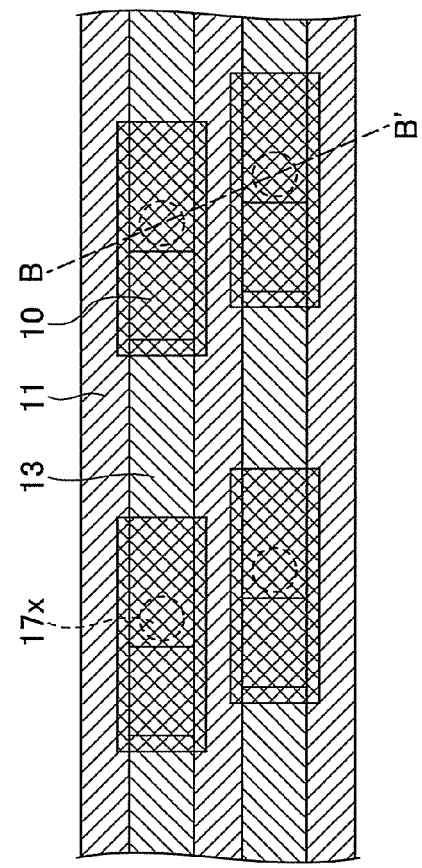

The structure shown in FIG. 13B is arranged to be a structure such that the second partition 11 extends in the X direction in a line shape, the first partition 10 is arranged in a dot shape lined up on a straight line (B-B' shown) which is slanted with respect to the Y axis, and the first partition 10 is arranged between the second partitions 11; moreover, the first partition 10 has an overlap with the second partition 11.

In other words, a line-shaped second partition 11 is arranged on a straight line intersecting with the first partition 10.

If the present structure is adopted, even if an alignment error occurs in an exposure process of the first partition 10 and the second partition 11, as the first partition 10 has the overlap with the second partition 11, the first partition 10 partially runs onto the second partition 11, so that a desired aperture 12 may be formed, in addition to the effect of FIG. 13A. In order to expect the effects as described above, it is preferable to arrange the overlap between the first partition 10 and the second partition 11 to be larger than the alignment error in the exposure process taking account of the design rule.

The structure shown in FIG. 13C is arranged to be a structure such that the second partition 11 extends in the X direction in a line shape, the first partition 10 is arranged in a dot shape lined up on a straight line (B-B' shown) which is slanted with respect to the Y axis, the first partition 10 is arranged between the second partitions 11, and the first partition 10 has an overlap with the second partition 11; moreover, the first partition 10 has a parallelogram shape. In other words, a line-shaped second partition 11 is arranged on a straight line intersecting with the first partition 10.

Even when the present structure is adopted, the same effect as that of FIG. 13B may be achieved.

The structure shown in FIG. 13D is arranged to be a structure such that the first partition 10 is arranged in a shape as a line extending in a direction (B-B' shown) which is slanted with respect to the Y axis, the second partition 11 has a dot shape lined up in the X direction, and the second partition 11 is arranged between the first partitions 10; moreover, the first partition 10 has an overlap with the second partition 11.

In other words, a dot-shaped second partition 11 is arranged on a straight line intersecting with the first partition 10.

When the present structure is adopted, in the same manner as FIGS. 13B and 13C, even when an alignment error occurs in an exposure process of the first partition 10 and the second partition 11, a desired aperture 12 may be formed.

In the present structure, in order to separate the Y direction of the pixel electrode 13 with the second partitions 11 in a self-aligning manner, it is necessary to arrange the length of the second partitions 11 in the X direction to be greater than the length of the pixel electrode 13 in the X direction.

Seventh Embodiment

Next, the seventh embodiment of the present invention is described.

Figure 14:
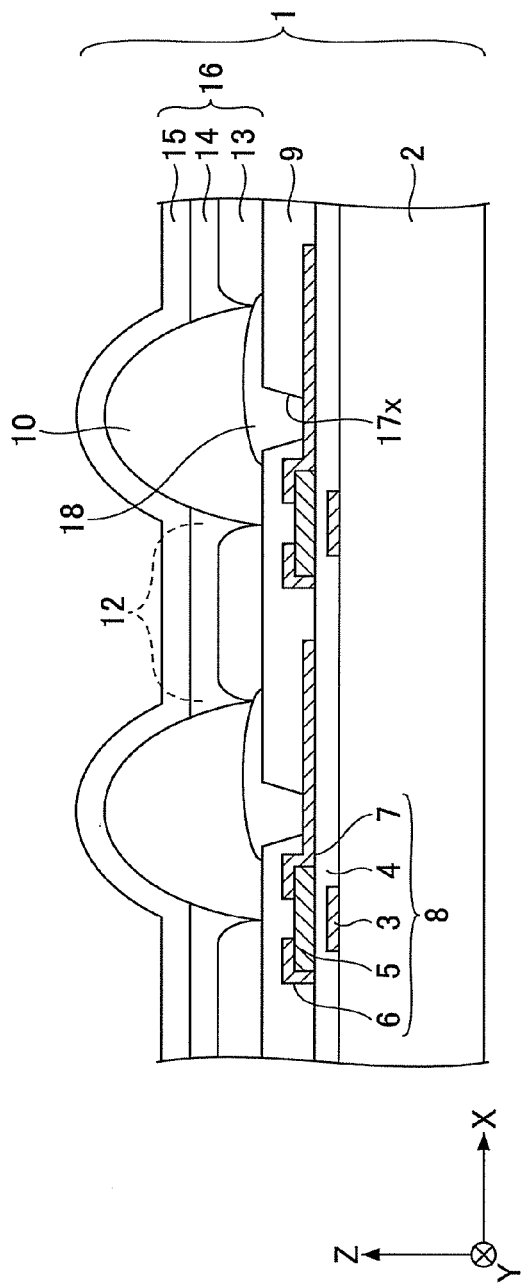
FIG. 14 is a cross-sectional diagram of an example of a display device of a seventh embodiment of the present invention.
Figure 15:
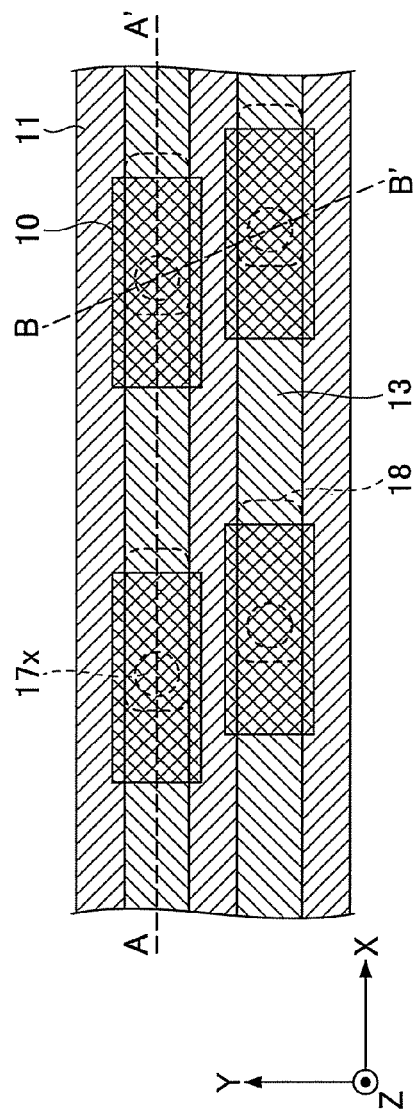
FIG. 15 is a plan view of the example of the display device of the seventh embodiment of the present invention.

Another example of the structure of the display device 1 of the present embodiment is shown in FIGS. 14 and 15. FIG. 14 is a cross-sectional drawing of the display device 1, while FIG. 15 is a plan view of the display device 1 with the organic light-emitting layer 14 and the opposing electrode 15 omitted. FIG. 14 is a cross sectional view cut along A-A' of FIG. 15.

With reference to FIG. 14, the display device 1 of the present embodiment has arranged on a substrate 2 in a matrix shape a TFT 8 which includes a gate electrode 3, a gate insulator 4, an active layer 5, a source electrode 6, and a drain electrode 7.

Moreover with reference to FIGS. 14 and 15, the TFT 8 is covered by the interlayer insulator 9, on which are provided second partitions 11 shaped in a line extending in the X direction and dot shaped first partitions 10 which are located on a straight line (B-B' shown) that is slanted with respect to the Y axis, which is arranged between the second partitions 11, and which is arranged such that it has an overlap with the second partition 11, and apertures 12 formed by the second partitions 11 and the first partitions 10 are arranged in a matrix shape. In other words, the second partition 11 is arranged on a straight line which intersects with the first partition 10.

Then, the contact hole 17x is formed such that it penetrates through the interlayer insulator 9, on which contact hole 17x is provided an auxiliary electrode 18, which is structured such that a part thereof protrudes into the aperture 12 formed by the first partitions 10 and the second partitions 11. Moreover, the contact hole 17x is covered with a part of the dot-shaped first partition 10 lined up in a shape of a straight line which is slanted with respect to the Y axis.

Moreover, with reference to FIG. 15, the organic EL device 16 is arranged such that in a matrix shape are arranged pixel electrodes 13 which, in the aperture 12, are separated in the Y direction by the second partitions 11 extending in the X direction and which are separated by the first partitions 10 in the X direction, on which pixel electrodes 13 are arranged, in a matrix shape, organic light-emitting layers separated by the first partitions 10 and the second partitions 11, and, on which organic light-emitting layers 14 are further arranged light-transmissive opposing electrodes 15 as common electrodes.

Furthermore, the pixel electrode 13 is structured to be connected with a drain electrode 7 of the individual TFT 8 through the auxiliary electrode 18 and the contact hole 17x.

In the structure of the present embodiment, in the Y direction, the pixel electrode 13 is separated by the second partitions which extend in the X direction. Thus, in the Y direction, a structure is taken such that an edge of the pixel electrode 13 is in contact with an edge of the second partition 11, or the edge of the pixel electrode 13 runs over the edge of the second partition 11.

Moreover, the pixel electrode 13 in the X direction is separated by the dotted-shaped first partitions 10 lined up in a direction which is slanted with respect to the Y axis. Thus, in the X direction, a structure is taken such that an edge of the pixel electrode 13 is in contact with the edge of the first partition 10, or the edge of the pixel electrode 13 runs over the edge of the first partition 10.

When the structure of the present embodiment is adopted, as in the fifth embodiment, the contact hole 17x is covered with a first partition 10, and which is separated from an aperture which contributes to light emission 12, a dent does not occur on the cathode which contributes to light emission, making it possible to form a highly flat cathode. Thus, the film thickness of the organic light-emitting layer 14 becomes uniform, making it possible to realize a display device and an EL device which has uniform light emission within the device and within the pixel area.

Moreover, with respect to the resolution of the pixel electrode 13, in the Y direction, the pixel electrode 13 is separated by the second partitions 11 extending in the X direction, and, in the X direction, the pixel electrode 13 is separated by the first partitions 10 in a shape of dots lined up in a straight line which is slanted with respect to the Y axis. The spaces between the pixel electrodes 13 are not limited by a minimum resolution space of the inkjet machine used in printing the pixel electrode 13, and are determined by the resolution of the first partition 10 and the second partition 11.

In other words, the partition, which is formed using a photosensitive resin such as photosensitive polyimide material, photosensitive acrylic material, etc., has a minimum line width of not more than 5 um. The minimum space for an inkjet method when the partition is not used is 30-50 um, so that adopting the structure of the present embodiment makes it possible to achieve a realization of fabrication which has a finer design in the X and Y directions relative to the related art.

In the Y direction, the auxiliary electrodes 18, which are for connecting the drain electrode 7 and the pixel electrodes 13, are separated in a self-aligning manner by line-shaped second partitions 11 which extend in the X direction, so that they may be formed such that the length in the X direction has the length sufficient to protrude to the aperture 12 formed by the first partitions 10 and the second partitions 11. Therefore, in the X direction, a distance between the auxiliary electrodes 18 may be arranged such that it is larger than the distance between the pixel electrodes 13 in the fifth embodiment as described above, making it possible to substantially reduce shorting between neighboring auxiliary electrodes 18, or, in other words as a function, shorting between neighboring pixel electrodes 13.

Also in FIG. 15, the selector line, the signal line, the power line, and the capacitance are omitted in order to simplify the figure, but in order to put in the 2-transistor, 1-capacitor structure and the compensating circuit, a structure is desirable which uses a larger number of TFTs 8 and capacitances.

Figure 16A:
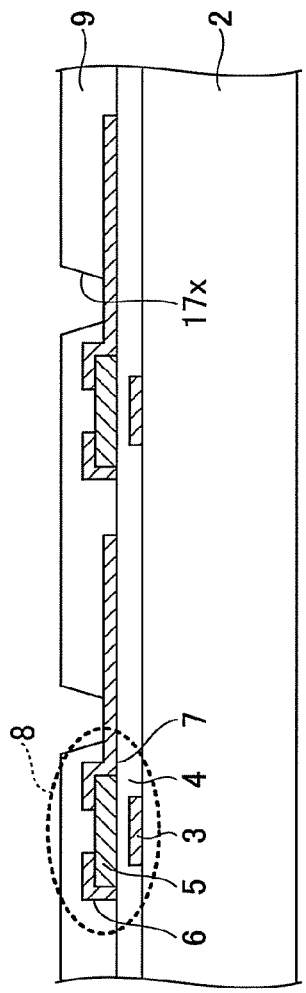
FIGS. 16A through 16F are diagrams illustrating the example of the method of manufacturing the display device of the seventh embodiment of the present invention.
Figure 16B:
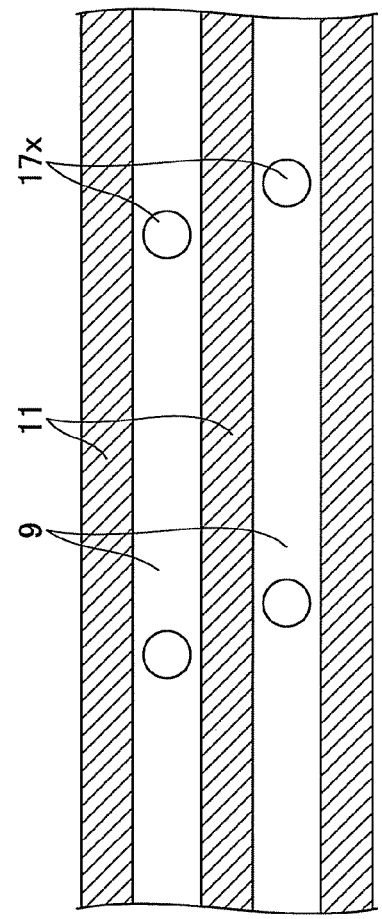
Figure 16C:
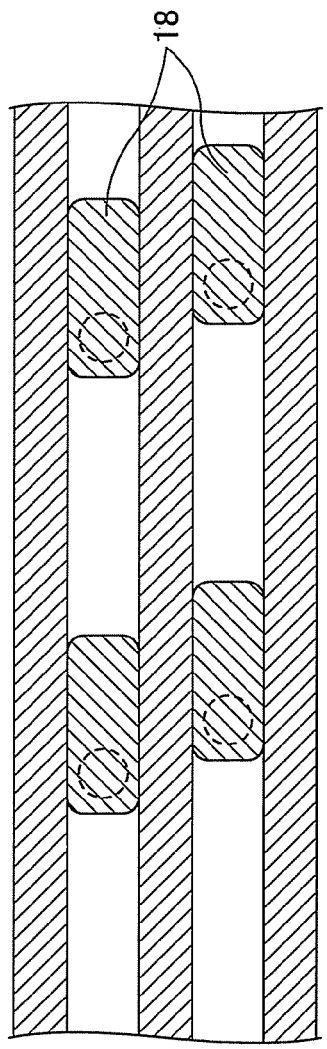
Figure 16D:
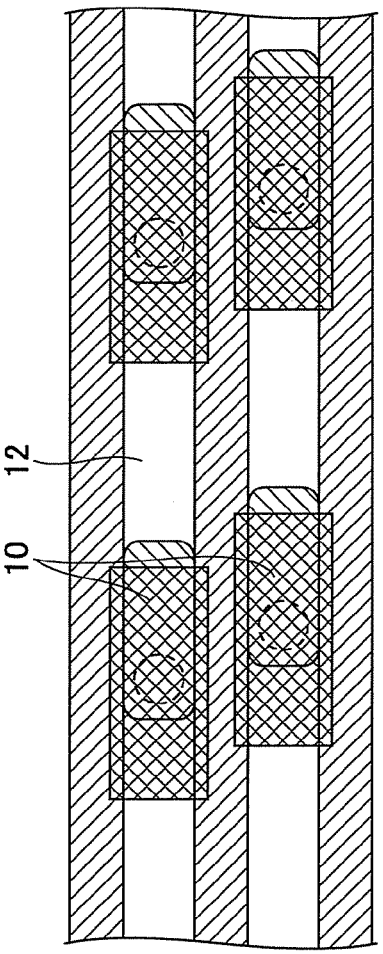
Figure 16E:
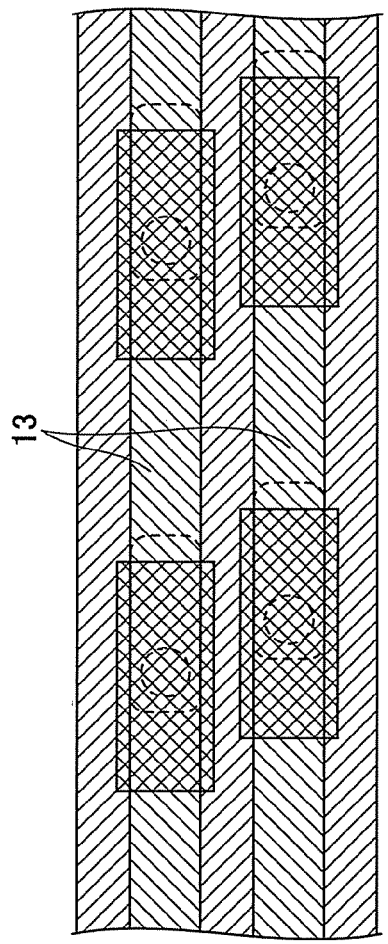
Figure 16F:
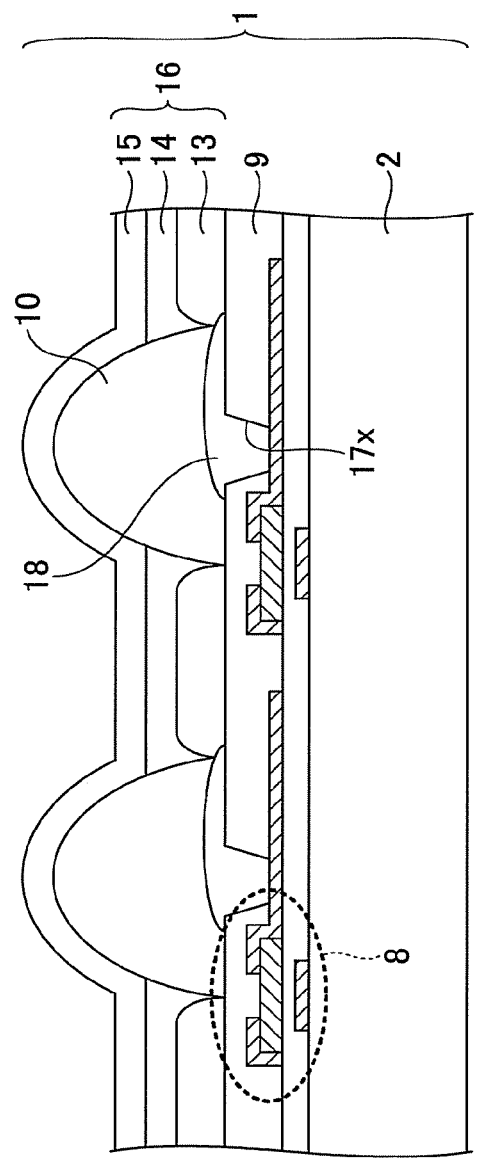

Next, a method of manufacturing the display device 1 according to the present embodiment is described according to FIGS. 16A and 16F, of which FIGS. 16A and 16F show cross-sectional diagrams, while FIGS. 16B, 16C, 16D, and 16E show front views.

First, as shown in FIG. 16A, using a method similar to the above-described fifth embodiment, on a glass substrate as a substrate 2 are formed in a matrix shape TFTs 8 with amorphous silicon (a-Si) as an active layer 5. Then, using a plasma CVD method, an interlayer insulator 9 which includes SiON having the thickness of 0.5-2 um is deposited to cover the TFT 8, and, moreover, using a photolithography method, a contact hole 17x having a diameter of 10 um is formed on the drain electrode 7.

Next, as shown in FIG. 16B, after the contact hole 17x is formed, a water-repellant photosensitive resin is applied, exposure is performed using a photo mask which has a pattern of a second partition 11, development is performed using a tetramethyl ammonium solution, and curing is performed to form the second partition 11. The second partition 11 is shaped as a line extending in the X direction; alignment of a photo mask having a pattern of the second partition 11 is performed such that the contact hole 17x is arranged between the second partitions 11. The line width of the second partition 11 is arranged to have a width of 20-30 um and a film thickness of 1-3 um.

Then, a sample is UV ozone treated, the surface of the interlayer insulator 9 is hydrophilized, and the surface of the second partition 11 is made liquid repellant.

Taking account of printing of an auxiliary electrode 18 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or more, and desirably between 60 to 110 degrees.

As the water-repellant photosensitive resin, a material used in the fifth embodiment may be used. Moreover, photosensitive resin, etc., may be used to form a second partition 11, and then the whole surface of the interlayer insulator 9 and the second partitions 11 may be hydrophilized by $O_2$ plasma process, and then only the second partitions 11 may be selectively made liquid repellant by $CF_4$ plasma process.

Thereafter as shown in FIG. 16C, printing and burning of ink, in which ink nano Ag particles are dispersed in a polar solvent, between the second partitions 11 is performed using an inkjet machine to form an auxiliary electrode 18. The auxiliary electrode 18 also fills in the contact hole 17x, and a portion thereof is formed such that it protrudes into the aperture 12 surrounded by the first partitions 10 and the second partitions 11 that are formed after a formation of the first partitions 10 in the following process. The film thickness of the auxiliary electrode 18 is arranged to be 30-100 nm.

In the Y direction, the surface of the second partition 11 is water repellant, so that the edge of the nano Ag ink stops at the second partition 11 and is separated in a self-aligning manner. On the other hand, there is no partition in the X direction, so that the space between the auxiliary electrodes 18 must be made larger than the minimum resolution space of the inkjet machine. In the present embodiment, the space between the auxiliary electrodes 18 in the X direction is arranged to be 125-140 um.

The polar solvent used for ink in the present embodiment includes alcohol, ethylene glycol, ethylene glycol ether, etc., in a manner similar to ink used in printing the pixel electrode 13 of the fifth embodiment. Moreover, as the electro-conductive fine particles to be dispersed in the polar solvent, a known electro-conductive fine particle such as nano Au, nano Pd, and nano Cu, etc., besides nano Ag may be used.

As shown in FIG. 16D, after the auxiliary electrode 18 is formed, a water-repellant photosensitive resin is applied again, exposure is performed using a photo mask having a pattern of the first partition 10, development is performed using a tetramethyl ammonium solution, and curing is performed to form the first partitions 10. The first partition 10 has a shape of dots lined up in a direction which is slanted with respect to the Y axis; alignment is performed of a photo mask having a pattern of the first partition 10 such that the contact hole 17x is covered between the second partitions 11. The first partition 10 is arranged to have a width of 30-40 um and a film thickness of 1-3 um.

Then, a sample is UV ozone processed to hydrophilize the surface of the interlayer insulator 9 that is in a region not covered with the auxiliary electrode 18 in the aperture 12 and the auxiliary electrode 18, and make the surface of the first partitions 10 and the second partitions 11 liquid-repellant.

Again in the present embodiment, taking account of printing of an organic light-emitting layer 14, pixel electrode 13 by the inkjet method in the following process, the hydrophilicity of the surface of the interlayer insulator that is in the region not covered with the auxiliary electrode 18 in the aperture 12 and the auxiliary electrode 18 is preferably such that an angle of contact with respect to pure water is not more than 30 degrees, and desirably not more than 20 degrees, and the liquid repellant property of the first and the second partitions is preferably such that an angle of contact with respect to pure water is between 50 to 130 degrees or above, and desirably between 60 to 110 degrees.

As the water-repellant photosensitive resin, a material used in the fifth embodiment may be used. Moreover, after the photosensitive resin, etc., is used to form the first partitions 10, the whole surface of the partitions and the interlayer insulator 9 that is in the region not covered with the auxiliary electrode 18 in the aperture 12 may be hydrophilized, and then only the first partitions and the second partitions may selectively made liquid-repellant by the $CF_4$ plasma process.

As shown in FIG. 16E, after a first partition 10 is formed, a pixel electrode 13 is formed using an inkjet machine within an aperture 12 surrounded by the first partitions 10 and the second partitions 11. For printing the pixel electrode 13, in a manner similar to the auxiliary electrode 18, ink, which is nano Ag particles dispersed in a polar solvent, may be printed and burned. The film thickness of the pixel electrode 13 is arranged to be 50-200 nm.

The polar solvent used for ink in the present embodiment includes alcohol, ethylene glycol, and ethylene glycol ether, etc., as in the fifth embodiment. Moreover, as the electro-conductive fine particles to be dispersed in the polar solvent, known electro-conductive fine particles such as nano Au, nano Pd, and nano Cu, etc., besides nano Ag may be used.

Flatness of the cathode may decrease somewhat due to a part of the auxiliary electrode 18 protruding into the aperture 12; the decrease is much smaller relative to the dent of the cathode by a contact hole 17x, that has been a problem of the prior art. From the point of view of the uniformity of the image quality, taking account of an alignment margin, it is desirable that the auxiliary electrode 18 be arranged not to significantly protrude into the aperture 12 as much as possible. In the embodiment of the present embodiment, the length of the auxiliary electrode 18 which protrudes into the aperture 12 is arranged to be 5-15 um.

As shown in FIG. 16F, after the pixel electrode 13 is formed, the organic light-emitting layer 14 is formed using the inkjet method. The organic light-emitting layer 14 is formed such that each of three types that emit light of R, G, and B, are separately applied for each column in the Y direction. For the organic light-emitting layer 14, as in the fifth embodiment, a common high molecular light-emitting material may be used; for example, polythiophenes, polyparaphenylenes, polyparaphenylene vinylenes, polyfluorenes, and iridium complexes may be dissolved in the polar solvent to yield ink, and the organic light-emitting layer may be formed by printing, drying, and curing using the ink jet machine. The film thickness of the organic light-emitting later 14 is arranged to vary between 50 and 150 nm, taking account of the light-emitting efficiency of R, G, and B.

Then, using sputtering method, on the whole face of the partitions and the organic light-emitting layer 14 is deposited, as an opposing electrode 15, a transparent electro-conductive film including $In_2O_3.SnO_2$. The opposing electrode 15 is a common electrode, so that it is patterned using a shadow mask in sputtering process. The film thickness of the opposing electrode 15 is arranged to be 50-200 nm.

For increasing the efficiency of carrier injection, it is more desirable to form an electron injecting layer between the pixel electrode 13 and the organic light-emitting layer 14, and a hole injecting layer between the organic light-emitting layer 14 and the opposing electrode 15.

For the electron injecting layer, known materials such as a cyclopentadien derivative, an oxadiazole derivative, a bistyrylbenzene derivative, etc., may be used, while, for the hole injecting layer, PEDOT/PSS, etc., may be used. The electron injecting layer and the hole injecting layer may also be formed by printing, by an inkjet machine, a solution which is made to ink by dissolving in the polar solvent, and then perform drying thereof.

Finally, a display device 1, which layers the organic EL device 16 on the TFT 8 is completed by applying light-curing epoxy resin to an outer periphery portion of a sample, and adhering cap glass for sealing (not shown).

The display device 1 manufactured with the present method has a larger width of the pixel electrode 13 in the X direction relative to the display device 1 of the above-described fifth embodiment, and an expansion of the light-emitting region due to a larger aperture rate is realized.

Moreover, with respect to the Y direction, as in the fifth embodiment, the light-emitting region is lined up while shifting the X position coordinate, forming a parallelogram-shaped display region.

Moreover, when the display device 1 manufactured with the present method is provided with a flexible tape on which a driving IC is mounted using an anisotropic electro-conductive film, and an image evaluation test is performed, as in the above-described fifth embodiment, uneven light emission due to the contact hole 17x is not observed at all, so that, relative to the fifth embodiment, light emission at a higher brightness and at a same level of uniformity within the face is seen for R, G, and B.

Moreover, a discretely ejectable inkjet method is used for printing the organic light-emitting layer 14 according to the present embodiment; as the aperture 12 is surrounded by the liquid-repellant first partitions 10 and second partitions 11, the high molecular organic light-emitting material ejected on the first partitions 10 and the second partitions 11 gets into the aperture 12 in a self-aligning manner even when a dispenser method and nozzle printing method that yield continual ejection is used, such a device as described above may also be used.

Furthermore, while, in the present embodiment, the first partition 10 and the second partition 11 are formed by the photolithography method using a water-repellant photosensitive resin, at least one of the partitions may be formed using a printing method such as a micro-contact print method; an inkjet method which uses ink containing water-repellant high molecular resin depending on the resolution of the printing machine, line width and shape of the first partition 10 and the second partition 11; or at least one of the partitions may be formed using a printing method such as the micro-contact print method, an inkjet method using ink containing high molecular resin, and then made water-repellant by $CF_4$ plasma process, etc.

Eighth Embodiment

Next, the eighth embodiment of the present invention is described.

The display device 1 in the fifth, sixth, and seventh embodiments having a parallelogram shaped display region may be provided in electronic devices such as a television receiver, a mobile telephone handset, signage, a monitor, etc. An example such that the display device 1 of the present invention is applied to the television receiver is described in detail based on FIGS. 17-22.

With reference to FIG. 17, a television device 200 according to the present embodiment includes a main controller 201, a tuner 203, an AD converter (ADC) 204, a demodulating circuit 205, a TS (transport stream) decoder 206, a voice decoder 211, a DA converter (DAC) 212, a voice output circuit 213, a speaker 214, a video decoder 221, a video/OSD combining circuit 222, a video output circuit 223, an image display device 224, an OSD drawing circuit 225, a memory 231, an operating device 232, a drive interface (drive I/F) 241, a hard disk device 242, an optical disk device 243, an IR receiver 251, a communications controller 252, etc.

The main controller 201, which controls the whole television device 200, includes a CPU, a flash ROM, a RAM, etc. The flash ROM stores therein a program written in CPU-decodable codes and various data sets to be used in processing by the CPU. Moreover, a RAM is a working memory.

The tuner 203 tunes into a broadcast of a preset channel out of broadcast waves received by the antenna 270.

The ADC 204 converts an output signal (analog information) of the tuner 203 into digital information.

The demodulating circuit 205 demodulates digital information from the ADC 204.

The TS decoder 206 performs TS decoding of an output signal of the demodulating circuit 205, and separates voice information and video information.

The voice decoder 211 decodes voice information from the TS decoder 206.

The DA converter (DAC) 212 converts an output signal of the voice decoder 211 into an analog signal.

The voice output circuit 213 outputs the output signal of the DA converter (DAC) 212 into the speaker 214.

The video decoder 221 decodes video information from the TS decoder 206.

The video/OSD combining circuit 222 combines the output signals of the video decoder 221 and the OSD drawing circuit 225.

The video output circuit 223 outputs the output signal of the video/OSD combining circuit 222 to the image display device 224.

The OSD drawing circuit 225, which includes a character generator for displaying a character and a drawing on a screen of the image display device 224, generates a signal including display information in accordance with an instruction from the operating device 232 and the IR receiver 251.

The memory 231 temporarily saves therein AV (audio-visual) data, etc.

The operating device 232, which includes an input medium (not shown) such as a control panel, etc., for example, reports, to the main controller 201, various information sets input from the user.

The drive IF 241, which is a bi-directional communications interface, complies with ATAPI (AT Attachment Packet Interface) as an example.

The hard disk device 242 includes a hard disk, and a drive device for driving the hard disk, etc. The drive device records data to the hard disk, and reproduces data recorded in the hard disk.

The optical disk device 243 records data to the optical disk (for example, DVD) and reproduces data recorded in the optical disk.

The IR receiver 251 receives an optical signal from a remote control transmitter 280, and reports to the main controller 201.

The communications controller 252 controls communicating with the Internet, via which various information sets may be obtained.

Figure 18:
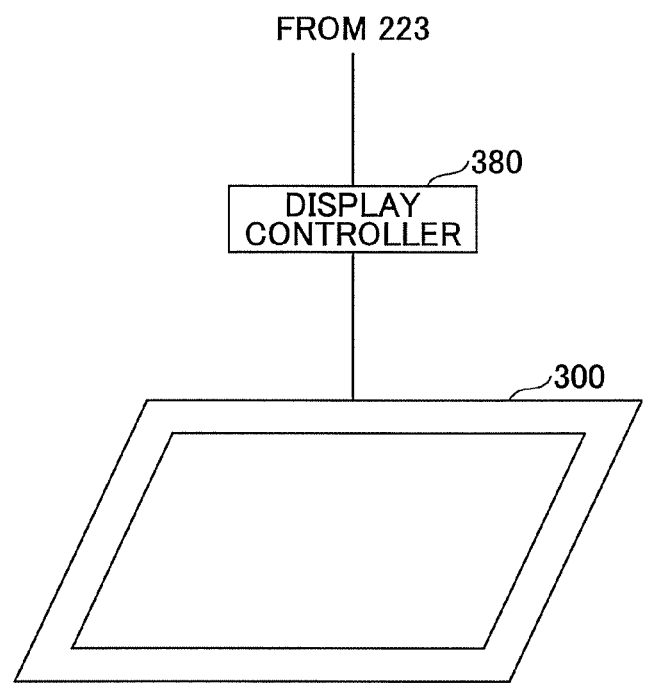
FIG. 18 is a first diagram for explaining the television device according to the eighth embodiment of the present invention.
Figure 19:
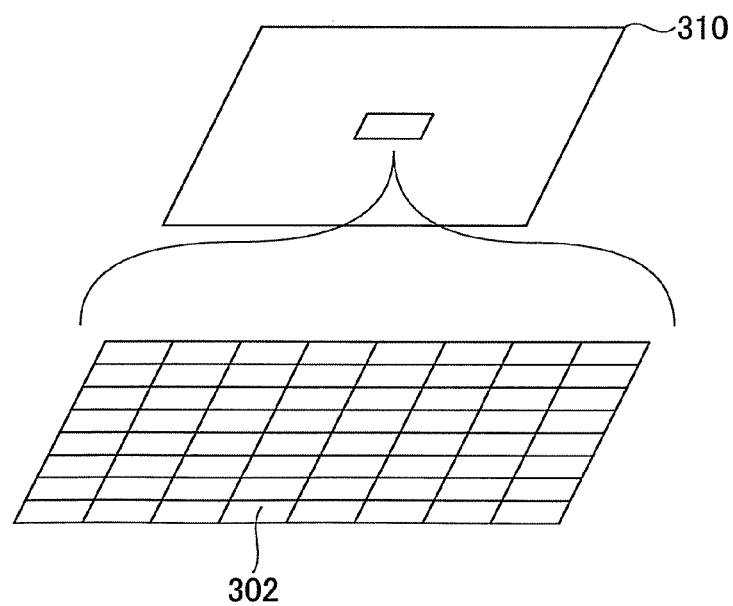
FIG. 19 is a second diagram for explaining the television device according to the eighth embodiment of the present invention.

As shown in FIG. 18 as an example, the image display device 224 has a display 300 and a display controller 380.

The display 300 has a display device 310 in which multiple (here, n×m) display devices 302 are arranged in a matrix in a parallelogram shape.

Figure 20:
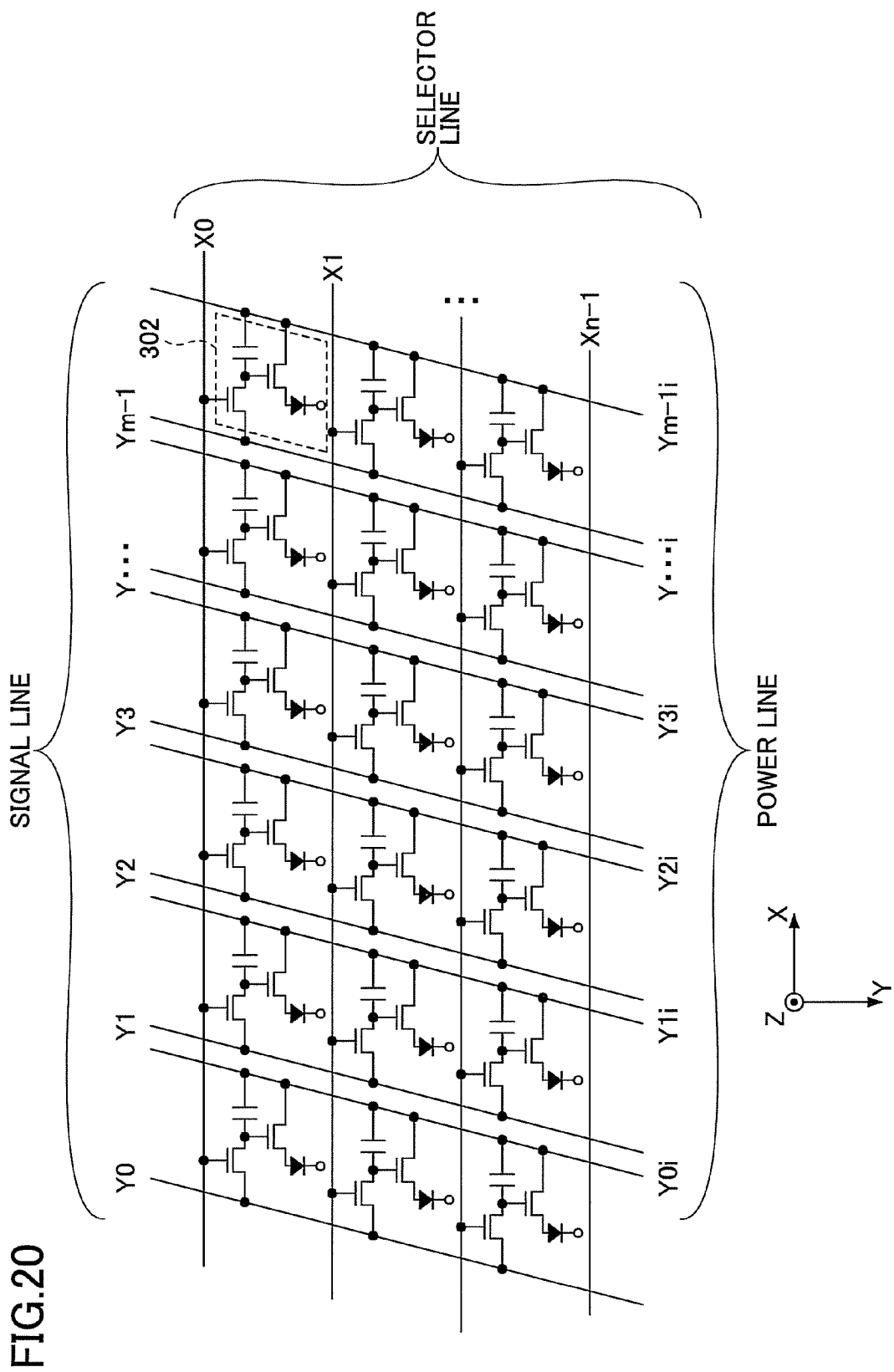
FIG. 20 is a third diagram for explaining the television device according to the eighth embodiment of the present invention.

Moreover, the display device 310, shown as one example thereof in FIG. 20, has n selector lines (X0, X1, X2, X3, ..., Xn-2, Xn-1) arranged at equal intervals along the X-axis direction, m signal lines (Y0, Y1, Y2, Y3, ..., Ym-1) arranged at equal intervals along the Y-axis direction, and m power lines (Y0$i$, Y1$i$, Y2$i$, Y3$i$, ..., Ym-1$i$) arranged at equal intervals in the Y-axis direction. Then, the display device 302 may be specified with the selector line and the signal line.

Figure 21:
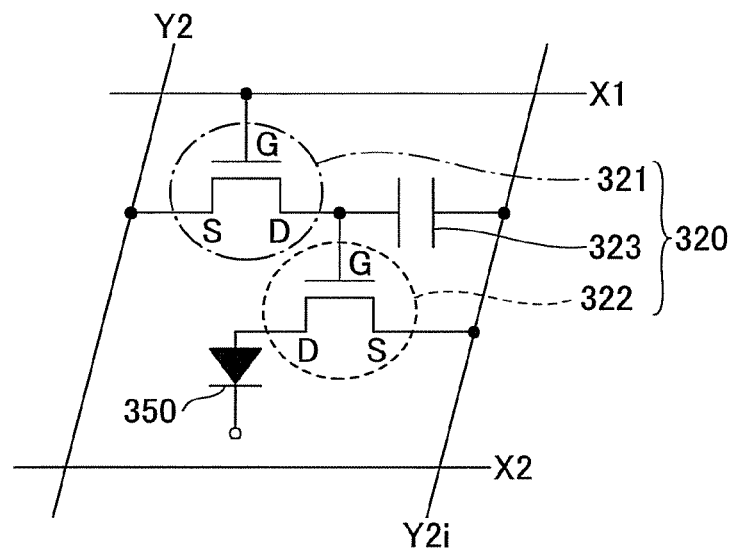
FIG. 21 is a diagram for explaining the display device according to the eighth embodiment of the present invention.

As shown in FIG. 21 as an example, the individual display device 302 has an organic EL (electro-luminescent) device 350, and a drive circuit 320 for emitting light from the organic EL device 350. In other words, the display device 310 is a so-called active matrix organic EL display.

Figure 22:
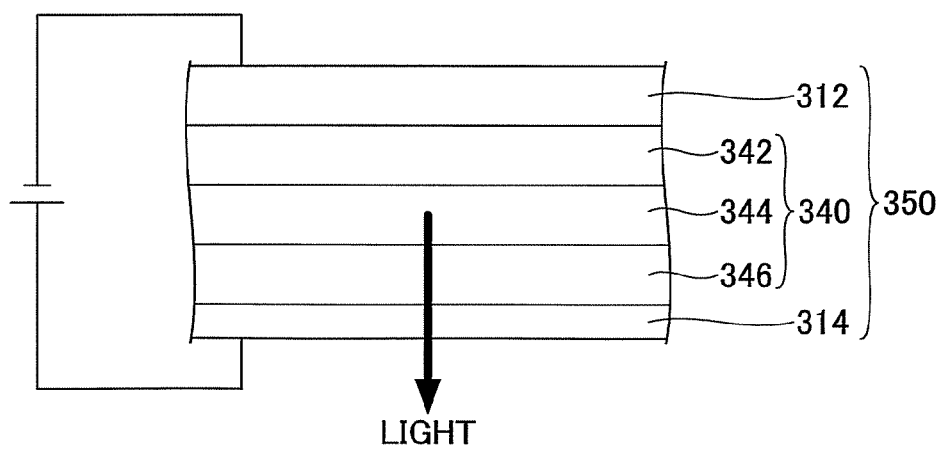
FIG. 22 is a diagram for explaining the organic EL device according to the eighth embodiment of the present invention.

As shown in FIG. 22 as an example, the organic EL device 350 includes an inorganic EL thin film layer 340, a cathode 312, and an anode 314.

Aluminum (Al) is used for the cathode 312. Magnesium (Mg)-silver (Ag) alloy, Aluminum (Al)-lithium (Li) alloy, etc., may also be used.

ITO is used for the anode 314. An electro-conductive oxide such as $In_2O_3$, $SnO_2$, ZnO, etc., may also be used therefor.

The organic EL thin film layer 340 has an electron transport layer 342, a light-emitting layer 344, and a hole transport layer 346. Then, the cathode 312 is connected to the electron transport layer 342 and the anode 314 is connected to the hole transport layer 346. When a certain voltage is applied between the anode 314 and the cathode 312, the light-emitting layer 344 emits light.

Moreover, as shown in FIG. 21, the drive circuit 320 has a capacitor 323, and two field effect transistors 321, 322.

The field effect transistor 321 operates as a switching device. The gate electrode G is connected to a predetermined selector line, while the source electrode S is connected to a predetermined signal line. Moreover, the drain electrode D is connected to one of the terminals of the capacitor 323.

The capacitor 323 is to store the state of the field effect transistor 321, in other words, data. The other terminal of the capacitor 323 is connected to a predetermined power supply line.

The field effect transistor 322 is to supply large current to the organic EL device 350. The gate electrode G is connected to the drain electrode D of the field effect transistor 321. Then, the drain electrode D is connected to the anode 314 of the organic EL device 350, while the source electrode S is connected to a predetermined power line.

Then, when the field effect transistor 321 is turned on, the organic EL device 350 is driven by the field effect transistor 322.

In the present embodiment, while the above-described image display device 244 as described above is used as an example, the display device 1 in the fifth, sixth, and seventh embodiments may be used in lieu of the image display device 224. In this way, in the present embodiment, a high performance television apparatus may be obtained at low cost.

Ninth Embodiment

Next, the ninth embodiment of the present invention is described.

The display apparatuses 1 in the fifth, the sixth, and the seventh embodiments that have a display region with a parallelogram are applicable in addition to the electronic equipment unit which has display function. While a method of scanning a laser with a polygon mirror is common, a line-shaped writing head is needed for making the device small. An example of the present embodiment being used in a head for writing on a photoreceptor is shown in FIG. 23.

Figure 23:
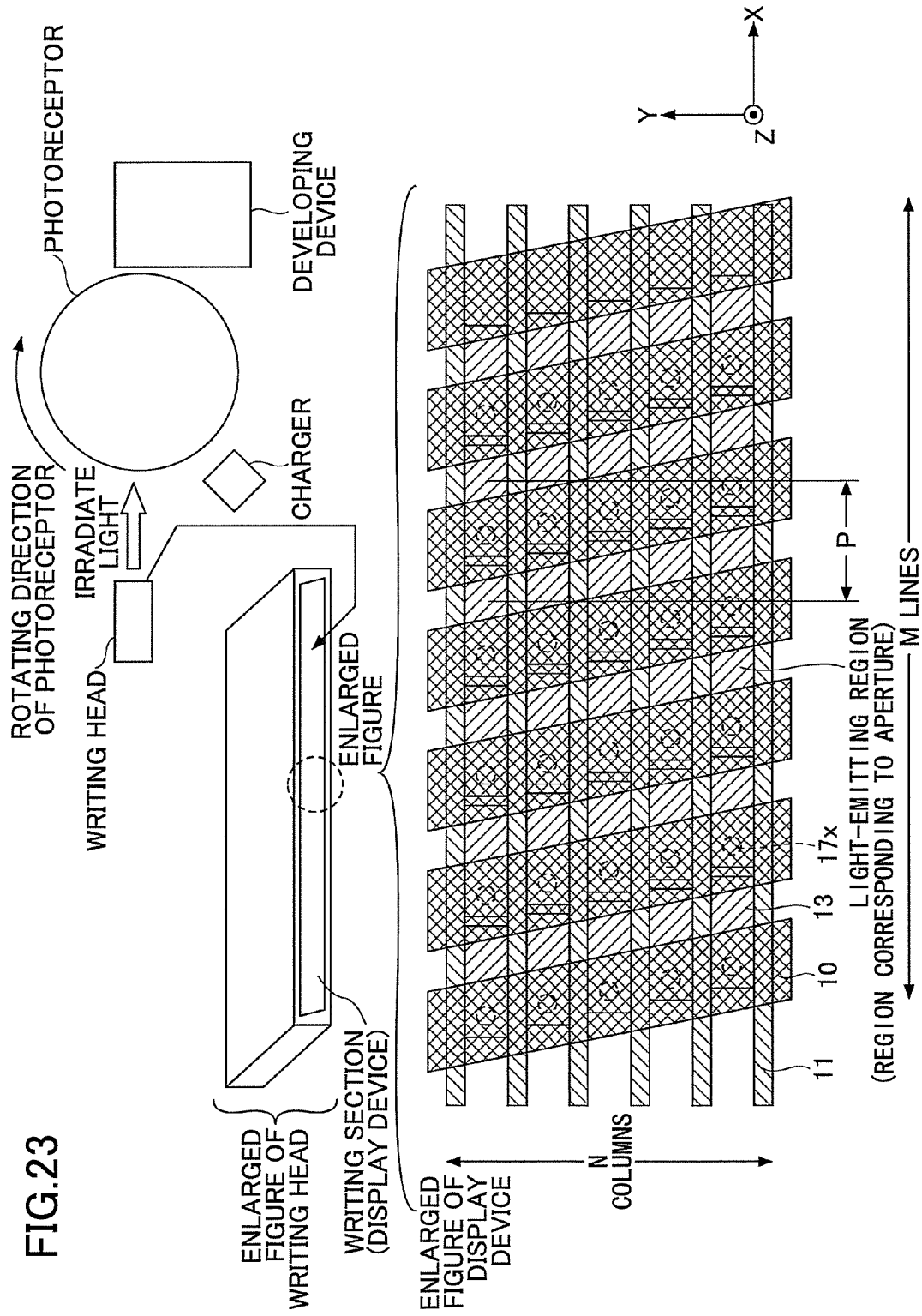
FIG. 23 is a schematic diagram of an optical writing head according to a ninth embodiment of the present invention.

With reference to FIG. 23, a rotating organic photoreceptor is uniformly charged by a corona charger, and then a light beam based on an image signal is irradiated from a writing head to form a latent image on the photoreceptor. The latent image of the photoreceptor is converted to a toner image with a developer, and then the toner image is transferred to paper with a transfer unit (not shown).

In order to obtain a highly fine image, the writing head needs to be arranged such that a light emitting point is lined up in a line shape at a 20-50 um pitch.

On a face, opposing the photoreceptor, of the writing head is a writing unit, on which is formed a display device 1 having a parallelogram-shaped display region which includes an organic EL device in which layers organic light-emitting devices 14 which irradiate light beams near 640 nm of the wavelength.

One side of a parallelogram-shaped display device 1 is very short relative to the other side thereof, and may be assumed to be substantially line shaped, and is arranged in a direction which is orthogonal to a rotating direction of the photoreceptor.

When the display device 1 is enlarged, a light-emitting region including M lines times N columns, or, in other words, a region corresponding to an aperture 12 surrounded by the first partitions 10 and the second partitions 11 is arranged. The M-line side is arranged such that it is orthogonal (as an X direction) with respect to photoreceptor rotating direction and the N-column side is arranged such that it is generally parallel (as a Y direction) with respect to the photoreceptor rotating direction, and N<<M as previously described.

Moreover, the light-emitting region in the X direction is lined up in a period of P; the structure is arranged such that, looking in the Y direction, N light-emitting regions are arranged in range corresponding to one period in the X direction.

Next, the structure of the display device 1 of the present embodiment is explained in detail.

The display device 1 of the present embodiment also has arranged in a matrix shape a TFT 8 which includes a gate electrode 3, a gate insulator 4, an active layer 5, a source electrode 6, and a drain electrode 7. Moreover, the TFT 8 is covered with the interlayer insulator 9, and on the drain electrode 7 is formed a contact hole 17x which penetrates through the interlayer insulator 9.

On the interlayer insulator 9 is formed line-shaped first partitions 10 which are located in the straight line extending in a direction which is slanted with respect to the Y axis, line-shaped second partitions 11, extending in the X direction that are arranged to intersect with the first partitions 10, and apertures 12 which are formed by the first partitions 10 and second partitions 11 in a matrix shape.

Moreover, on a predetermined region over an interlayer insulator and the contact hole 17x is arranged a pixel electrode 13 for which a width is specified by the second partition 11, and the contact hole 17x is structured to be covered with a portion of the first partition 10.

Furthermore, an organic EL device 16 is arranged such that, in the aperture 12 surrounded with the first partitions 10 and the second partitions 11, is arranged in a matrix shape an organic light-emitting layer 14 which emits light of a wavelength of about 640 nm, and, further, on the organic light-emitting layer 14 is arranged a light-transmissive opposing electrode 15 as a common electrode.

When the TFT 8 is turned on by a potential applied on the gate electrode 3 of the TFT 8, electric current flows through the contact hole 17x to the organic EL device 16, which emits light.

Adopting the structure of the present invention makes it possible to realize a high aperture rate, and a light-emitting region is lined up while shifting the X positional coordinate in the Y direction, so that a parallelogram-shaped display region may be realized.

Moreover, the dent of the pixel electrode 13 due to the contact hole 17x does not occur, making it possible to realize uniform light emission.

The display device 1 of the present embodiment is arranged such that the light-emitting region light is lined up while the X position coordinate is shifted in the Y direction, making it possible to reduce the number of light-emitting regions in the X direction with respect to the number of elements D needed for the line-shaped writing head. In other words, it is enough to line up the light-emitting region in the X direction such that a relationship of $D=N \times M$ is satisfied. As a result in the X direction, the density of the light-emitting region may be reduced.

In the present embodiment, N=5, so that lining up the pixels in the X direction at a 100-250 um pitch makes it possible to achieve performance comparable to that of a writing head with the light-emitting points lined up at a 20-50 um pitch, to obtain a highly fine image even when a process of a resolution which is lower than that in a related art is used, and to manufacture copiers and printers, etc., at a lower cost.

The size of the light-emitting area of the pixel may be appropriately selected depending on N, resolution of an input signal, particle diameter of the toner, resolution of photoreceptor used, etc. With the display device 1 of the present embodiment, the region surrounded by the first partitions 10 and the second partitions 11 becomes a light-emitting region, and the first partition 10 and the second partition 11 are manufactured in different processes, so that making the area of the aperture 12 small is relatively easy, making it possible to satisfactorily realize a light-emitting area determined by the N, the resolution of the input signal, the particle diameter of the toner, and the resolution of the photoreceptor.

While an organic photoreceptor is used in the present embodiment, a general photoreceptor including an amorphous silicon photoreceptor, a selenium photoreceptor, a compound semiconductor photoreceptor, etc., may also be used depending on the wavelength of light emitted by the display device 1. Moreover, while a corona charger is used for the charger, a contact-type charger may also be used such as a charging roller, a charging brush, a charging blade, etc.; and, for the developer, a common device may be used which is used for the copier, printer, etc., such as a magnetic brush, etc.

While a structure which is similar to that of the display device 1 of the above-described fifth embodiment is used with the organic light-emitting layer 14 of one color, a structure within the organic light-emitting layer 14 of one color in the display device 1 of the above-described sixth and seventh embodiments may also be adopted, making it possible to use various display devices 1 having a structure according to the present invention.

Tenth Embodiment

Next, the tenth embodiment of the present invention is described.

While in the first through the ninth embodiments, a display device 1 using an organic EL device 16 is described, a pixel electrode 13 having a high aperture rate may be realized, so that a high aperture rate is obtained even in a display device 1 having a display functional layer on the pixel electrode 13 and an opposing electrode 15 on the display functional layer in lieu of the opposing electrode 15 and the organic light-emitting layer 14, making it possible to obtain a satisfactory image. As the display function layer, an electrophoretic particle, an electrochromic layer, a liquid crystal layer, etc., may be adopted.

Figure 24A:
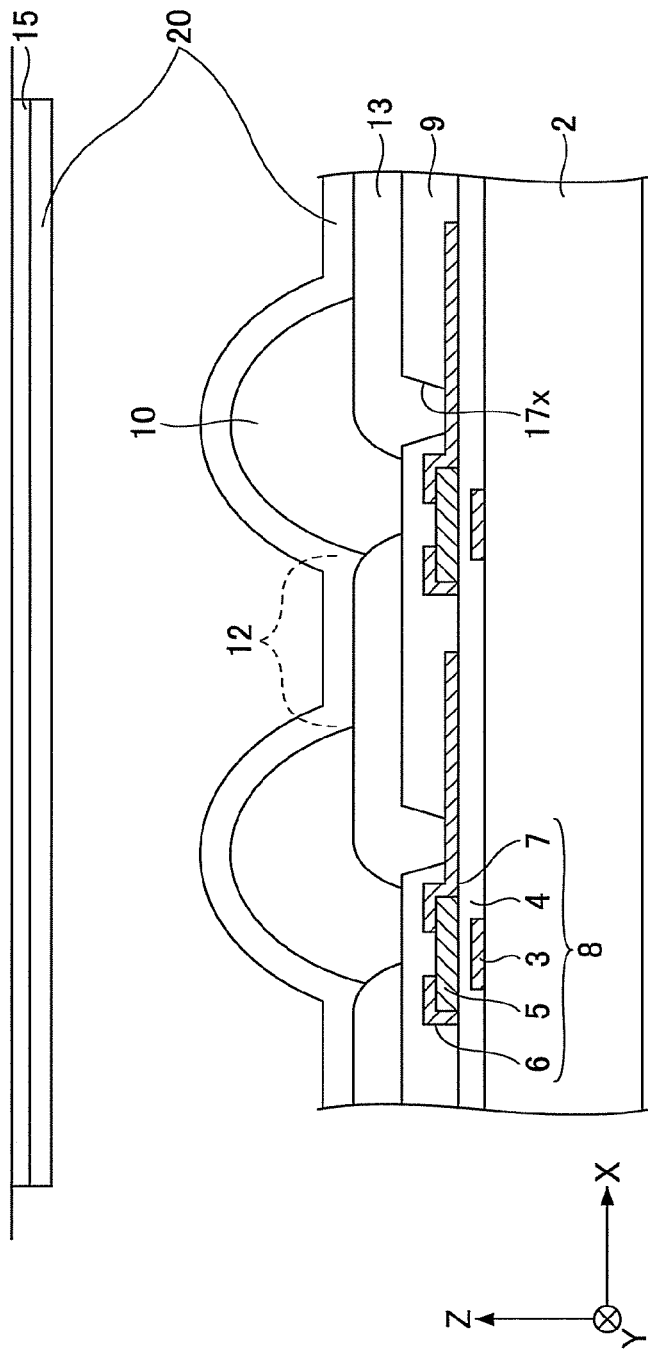

FIG. 24A shows an example of the display device 1 which layers the liquid crystal display device according to the present embodiment.

The substrate 2 has arranged thereon in a matrix shape TFTs 8, each of which includes a gate electrode 3, a gate insulator 4, an active layer 5, a source electrode 6, and a drain electrode 7. Moreover, the TFT 8 is covered with the interlayer insulator 9, on which is formed line-shaped first partitions 10, and line-shaped second partitions 11 arranged to intersect with the first partition 10, and, furthermore, apertures 12 formed by the second partitions 11 and the first partitions 10 are arranged in a matrix shape. The first partitions 10 and the second partitions 11 may intersect with each other in a generally orthogonal or slanted manner.

Moreover, in an aperture 12 is arranged in a matrix shape a pixel electrode 13, which is separated in the Y direction by the second partitions 11 extending in the X direction and which is connected to the drain electrode 7 of the individual TFT 8 by the contact hole 17x which is formed such that it penetrates the interlayer insulator 9. The contact hole 17x is covered with a portion of the first partition 10. Furthermore, an alignment layer 20 including rubbed polyimide is formed on the pixel electrode 13, first partition 10, and the second partition 11.

Moreover, a transmissive opposing electrode 15 is formed on the opposing substrate 2, and another alignment layer 20 including rubbed polyimide is also formed on the transmissive opposing electrode 15. Rubbing direction on the transmissive opposing electrode 15 is arranged to be orthogonal with the pixel electrode 13 side.

In between the two opposing alignment layers is nematic liquid crystal. When the TFT 8 is turned on by a potential applied to the gate electrode 3 of the TFT 8, a potential of the pixel electrode 13 changes through the contact hole 17x, so that the alignment state of the nematic liquid crystal changes, acting as a shutter function to display an image.

FIG. 24B shows an example of the display device 1 which layers the electrophoretic device according to the present embodiment.

The substrate 2 has arranged thereon in a matrix shape TFTs 8, each of which includes a gate electrode 3, a gate insulator 4, an active layer 5, a source electrode 6, and a drain electrode 7. Moreover, the TFT 8 is covered with the interlayer insulator 9, on which is formed line-shaped first partitions 10 and line-shaped second partitions 11 arranged to intersect with the first partitions 10, and, furthermore, apertures 12 formed by the second partitions 11 and the first partitions 10 are arranged in a matrix shape. Furthermore, in an aperture 12 is arranged in a matrix shape a pixel electrode 13, which is separated in the Y direction by the second partitions 11 extending in the X direction and which is connected to the drain electrode 7 of the individual TFT 8 by the contact hole 17x which is formed such that it penetrates the interlayer insulator 9. The contact hole 17x is covered with a portion of the first partition 10.

On the opposing substrate 2 is formed a transmissive opposing electrode 15, on which is fixed, by electrodeposition method, microcapsules such that white particles which include positive-charged $TiO_2$ and black particles which include negative-charged carbon that are dispersed in silicone oil, and which is arranged to have a structure adhered onto the pixel electrode 13 by an adhesive (not shown).

In the present embodiment, when the TFT 8 is turned on by a potential applied to the gate electrode 3 of the TFT 8, the potential of the pixel electrode 13 changes via the contact hole 17x, and the white and the black particles are attracted onto the pixel electrode 13 or the transmissive opposing electrode 15 side, making it possible to display a high-contrast black and white image.

FIG. 24C shows an example of the display device 1 which layers the electrochromic device according to the present embodiment.

The substrate 2 has arranged thereon in a matrix shape TFTs 8, each of which includes a gate electrode 3, a gate insulator 4, an active layer 5, a source electrode 6, and a drain electrode 7. Moreover, the TFT 8 is covered with the interlayer insulator 9, on which is formed line-shaped first partitions 10, and line-shaped second partitions 11 arranged to intersect with the first partitions 10, and, furthermore, apertures 12 which are formed by the second partitions 11 and the first partitions 10 are arranged in a matrix shape.

Furthermore, in an aperture 12 is arranged in a matrix shape pixel electrodes 13, which are separated in the Y direction by the second partitions 11 extending in the X direction and each of which is connected to the drain electrode 7 of the individual TFT 8 by the contact hole 17x which is formed such that it penetrates the interlayer insulator 9. The contact hole 17x is covered with a portion of the first partition 10.

On the opposing substrate 2 is formed a transmissive opposing electrode 15, on which an electrochromic layer 21 is layered, and which is structured so that a space in between the electrochromic layer 21 and the pixel electrode 13 is filled with an electrolytic solution such that $TiO_2$ particles are dispersed.

In the present embodiment, when the TFT 8 is turned on by a potential applied to a gate electrode 3 of the TFT 8, current flows into the pixel electrode 13 through the contact hole 17x, and reduction-oxidation reaction occurs at the electrochromic layer 21 to color or decolor, making it possible to display a two-color image.

The above-described display device using the liquid crystal device, the display device using the electrophoretic device, and the display device using the electrochromic device also have a high aperture rate.

While the present embodiment has a structure (the same active-matrix driver circuit, but different display devices) which is similar to that of the first or the fifth embodiments, it may have a structure which is similar to the structure of the second, third, and fourth embodiments.

Eleventh Embodiment

Figure 25:
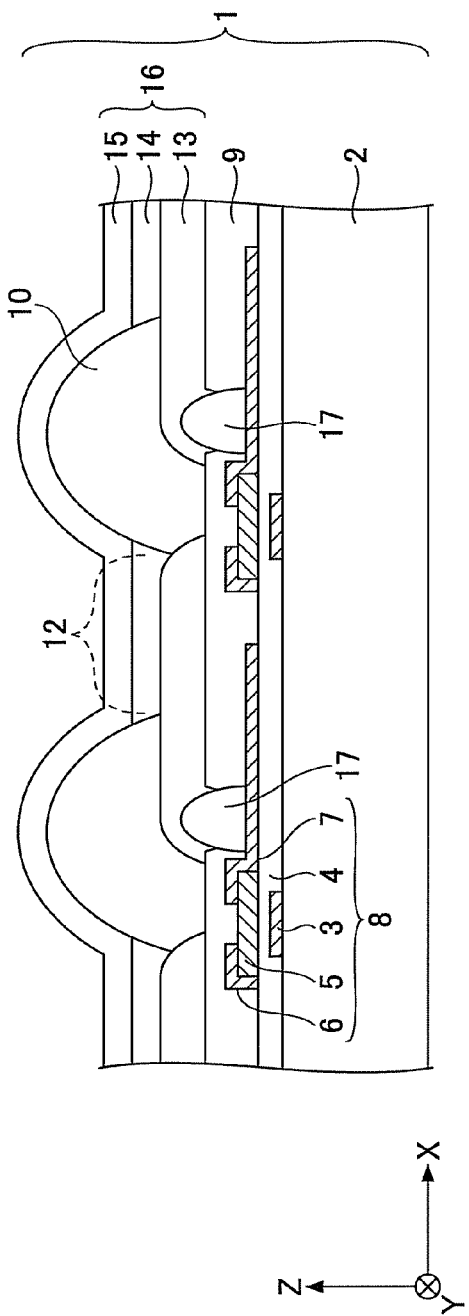
FIG. 25 is a cross-sectional diagram of an example of a display device of an eleventh embodiment of the present invention.
Figure 26:
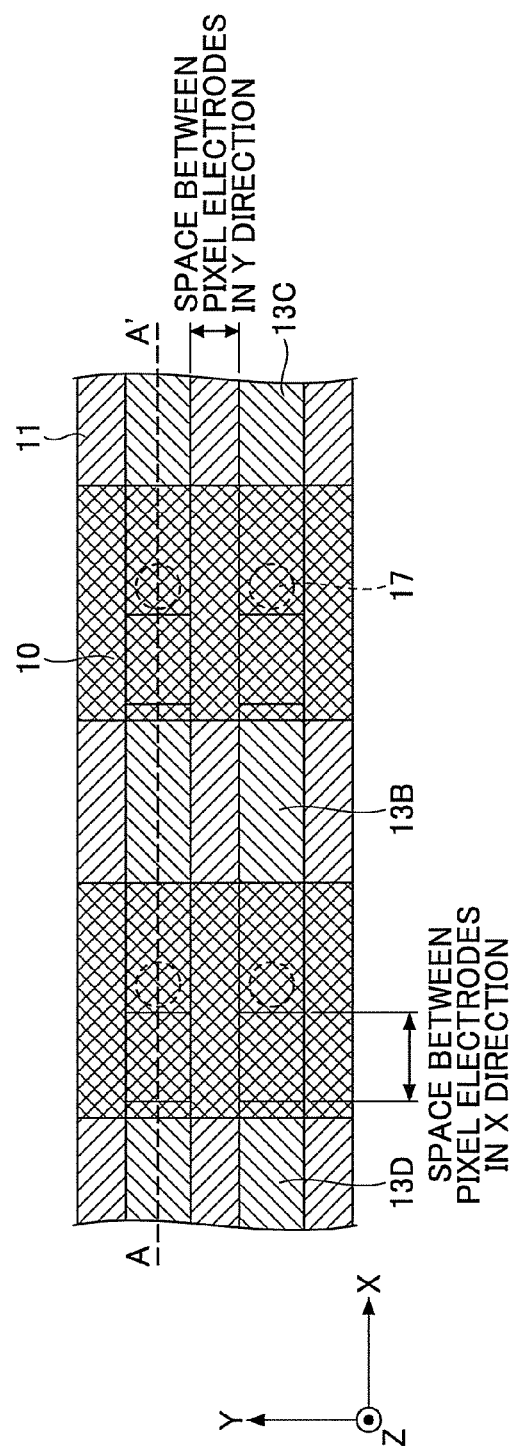
FIG. 26 is a plane view of an example of a display device according to the eleventh embodiment of the present invention.

An example of a display device of an eleventh embodiment of the present invention is shown in FIGS. 25 and 26. FIG. 25 is a cross-sectional diagram illustrating an example of a display device 1, while FIG. 26 is a plan view illustrating an example of a display device 1 with an organic light-emitting layer 14 and an opposing electrode 15 omitted. The cross-sectional diagram in FIG. 25 shows a cross section at A-A' in FIG. 26.

With reference to FIG. 25, a display device 1 according to the present embodiment is a display device which has thin-film transistors (below called TFTs) 8 arranged in a matrix shape on a substrate 2. The TFT 8 includes a gate electrode 3, a gate insulator 4, an active layer 5, a source electrode 6, and a drain electrode 7. The TFT 8 is covered with an interlayer insulator 9, on which is provided first partitions 10, shaped as a line in the Y directions which extend on the interlayer insulator 9.

Moreover, with reference to FIGS. 25 and 26, the TFT 8 is covered with the interlayer insulator 9, on which are arranged apertures 12 in a matrix shape, each of which apertures is formed by line-shaped first partitions 10 which extend in a Y direction and by line-shaped second partitions 11, arranged to be generally orthogonal to the first partitions 10, the second partitions extending in an X direction.

Moreover, with reference to FIG. 25, within the aperture 12 are arranged pixel electrodes 13 which are separated in the Y direction by the second partitions 11 which extends in the X direction. On the pixel electrodes 13, organic light-emitting layers 14, which are separated by the first partitions 10 and the second partitions 11 are arranged in a matrix shape. Moreover, on the organic light-emitting layers 14 is arranged a light-transmissive opposing electrode 15 as a common electrode. The organic EL device 16 includes the pixel electrode 13, an organic light-emitting layer 14, and an opposing electrode 15.

Moreover, the pixel electrode 13 of the organic EL device 16 is connected to the drain electrode 7 of the TFT 8 by an electro-conductive post 17 formed to penetrate through the interlayer insulator 9. When the TFT 8 is turned on by a potential applied on the gate electrode 3 of the TFT 8, electric current flows through the electro-conductive post 17 to the organic EL device 16, which emits light. The electro-conductive post 17 includes an electro-conductive material.

With reference to FIGS. 25 and 26, the electro-conductive post 17 is covered with a portion of a first partition 10 which extends in the Y direction.

As shown in FIG. 26, in the Y direction, the pixel electrodes 13 in the present embodiment are separated by a second partition 11, extending in the X direction. Thus, in the Y direction, a structure is taken such that an edge of the pixel electrode 13 is in contact with an edge of the second partition 11 or the edge of the pixel electrode 13 runs over the edge of the second partition 11. On the other hand, as shown in FIG. 25, the pixel electrode 13 in the X direction takes a structure such that it slips into the bottom of the line-shaped first partition 10.

When the structure of the present embodiment is adopted, the electro-conductive post 17, or a region corresponding to a contact hole connecting the TFT 8, which is covered with a first partition 10 extending in the Y direction, and which is separated from an aperture 12, and which contributes to light emission, so that a dent does not occur on the cathode which contributes to light emission, making it possible to form a highly flat cathode. Thus, the film thickness of the organic light-emitting layer 14 becomes uniform, making it possible to realize a display device and an organic EL device which has light emission uniform within the device and within the pixel area.

Moreover, in the Y direction, the pixel electrodes 13 are separated by the second partition 11 extending in the X direction, so that the space between the pixel electrodes 13 is not limited by a minimum resolution space of the inkjet machine used in printing the pixel electrodes 13, and is determined by the resolution of the second partition 11.

In other words, the second partition 11, which is formed using a photosensitive resin such as a photosensitive polyimide material, a photosensitive acrylic material, etc., has a minimum line width of not more than 5 um.

On the other hand, a minimum resolution space for an inkjet method when the second partition 11 is not used is 30-50 um; the structure of the present embodiment can be adopted to yield realization of fabrication which has several times finer design in the Y direction relative to a related-art, and decrease the space between pixel electrodes 13, so that the aperture rate is improved.

In the X direction, a pixel electrode 13B connected to the electro-conductive post 17 needs to be separated from the neighboring pixel electrodes 13C and 13D (see FIG. 26); here, it suffices to make the space between the pixel electrodes 13 to correspond to the minimum resolution space (30-50 um) of the inkjet machine used in printing the pixel electrodes 13.

In FIG. 25, while a selector line, a signal line, a power line, and a capacitance are omitted to simplify the figure, a 2-transistor, 1-capacitor structure which includes a switching device, a drive device, and a capacitance is required in the organic EL device 16. Moreover, in order to provide a circuit for compensating for a shift of a threshold voltage, a structure is more desirable which uses more TFTs 8 and capacitances.

Next, a method of manufacturing a display device according to the present embodiment is described according to FIGS. 27A through 27D. FIGS. 28A through 28D, and FIG. 29. FIGS. 27A through 27D, and FIG. 28D show a cross-sectional diagram, while FIGS. 28A through 28C show a plan view. FIG. 29 is a flowchart of the above mentioned method of manufacturing.

As shown in FIG. 27A, on a substrate 2 which is a glass substrate, for example, are formed in a matrix shape, TFTs 8 which have amorphous silicon (a-Si) as an active layer 5 (S401 in FIG. 29). First, Cr is deposited on a glass substrate by sputtering method, and a gate electrode 3 is formed by photolithography. Then, $SiO_2$ is deposited by a plasma CVD method to yield a gate insulator 4. Then a-Si is deposited by the CVD method, individualization is performed by a photolithography method to yield an active layer 5, and then Al—Si is deposited by sputtering method, a source electrode 6 and a drain electrode 7 are formed by the photolithography method, and the TFT 8 is completed which is arranged in a matrix shape having a density of 140 ppi. Moreover, as needed, the transistor characteristic may be improved by performing an annealing process after forming the transistor.

After the TFT 8 is formed, as shown in FIG. 27B, an electro-conductive post 17 is formed on the drain electrode by the inkjet method (S402 in FIG. 29). With the ink used for printing, which is a first electro-conductive ink such that nano Ag particles are dispersed in a solvent, a thick film which is suitable for the electro-conductive post 17 cannot be formed in one-time ejection, so that multiple ejections and dryings are repeated at the same location. Then, heating at 230 degrees Celsius for 60 minutes is performed with an oven, and the first electro-conductive ink is burned to complete the electro-conductive post 17. The electro-conductive post 17 is tapered, with a size of the bottom of the electro-conductive post 17 of 20-40 µm and a height of 2-10 µm.

Moreover, when the first electro-conductive ink is printed while heating an impact region with a $CO_2$ laser, etc., printing of the electro-conductive post 17 and drying of the first electro-conductive ink can be made simultaneously, making it possible to shorten the process. As the solvent used for the first electro-conductive ink, a polar organic solvent such as pure water, alcohol, glycol, glycol ether, and a non-polar organic solvent such as dodecane, tetradecane, etc., may be used; an appropriate selection thereof is made, taking account of a boiling point, etc., which affects drying rate and surface tension possible to eject with the inkjet method. Moreover, the solvent may be mixed for use. Moreover, while, in the present embodiment, ink in which nano Ag is dispersed is used, any known electro-conductive fine particles such as nano Au, nano Pd, etc., besides nano Ag may be used as electro-conductive fine particles to be dispersed in the solvent.

Figure 27C:
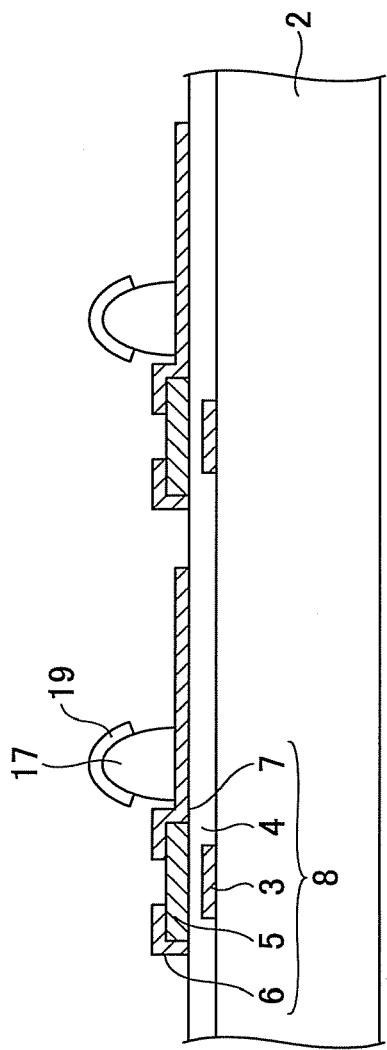
Figure 28A:
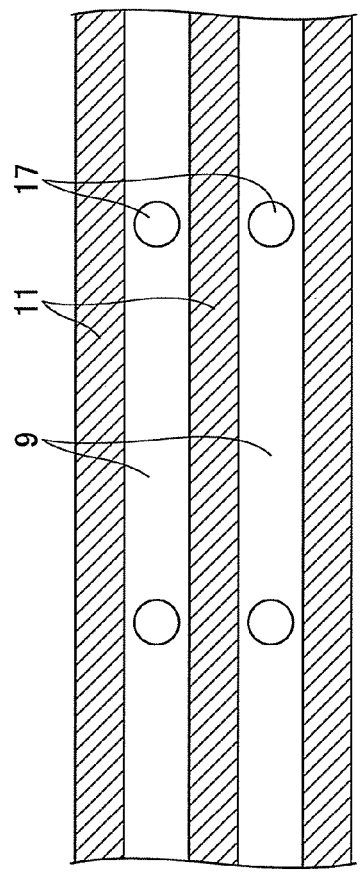
FIGS. 28A through 28D are second diagrams illustrating the example of the method of manufacturing the display device according to the eleventh embodiment of the present invention.
Figure 28B:
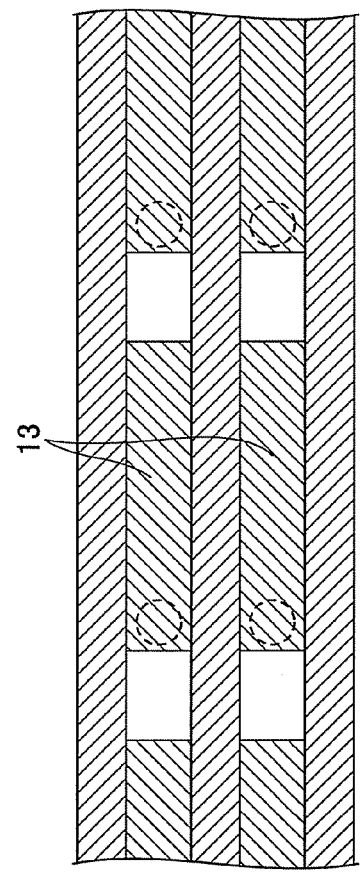
Figure 28C:
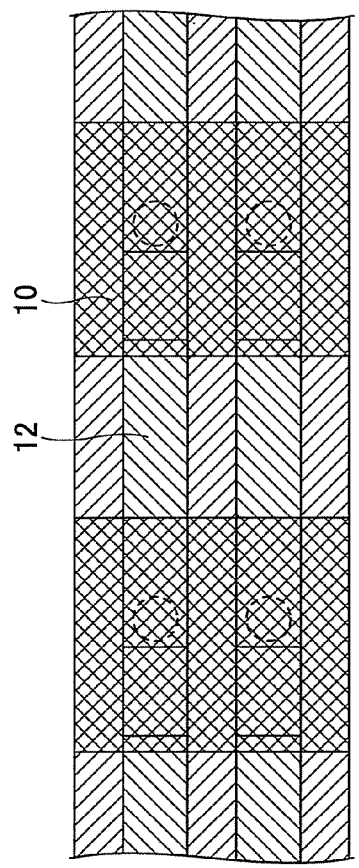

Next, as shown in FIG. 27C, after forming the electro-conductive post 17, a micro-contact print method is used to transfer a liquid-repellant material having a liquid-repellant property to a liquid material used in forming process of the interlayer insulator 9 in the following process, and a liquid-repellant film 19 is formed on the electro-conductive post 17 (S403 of FIG. 29). Detailing the micro-contact print method, a spin coat method is used to apply ink such that alkanethiol is dissolved in alcohol onto a stamp including polydimethylsiloxane which has the same shape of a convex pattern as that of the electro-conductive post 17. Then, the stamp is mounted on the micro-contact machine, an alignment mark of the stamp is aligned with the alignment mark of the electro-conductive post 17, and the stamp is pushed against a glass substrate to transfer a liquid-repellant material. The time of transfer is from 5 seconds to 30 minutes, and, transferred liquid-repellant material is dried to yield a liquid-repellant film 19.

According to the present embodiment, the stamp is in contact with only near the top of the head of the electro-conductive post 17, so that only the electro-conductive post 17 may be made liquid repellant selectively. When the angle of contact of the liquid-repellant film 19 with respect to pure water is set to 70-130 degrees or above, desirably 90-110 degrees, a satisfactory liquid-repellant property may be realized, and the electro-conductive post 17 is not buried in the interlayer insulator 9 in forming the interlayer insulator 9 in the following process.

Figure 27D:
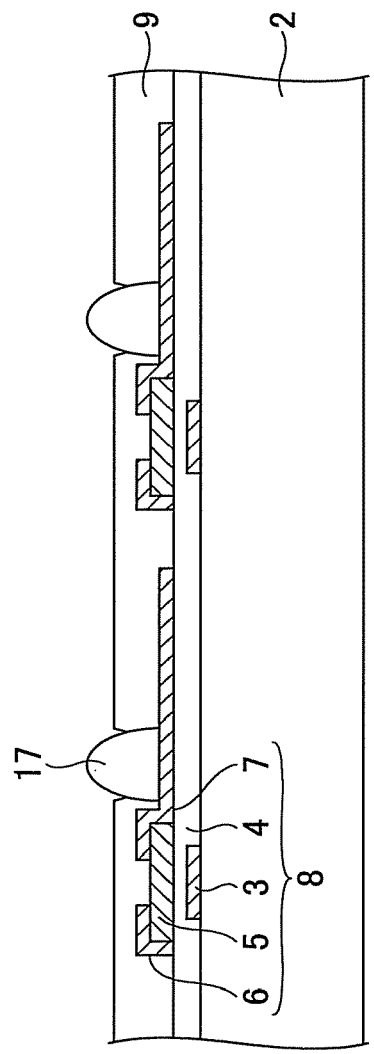

Next, as shown in FIG. 27D, after forming the water-repellant film 19, around the electro-conductive post 17 is applied insulating ink such that a polyimide precursor is dissolved in N-methylpyrrolidone, gamma-Butyrolactone, etc using inkjet method, and then curing at 200 degrees Celsius is performed for 30 minutes to form the interlayer insulator 9. Then, heating, UV ozone processing, $O_2$ plasma processing, etc., are performed to remove the liquid-repellant membrane 19 (S404 in FIG. 29).

As the liquid-repellant film 19 is formed at the top of the head of the electro-conductive post 17, the insulating ink is repelled, so that the electro-conductive post 17 protrudes from the surface of the interlayer insulator 9. Moreover, after removing the liquid-repellant film 19, even when a void occurs at an interface of the electro-conductive post 17 and the interlayer insulator 9, it occurs only at an upper portion of the interlayer insulator 9; the void is filled with the second electro-conductive ink easily in forming process of the pixel electrode 13 in the post-process, so that a contact hole structure having high long-term reliability may be realized.

As a high molecular resin used for insulating ink of the present embodiment, a common resin such as acrylic resin, epoxy resin, and phenolic resin, in addition to the polyimide precursor may be used, and, as a solvent, a polar organic solvent may be used, which can dissolve the high molecular resin.

Next, as shown in FIG. 28A, after the interlayer insulator 9 is formed, a water-repellant photosensitive resin is applied, exposure is performed using a photo mask which has a pattern of a second partition 11, development is performed using a tetramethyl ammonium solution, and thermal curing is performed to form second partitions 11 (S405 in FIG. 29). The second partition 11 is shaped as a line extending in the X direction; alignment of a photo mask having a pattern of the second partition 11 is performed such that the electro-conductive post 17 is arranged between the second partitions 11. The second partition 11 is arranged to have a width of 10-30 um and a film thickness of 1-3 um.

Then, a sample is UV ozone treated, and only the surface of the interlayer insulator 9 is hydrophilized, while maintaining the liquid-repellant property of the surface of the second partition 11. Taking account of printing of a pixel electrode 13 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or above, and desirably between 60 to 110 degrees.

As a water-repellant photosensitive resin, a photosensitive resin may be used which has a fluorine group introduced at the tail of photosensitive acrylic resin, photosensitive polyimide resin, photosensitive epoxy resin, etc., or which has introduced polysiloxane, polysilane, polysiloxane resin-network, etc.

Thereafter as shown in FIG. 28B, using an inkjet machine, a second electro-conductive ink in which nano Ag particles are dispersed in a polar solvent is printed between the second partitions 11 and burning thereof is performed at 200 degrees Celsius to form a pixel electrode 13 (S406 in FIG. 29). The pixel electrode 13 is arranged to cover the electro-conductive post 17, through which the pixel electrode 13 is arranged to be connected to the drain electrode 7 of the TFT 8. The film thickness of the pixel electrode 13 is arranged to be 50-200 nm.

In the Y direction, the surface of the second partition 11 is water repellant, so that the edge of the second electro-conductive ink stops at the second partition 11 and is separated in a self-aligning manner. In the present embodiment, the width of the second partition 11 is 10-30 um. On the other hand, there is no partition in the X direction, so that the space between the pixel electrodes 13 must be made larger than the minimum resolution space of the inkjet device. In the present embodiment, the space between the pixel electrodes 13 in the X direction is arranged to be 30-50 um.

The polar solvent used for the ink in the present embodiment includes alcohol, ethylene glycol, ethylene glycol ether, etc. Moreover, while in the present embodiment, ink in which nano Ag is dispersed in the polar solvent is used, any known electro-conductive fine particles such as nano Au, nano Pd, nano Cu, nano ITO, etc., besides nano Ag may be used as an electro-conductive fine particle to be dispersed in the polar solvent.

As shown in FIG. 28C, after the pixel electrode 13 is formed, a water-repellant photosensitive resin is applied again, exposure is performed using a photo mask which has a pattern of a first partition 10, development is performed using a tetramethyl ammonium solution, and thermal curing is performed to form first partitions 10 (S407 in FIG. 29). The first partition 10 is shaped as a line extending in the Y direction, alignment is performed of a photo mask having a pattern of a first partition 10 such that the electro-conductive posts 17 are covered. The first partition 10 is arranged to have a width of 40-60 um and a film thickness of 1-3 um.

Then, a sample is again UV ozone processed to hydrophilize the surface of the pixel electrode 13, while maintaining the liquid repellant property of the surface of the first partitions 10 and the second partitions 11. Taking account of printing of an organic light-emitting layer 14 by the inkjet method in the following process, the hydrophilicity of the pixel electrode 13 is preferably such that an angle of contact with respect to pure water is not more than 30 degrees, and desirably not more than 20 degrees, and the liquid repellant property of the first partition 10 and the second partition 11 is preferably such that an angle of contact with respect to pure water is between 50 to 130 degrees or more, and desirably between 60 to 110 degrees.

As a water-repellant photosensitive resin, as in a manner similar to the second partition 11, a photosensitive resin may be used which has a fluorine group introduced at the tail of photosensitive acrylic resin, photosensitive polyimide resin, photosensitive epoxy resin, etc., or which has introduced polysiloxane, polysilane, polysiloxane resin-network, etc.

Figure 28D:
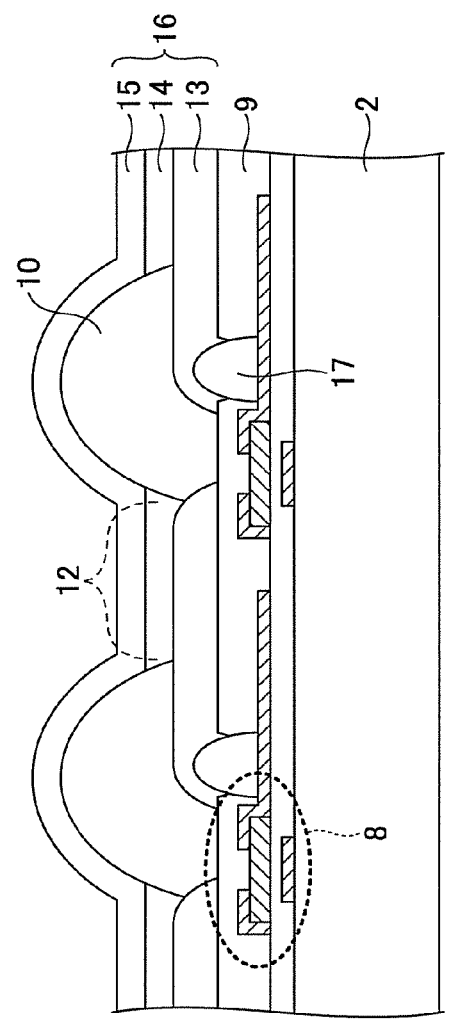
Figure 29:
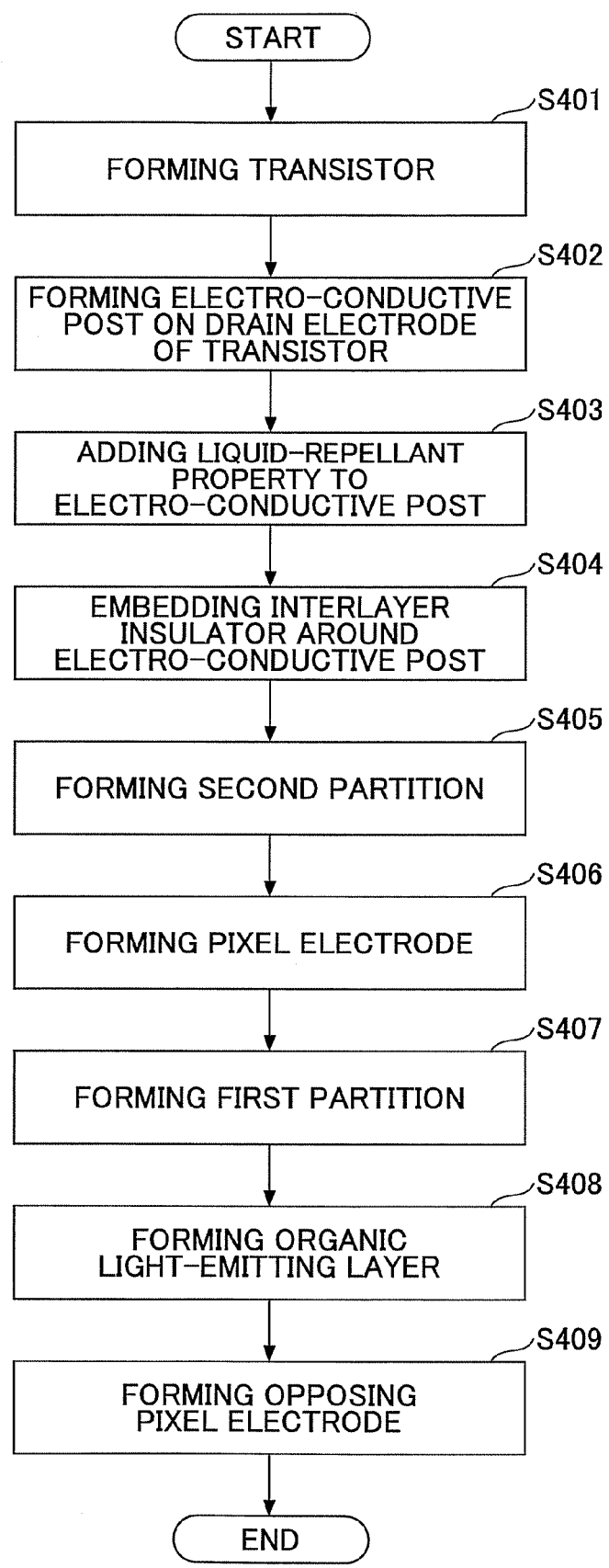
FIG. 29 is a flowchart illustrating the example of the method of manufacturing the display device of the eleventh embodiment of the present invention.

Next, as shown in FIG. 28D, after a first partition 10 is formed, an organic light-emitting layer 14 is formed using an inkjet machine within an aperture 12 surrounded by the first partition 10 and the second partition 11 (S408 of FIG. 29). The organic light-emitting layer 14 is formed such that each of three types that emit light of R, G, and B, are separately applied for each column in the Y direction. For the organic light-emitting layer 14, a common high molecular light-emitting material may be used; for example, polythiophenes, polyparaphenylenes, polyparaphenylene vinylenes, polyfluorenes, and iridium complexes may be dissolved in the polar solvent to yield ink, and the organic light-emitting layer may be formed by printing, drying, and thermal curing using the ink jet device.

In the present embodiment, with the UV ozone process shown in FIG. 28C, the surface of the first partition 10 and the second partition 11 is made liquid-repellant, the surface of the pixel electrode 13 is made hydrophilic, and the edge of the high molecular organic light-emitting material which is dissolved by the polar solvent stops at the edge of the partition. Thus, even when there is head curvature, head meandering, or ejection variations in the inkjet machine, a highly molecular organic light-emitting material may be printed within the aperture 12. The film thickness of the organic light-emitting layer 14 is arranged to vary between 50 and 150 nm, taking into account the light-emitting efficiency of R, G, and B.

Then, using sputtering method, on the whole face of the partitions and the organic light-emitting layer 14 are deposited, as an opposing electrode 15, a transparent electro-conductive film including $In_2O_3.SnO_2$ (S409 in FIG. 29). The opposing electrode 15 is a common electrode, so that it is patterned using a shadow mask in sputtering process. The film thickness of the opposing electrode 15 is arranged to be 50-200 nm. For increasing the efficiency of carrier injection, it is more desirable to form an electron injecting layer between the pixel electrode 13 and the organic light-emitting layer 14, and a hole injecting layer between the organic light-emitting layer 14 and the opposing electrode 15. Thus, an organic EL device 16 including the pixel electrode 13, the organic light-emitting layer 14, and the opposing electrode 15 is completed.

For the electron injecting layer, known materials such as a cyclopentadien derivative, an oxadiazole derivative, a bistyrylbenzene derivative, etc. may be used, while, for the hole injecting layer, PEDOT/PSS, etc., may be used. The electron injecting layer and the hole injecting layer may also be formed by printing, by an inkjet machine, a solution which is made into ink by dissolving in the polar solvent, and then perform drying thereof.

Finally, a display device 1, which layers the organic EL device 16 on the TFT 8 is completed by applying light-curing epoxy resin to an outer periphery portion of a sample, and adhering cap glass for sealing (not shown).

The display device manufactured with the present embodiment makes it possible to realize an expansion of a light-emitting region relative to a related-art display device which forms, in one-time exposure and development, a partition having the aperture 12 because of a high aperture rate due to the width of the pixel electrode 13 being large in the Y direction.

Moreover, when the display device manufactured according to the present embodiment is observed by the OBIRCH (Optical Beam Induced Resistance Change), a void is not observed around the electro-conductive post 17, and a highly reliable contact hole structure may be realized.

Furthermore, when the display device manufactured with the present embodiment is provided with a flexible tape on which a driving IC is mounted using an anisotropic electro-conductive film, and an image evaluation test is performed, uneven light emission due to the electro-conductive post 17 (contact hole) is not observed at all, so that light emission which is uniform within the face display area is confirmed for R, G, and B.

While in the present embodiment, for printing the liquid-repellant film 19, a micro-contact print method is used which uses a stamp having the same convex pattern as the electro-conductive post 17, it suffices to apply liquid-repellant material only to the top of the head of the electro-conductive post 17, so that the liquid-repellant material may be uniformly applied to a flat stamp, and only the tip of the electro-conductive post 17 may be placed in contact with the stamp to transfer the liquid-repellant material. In this case, a parallel alignment of the stamp and the substrate and the flatness of the stamp need to be arranged more precisely.

Moreover, for printing the liquid-repellant film 19, a flexo printing method and a gravure offset printing method may also be used. In the above-described method, it is preferable that a silicone rubber plate and a flexo plate are flat, and only the tip of the electro-conductive post 17 is placed in contact with a plate on which the liquid-repellant material is applied uniformly. Alternatively, using a photolithography method, a non-liquid-repellant region may be covered with a resist, and a whole surface treatment may be performed with an alkanethiol solution, and then a resist may be removed.

Moreover, while alkanethiol is used for the liquid-repellant material in the present embodiment, it is desirable to appropriately select a liquid-repellant material depending on an electro-conductive material which makes up the electro-conductive post 17; for example, silane coupling material such as alkyl trichlorosilane, alkyl trimethoxysilane, alkyl triethoxysilane, etc., alkylphosphate, alkylcarboxylic acid, etc., can be used.

Furthermore, while, in the present embodiment, the first partition 10 and the second partition 11 are formed by the photolithography method using a water-repellant photosensitive resin, at least one of the partitions may be formed using a printing method such as nozzle print method, micro-contact print method, inkjet method which uses ink containing water-repellant high molecular resin, etc., depending on the line width and shape of the first partition 10 and the second partition 11, or at least one of the partitions may be formed using a printing method such as the nozzle print method, the micro-contact print method, the inkjet method using ink containing high molecular resin, etc., and then made liquid-repellant by $CF_4$ plasma processing, etc.

Moreover, while, in the present embodiment, the pixel electrode 13 is covered with the electro-conductive post 17, it suffices that the electro-conductive post 17 and the pixel electrode 13 are connected, and the electro-conductive post 17 may penetrate the pixel electrode 13.

Eleventh Embodiment

Variation 1

In variation 1 of the eleventh embodiment, an example is shown of using a room temperature cured glass as an interlayer insulator 9 in a display device of a structure similar to that of the display device 1 shown in FIGS. 25 and 26. Below explanations are made with reference to FIG. 29, FIGS. 30A-30D, and FIGS. 31A-31D.

Figure 30A:
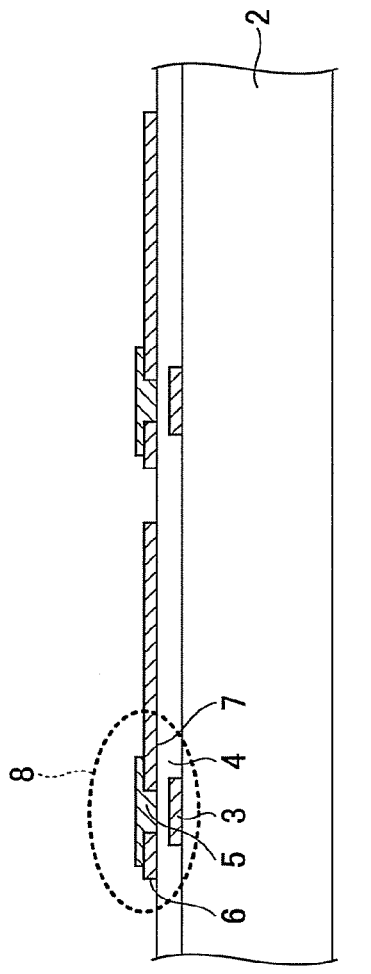

As shown in FIG. 30A, on a substrate 2, which is a polyimide substrate and on the surface of which is formed a silicon oxide, is formed in a matrix shape, a TFT 8 which has an organic semiconductor as an active layer 5 (S401 in FIG. 29). First, by the inkjet method, a gate electrode is drawn on a substrate 2 using nano Ag ink, an oven is used to conduct burning at 200 degrees Celsius, completing a gate electrode 3. Then, by a spin coat method, a polyimide precursor is applied on the gate electrode 3, an oven is used to conduct a heating process (imidization), yielding the gate insulator 4. Then, a photo mask is placed on the polyimide film, and an ultraviolet light is irradiated only on the region on which the source electrode 6 and the drain electrode 7 are formed to perform surface modification of the polyimide.

Figure 30B:
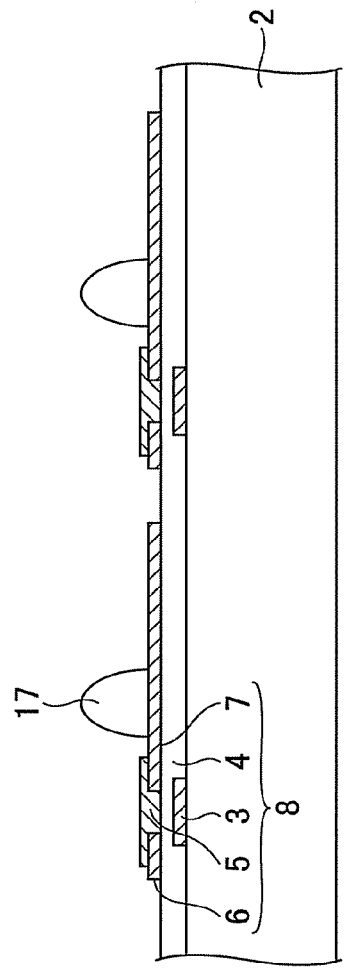

Then, using the inkjet method, nano Ag ink is ejected on the modified polyimide surface, and, further, an oven is used to perform burning at 200 degrees Celsius, completing the source electrode 6 and the drain electrode 7. Then, using the inkjet method, a solution which includes an organic semiconductor material is ejected to the channel region, drying is conducted at 180 degrees Celsius, completing an organic TFT 8 arranged in a matrix having a density of 140 ppi. The organic semiconductor material is chips-pentacene, which is dissolved in dichloromethane, etc., to yield ink. Then, as shown in FIG. 30B, using a method similar to the eleventh embodiment, an electro-conductive post 17 is formed on the drain electrode 7 (S402 in FIG. 29), and, further, as shown in FIG. 30C, a liquid-repellant film 19 is formed on the electro-conductive 17 (S403 in FIG. 29).

Next, as shown in FIG. 30D, after forming the liquid-repellant film 19, using a dispenser method, a liquid material which forms a room temperature cured glass is applied around the electro-conductive post 17, and drying is conducted at 100 degrees Celsius for one hour, and then it is left at room temperature for 7 days to completely cure the room temperature cured glass. Then, heating, UV ozone processing, or $O_2$ plasma processing, etc., are performed to remove the liquid-repellant film 19 (S404 in FIG. 29). Also in the present embodiment, the liquid-repellant film 19 is formed at the top of the head of the electro-conductive post 17, the electro-conductive post 17 is shaped such that it protrudes from the surface of the interlayer insulator 9, and a contact hole structure with a high long-term reliability that has no void may be realized.

The liquid material forming the room temperature cured glass that is used for variation 1 of the eleventh embodiment is a solution, which is mixed a main reagent, a catalyst, the main reagent including modified silicone, tetraethoxysilane, and a mixed solvent such as IPA, methanol, and the catalyst including organotin catalyst, methanol, etc.; when applied to a substrate material, a series of dehydration polycondensation reactions occur at room temperature to form an amorphous silica glass on the substrate material, leading to obtaining an insulator having physical properties comparable to those of glass. Using the present material makes it possible to obtain an interlayer insulator 9 which is highly heat resistant and solvent resistant without degrading the TFT properties at low temperature even when an organic semiconductor material with a relatively low heatproof temperature is used.

Next, as shown in FIG. 31A, after the interlayer insulator 9 is formed, a photosensitive resin is applied, exposure is performed using a photo mask which has a pattern of a second partition 11, development is performed using a tetramethyl ammonium solution, and thermal curing is performed to form a second partition 11; $O_2$ plasma process, and a $CF_4$ plasma process are performed to hydrophilize the surface of the interlayer insulator 9, and to make the surface of the second partition 11 water-repellant (S405 in FIG. 29). In the present embodiment, the interlayer insulator 9 includes a room temperature cured glass, so that the interlayer insulator 9 can maintain the hydrophilicity even when exposed to the $CF_4$ plasma process; thus, the CF4 plasma process may be adopted.

The second partition 11 is shaped as a line extending in the X direction; alignment of a photo mask having a pattern of the second partition 11 is performed such that the electro-conductive post 17 is arranged between the second partitions 11. The second partition 11 is arranged to have a width of 10-30 um and a film thickness of 1-3 um.

Taking account of printing of a pixel electrode 13 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or above, and desirably between 60 to 110 degrees. The photosensitive material which may be used in the variation 1 of the eleventh embodiment includes photosensitive acrylic resin, photosensitive polyimide resin, photosensitive epoxy resin, etc.

Thereafter as shown in FIG. 31B, using an inkjet machine, a second electro-conductive ink in which nano Ag particles are dispersed in a polar solvent is printed between the second partitions 11 and burning thereof is conducted at 150 degrees Celsius to form a pixel electrode 13 (S406 in FIG. 29). The pixel electrode 13 is arranged to cover the electro-conductive post 17, through which the pixel electrode 13 is connected to the drain electrode 7 of the TFT 8. The film thickness of the pixel electrode 13 is arranged to be 50-200 nm.

In the Y direction, the surface of the second partition 11 is water repellant, so that the edge of the second electro-conductive ink stops at the second partition 11 and is separated in a self-aligning manner. In the present embodiment, the width of the second partition 11 is 10-30 um. On the other hand, there is no partition in the X direction, so that the space between the pixel electrodes 13 in the X direction is arranged to be 30-50 um.

Figure 31C:
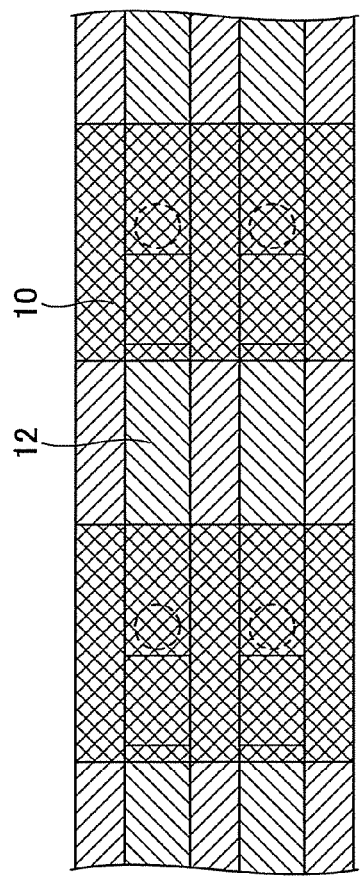

Next, as shown in FIG. 31C, after the pixel electrode 13 is formed, a photosensitive resin is re-applied, exposure is performed using a photo mask which has a pattern of a first partition 10, development is performed using a tetramethyl ammonium solution, and thermal curing is performed to form the first partition 10; and then the $O_2$ plasma process, and the $CF_4$ plasma process are performed to make the first partition 10 and the second partition 11 water-repellant and hydrophilize the pixel electrode 13 (S407 in FIG. 29).

The first partition 10 is shaped as a line extending in the Y direction, alignment is performed of a photo mask having a pattern of a first partition 10 such that the electro-conductive post 17 is covered. The first partition 10 is arranged to have a width of 40-60 um and a film thickness of 1-3 um. Taking account of printing of an organic light-emitting layer 14 by the inkjet method in the following process, the hydrophilicity of the pixel electrode 13 is preferably such that an angle of contact with respect to pure water is not more than 30 degrees, and desirably not more than 20 degrees, and the liquid repellant property of the first partition 10 and the second partition 11 is preferably such that an angle of contact with respect to pure water is between 50 to 130 degrees or above, and desirably between 60 to 110 degrees. As the photosensitive resin, photosensitive acrylic resin, photosensitive polyimide resin, photosensitive epoxy resin, etc., may be used.

Figure 31D:
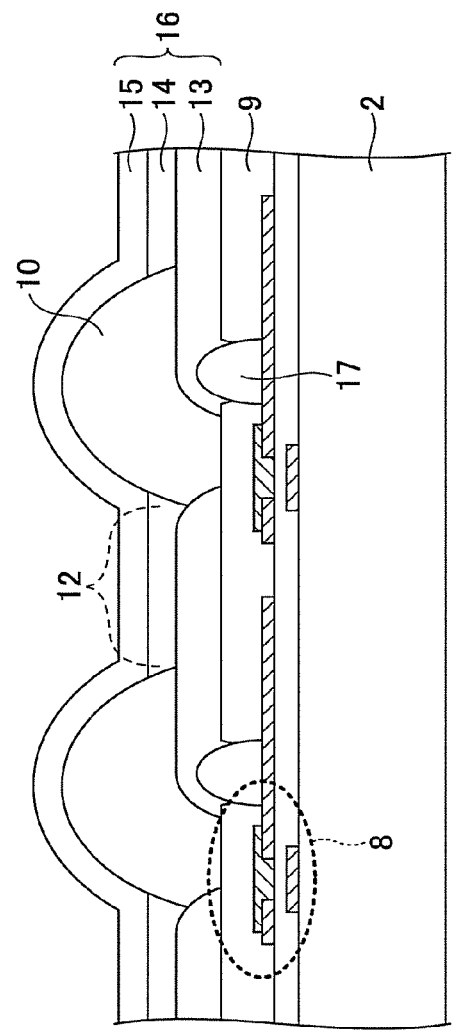

Then, as shown in FIG. 31D, as in the eleventh embodiment, using the inkjet machine, an organic light-emitting layer 14 is formed within an aperture 12 surrounded by the first partitions 10 and the second partitions 11 (S408 in FIG. 29); then, using sputtering method, a transparent electro-conductive film, including $In_2O_3.SnO_2$, is deposited on the whole surface of the partitions and the organic light-emitting layer 14 as an opposing electrode 15, and finally an optically cured epoxy resin is applied on the outer periphery of the sample to adhere the cap glass for sealing, completing a display device 1 having layered an organic EL device 16 on the TFT 8 (not shown).

For increasing the efficiency of carrier injection, it is more desirable to form an electron injecting layer between the pixel electrode 13 and the organic light-emitting layer 14, and a hole injecting layer between the organic light-emitting layer 14 and the opposing electrode 15.

The display device which is manufactured with the variation 1 of the eleventh embodiment also has an aperture rate which is as high as the display device manufactured with the eleventh embodiment, and is arranged to have a structure such that there is no void around the electro-conductive post 17. Moreover, when the display device manufactured with the variation 1 of the eleventh embodiment is provided with a flexible tape on which a driving IC is mounted using an anisotropic electro-conductive film, and an image evaluation test is performed, uneven light emission due to the electro-conductive post 17 is not observed at all as in the display device manufactured with the eleventh embodiment, so that light emission which is uniform within display area is seen for R, G, and B.

While, in the variation 1 of the eleventh embodiment, the first partition 10 and the second partition 11 are formed with the photosensitive resin and are made water-repellant by the $CF_4$ plasma process, as in the eleventh embodiment, a water-repellant photosensitive resin may be used which introduces a fluoride group at the tail of photosensitive acrylic resin, photosensitive polyimide resin, photosensitive epoxy resin, etc., or which introduces polysiloxane, polysilane, polysiloxane resin-network, etc., to form the first partition and the second partition 11, and then perform the UV process.

Eleventh Embodiment

Variation 2

In variation 2 of the eleventh embodiment, an example is shown of using a high molecular resin as an interlayer insulator 9 for the display device 1 shown in FIGS. 25 and 26. As the method of manufacturing is different from that of the eleventh embodiment, explanations are provided below using FIGS. 32A and 32B in addition to FIGS. 27 through 29.

First, as shown in FIG. 27A, using a method similar to the eleventh embodiment, on the substrate 2 as a glass substrate are formed TFTs 8 which have amorphous silicon (a-Si) as an active layer 5 and which are arranged in a matrix shape with a density of 140 ppi (S401 in FIG. 29). Then, as shown in FIG. 27B, an electro-conductive post 17 is formed on the drain electrode 7 (S402 in FIG. 29).

Figure 32A:
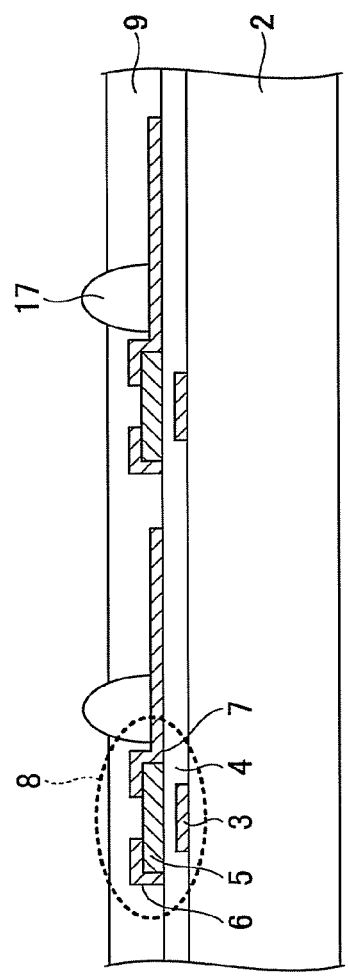
FIGS. 32A through 32B are diagrams illustrating an example of a method of manufacturing the display device according to a second variation of the eleventh embodiment of the present invention.

Next, as shown in FIG. 32A, after the electro-conductive post 17 is formed, using a dispenser method, a non-solvent high molecular resin liquid material which forms the interlayer insulator 9 is applied around the electro-conductive post 17, and curing is performed at 180 degrees Celsius for 30 minutes to complete the interlayer insulator 9 (S404 in FIG. 29). If a high molecular liquid material which is diluted in solvent is used, it is necessary to increase the thickness of film to be applied in order to get the thickness necessary for the interlayer insulator 9. While dependent also on the content of the high molecular resin, it must be applied thicker than the height of the electro-conductive post 17, so the probability that the electro-conductive post 17 is buried in the interlayer insulator 9 increase.

In the variation 2 of the eleventh embodiment, the high molecular liquid material is a non-solvent, so that the thickness to be applied becomes almost the same as the thickness of the interlayer insulator 9. Thus, a required thickness of the interlayer insulator 9 may be realized with a relatively small amount of applying, making it possible to prevent the electro-conductive post 17 from being buried in the interlayer insulator 9.

In the variation 2 of the eleventh embodiment, the process of S403 in FIG. 29 is not carried out. In other words, the liquid-repellant film 19 is not formed on the electro-conductive post 17. As the liquid-repellant film 19 is not formed on the electro-conductive post 17, there is no need for removing the liquid-repellant film, so that a void does not occur between the interlayer insulator 9 and the electro-conductive post 17.

For the non-solvent high molecular resin liquid material which forms the interlayer insulator 9 of the variation 2 of the eleventh embodiment, a common high molecular resin such as acrylic resin, epoxy resin, etc. may be used. While a thermal curing type is used for the variation 2 of the eleventh embodiment, UV cured resin may be used.

Next, as shown in FIG. 28A, after the interlayer insulator 9 is formed, a water-repellant photosensitive resin is applied, exposure is performed using a photo mask which has a pattern of a second partition 11, development is performed using a tetramethyl ammonium solution, and thermal curing is performed to form second partitions 11 (S405 in FIG. 29). The second partition 11 is shaped as a line extending in the X direction; alignment of a photo mask having a pattern of the second partition 11 is performed such that the electro-conductive post 17 is arranged between the second partitions 11. The second partition 11 is arranged to have a width of 10-30 um and a film thickness of 1-3 um.

Then, a sample is UV ozone treated, and only the surface of the interlayer insulator 9 is hydrophilized, while maintaining the liquid-repellant property of the surface of the second partition 11. Taking account of printing of a pixel electrode 13 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or above, and desirably between 60 to 110 degrees. As the water-repellant resin, water-repellant photosensitive acrylic resin, water-repellant photosensitive polyimide resin, and water-repellant photosensitive epoxy resin may be used.

Thereafter as shown in FIG. 28B, using an inkjet machine, a second electro-conductive ink in which nano Ag particles are dispersed in a polar solvent is printed between the second partitions 11 and burning thereof is conducted at 180 degrees Celsius to form a pixel electrode 13 (S406 in FIG. 29). The pixel electrode 13 is arranged to cover the electro-conductive post 17, through which the pixel electrode 13 is connected to the drain electrode 7 of the TFT 8. The film thickness of the pixel electrode 13 is arranged to be 50-200 nm.

In the Y direction, the surface of the second partition 11 is water repellant, so that the edge of the second electro-conductive ink stops at the second partition 11 and is separated in a self-aligning manner. In the present embodiment, the width of the second partition 11 is 10-30 um. On the other hand, there is no partition in the X direction, so that the space between the pixel electrodes 13 must be made larger than the minimum resolution space of the inkjet device. In the present embodiment, the space between the pixel electrodes 13 in the X direction is arranged to be 30-50 um.

As shown in FIG. 28C, after the pixel electrode 13 is formed, a water-repellant photosensitive resin is applied again, exposure is performed using a photo mask which has a pattern of a first partition 10, development is performed using a tetramethyl ammonium solution, and thermal curing is performed to form a first partition 10 (S407 in FIG. 29). The first partition 10 is shaped as a line extending in the Y direction, alignment is performed of a photo mask having a pattern of a first partition 10 such that the electro-conductive post 17 is covered. The first partition 10 is arranged to have a width of 40-60 um and a film thickness of 1-3 um.

Then, a sample is again UV ozone processed to hydrophilize the surface of the pixel electrode 13, while maintaining the liquid repellant property of the surface of the first partition 10 and the second partition 11. Taking account of printing of an organic light-emitting layer 14 by the inkjet method in the following process, the hydrophilicity of the pixel electrode 13 is preferably such that an angle of contact with respect to pure water is not more than 30 degrees, and desirably not more than 20 degrees, and the liquid repellant property of the first partition 10 and the second partition 11 is preferably such that an angle of contact with respect to pure water is between 50 to 130 degrees or above, and desirably between 60 to 110 degrees. As the water-repellant photosensitive resin, water-repellant photosensitive acrylic resin, water-repellant photosensitive polyimide resin, and water-repellant photosensitive epoxy resin may be used.

Figure 32B:
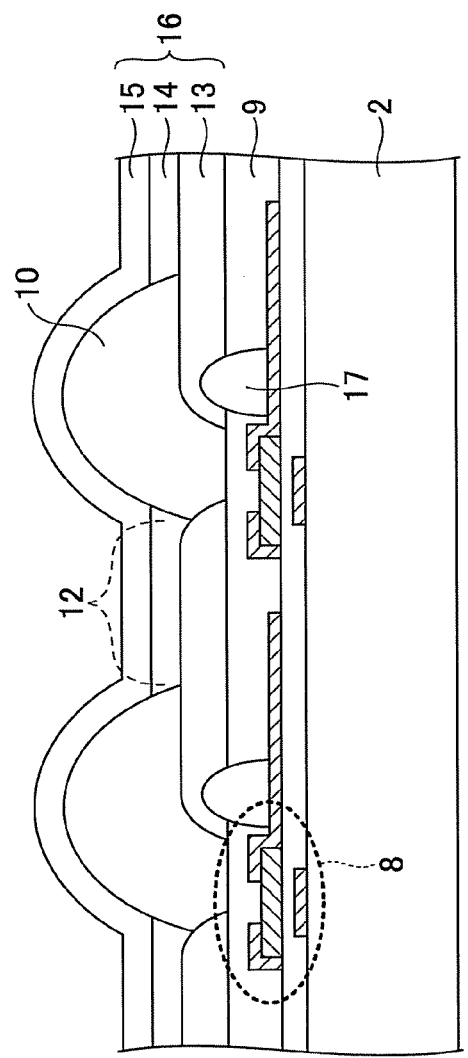

Then, as shown in FIG. 32B, as in the eleventh embodiment and the variation 1 thereof, using the inkjet machine, an organic light-emitting layer 14 is formed within an aperture 12 surrounded by the first partitions 10 and the second partitions 11 (S408 in FIG. 29); then, using sputtering method, a transparent electro-conductive film, including $In_2O_2 \cdot SnO_2$, is deposited on the whole surface of the first partitions and the second partitions 11, and the organic light-emitting layer 14 as an opposing electrode 15 (S409 in FIG. 29), and finally an optically cured epoxy resin is applied on the outer periphery of the sample to adhere the cap glass for sealing, completing a display device 1 (not shown) having layered an organic EL device 16 on the TFT 8.

For increasing the efficiency of carrier injection, as in the eleventh embodiment and the variation 1 thereof, it is more desirable to form an electron injecting layer between the pixel electrode 13 and the organic light-emitting layer 14, and a hole injecting layer between the organic light-emitting layer 14 and the opposing electrode 15.

The display device which is manufactured with the variation 2 of the eleventh embodiment also has an aperture rate which is as high as the display device manufactured with the eleventh embodiment and the variation 1 thereof, and is arranged to have a structure such that there is no void around the electro-conductive post 17. Moreover, when the display device manufactured with the variation 2 of the eleventh embodiment is provided with a flexible tape on which a driving IC is mounted using an anisotropic electro-conductive film, and an image evaluation test is performed, uneven light emission due to the electro-conductive post 17 is not observed at all as in the display device manufactured with the eleventh embodiment and the variation 1 thereof, so that light emission which is uniform within the display area is seen for R, G, and B.

Twelfth Embodiment

Next, the twelfth embodiment of the present invention is described.

An example of the structure of the display device of the present embodiment is shown in FIGS. 33A-33D.

Figure 33A:
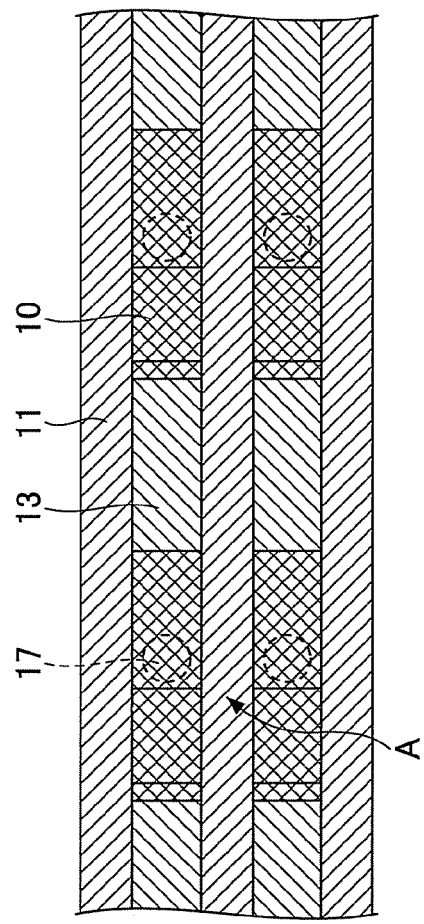
FIGS. 33A through 33D are diagrams illustrating an exemplary structure of a first partition and a second partition in a display device of a twelfth embodiment of the present invention.

The structure shown in FIG. 33A is arranged to be a structure such that the second partition 11 extends in the X direction in a line shape, the first partition 10 is arranged in the Y direction in a dot shape, and the first partition 10 is arranged between the second partitions 11. In other words, a second partition 11 is arranged on a straight line intersecting with the first partition 10. When the present structure is adopted, the first partition 10 is not formed on the second partition 11, so that the film thickness of the intersecting portion (shown as A) of the partitions may be made thinner relative to the structure of the eleventh embodiment such that the second partition 11 and the first partition 10 having a line shape intersect; thus, the film thickness variation as the whole of the partitions becomes small. As a result, a disconnection of opposing electrodes due to the partitions may be reduced. Moreover, the film thicknesses of the first partition 10 and the second partition may be made almost the same to further reduce the disconnection of the opposing electrodes.

Figure 33B:
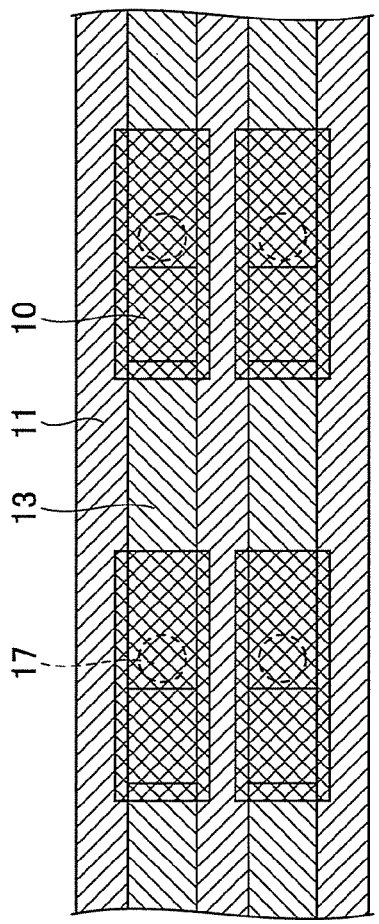

The structure shown in FIG. 33B is arranged to be a structure such that the second partition 11 extends in the X direction in a line shape, the first partition 10 is arranged in the Y direction in a dot shape, the first partition 10 is arranged between the second partitions 11, and, moreover, the first partition 10 has an overlap with the second partition 11. If the present structure is adopted, even when an alignment error occurs in an exposure process of the first partition 10 and the second partition 11, as the first partition 10 has the overlap with the second partition 11, the first partition 10 partially runs onto the second partition 11, so that a desired aperture 12 may be formed, in addition to the effect of FIG. 33A.

In order to expect the effects as described above, it is preferable to arrange the overlap between the first partition 10 and the second partition 11 to be larger than the alignment error in the exposure process taking account of a design rule.

Figure 33C:
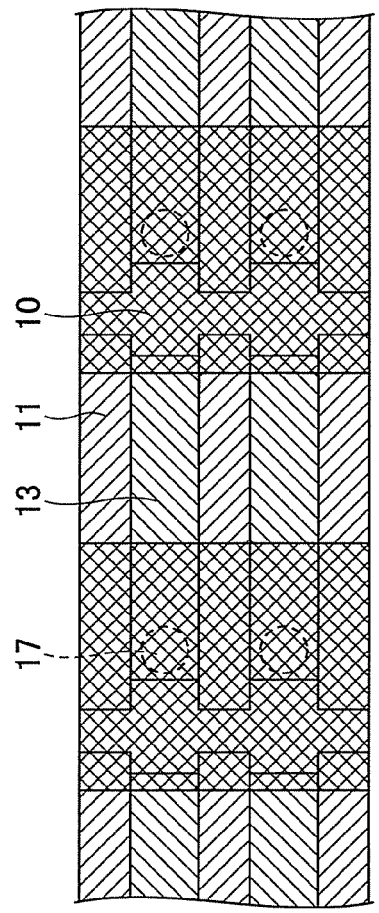

The structure shown in FIG. 33C is arranged to be a structure such that the first partition 10 extends in the Y direction in a line shape, the second partition 11 is arranged in the X direction in a dot shape, the first partition 10 is arranged between the second partitions 11, and, moreover, the first partition 10 has an overlap with the second partition 11.

Even when the present structure is adopted, the effect of FIG. 33B may be achieved. In the present structure, in order to separate the Y direction of the pixel electrode 13 with the second partition 11 in a self-aligning manner, it is necessary to arrange the length of the second partition 11 in the X direction to be greater than the length of the pixel electrode 13 in the X direction.

Figure 33D:
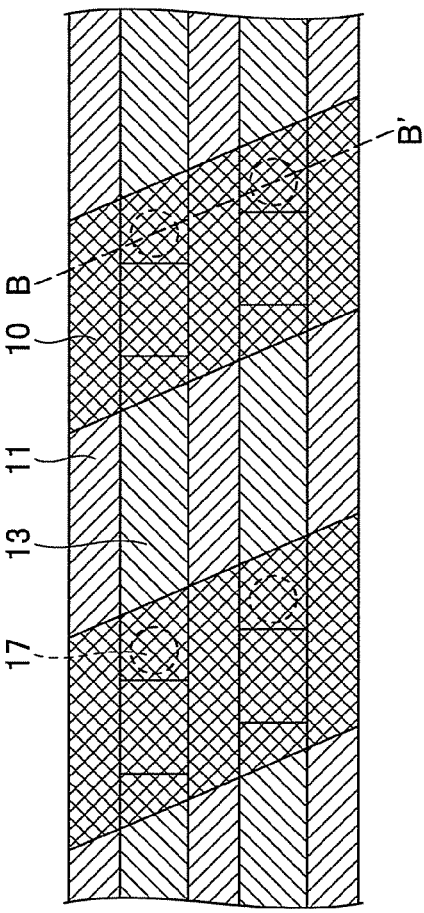

The structure shown in FIG. 33D is arranged to be a structure such that a second partition 11 shaped as a line in the X direction, and a first partition 10 shaped as a line extending in a direction (shown as B-B' direction) which is slanted with respect to the Y axis, and apertures 12 formed by the second partitions 11 and the first partitions 10 are arranged in a matrix shape.

When the structure of the present embodiment is adopted, the first partitions 10 intersect in a slanted manner with respect to the second partitions 11 extending in the X direction, so that the apertures 12 arranged in a matrix are lined up such that, in the Y direction, an X position coordinate is shifted. Therefore, in the Y direction, the pixel electrode 13 and the organic light-emitting layer 14 are also lined up such that an X position coordinate is shifted, making it possible to realize a display device having a parallelogram-shaped display region when the presently-structured display device is arranged in two dimensions.

The present embodiment is not limited to the above structure, so that cases are also included such that one partition of the first partition 10 and the second partition 11 is line shaped, while the other is dot shaped, and one partition of the first partition 10 and the second partition is slanted with respect to the X direction or the Y direction.

Thirteenth Embodiment

Next, the thirteenth embodiment of the present invention is described.

Figure 34:
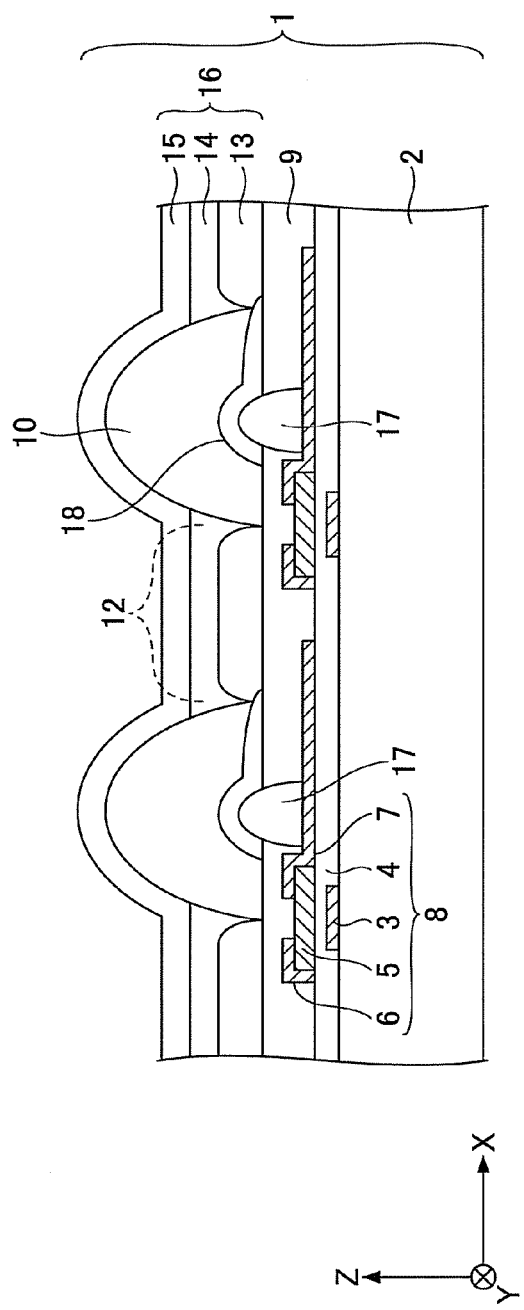
FIG. 34 is a cross-sectional diagram of an example of a display device of a thirteenth embodiment of the present invention.
Figure 35:
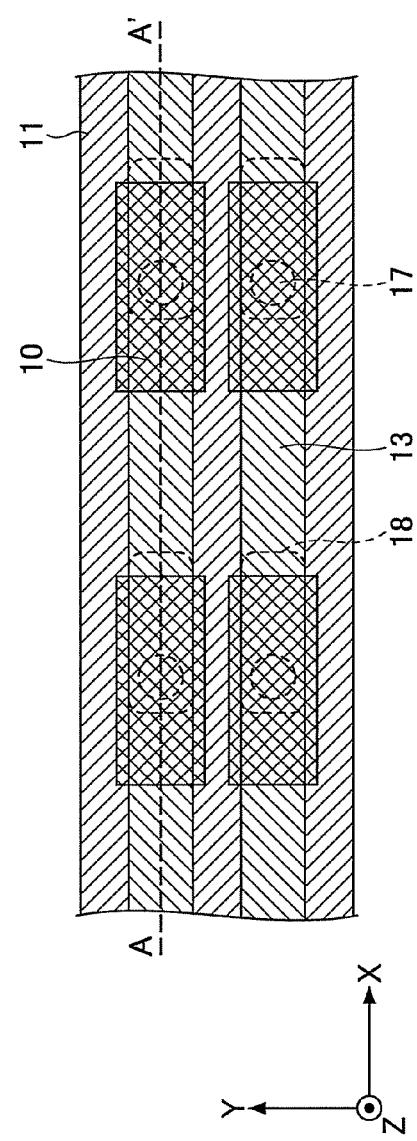
FIG. 35 is a plan view of the example of the display device according to the thirteenth embodiment of the present invention.

An example of the structure of the display device of the present embodiment is shown in FIGS. 34 and 35. FIG. 34 is a cross-sectional drawing of the display device, while FIG. 35 is a plan view of the display device with the organic light-emitting layer 14 and the opposing electrode 15 omitted. FIG. 34 is a cross sectional view cut along A-A' of FIG. 35.

With reference to FIG. 34, the display device 1 of the present embodiment has arranged on a substrate 2 in a matrix shape thin-film transistors (TFT) 8, each of which includes a gate electrode 3, a gate insulator 4, an active layer 5, a source electrode 6, and a drain electrode 7.

Moreover, with reference to FIGS. 34 and 35, the TFT 8 is covered with the interlayer insulator 9, on which are arranged apertures 12 in a matrix shape, each of which apertures is formed by line-shaped second partitions 11 which extend in an X direction and by first partitions 10, arranged in a dot shape such that they are orthogonal to the second partitions 11; the first partition 10 arranged between the second partitions 11. The first partition 10 has an overlap with the second partition 11.

Moreover, with reference to FIG. 34, the organic EL device 16 is arranged such that in a matrix shape are arranged pixel electrodes 13 which, in the aperture 12, are separated by the second partitions 11 extending in the X direction and which are separated by the first partitions 10 in the X direction, on which pixel electrodes 13 are arranged, in a matrix shape, organic light-emitting layers 14 separated by the first partitions 10 and the second partitions 11, and, on which organic light-emitting layers 14 are further arranged light-transmissive opposing electrodes 15 as common electrodes.

Moreover, the electro-conductive post 17 is formed such that it penetrates through the interlayer insulator 9, on which electro-conductive post 17 is provided an auxiliary electrode 18. The electro-conductive post 17 includes an electro-conductive material. Moreover, the auxiliary electrode 18 is structured such that a portion thereof protrudes into an aperture 12 which is formed by the first partitions 10 and the second partitions 11 to be connected with the pixel electrode 13, which pixel electrode 13 is connected to the drain electrode 7 of the respective TFT 8 through the auxiliary electrode 18.

Moreover, with reference to FIGS. 34 and 35, the electro-conductive post 17 is covered with a portion of a dot-shaped first partition 10 which extends in the Y direction.

In the structure of the present embodiment, in the Y direction, the pixel electrode 13 is separated by the second partitions 11 which extend in the X direction. Thus, in the Y direction, a structure is taken such that an edge of the pixel electrode 13 is in contact with the second partition 11 (see FIG. 35), or the edge of the pixel electrode 13 runs over the edge of the second partition 11 (not shown).

Moreover, the pixel electrode 13 in the X direction is separated by the dotted-shaped first partitions 10 arranged in the Y direction. Thus, in the X direction, a structure is taken such that an edge of the pixel electrode 13 is in contact with the edge of the first partition 10, or the edge of the pixel electrode 13 runs over the edge of the first partition 10.

When the structure of the present embodiment is adopted, as in the eleventh embodiment, the electro-conductive post 17 is covered with a first partition 10 extending in the Y direction, and which is separated from an aperture 12 which contributes to light emission, so that a dent does not occur on the cathode which contributes to light emission, making it possible to form a highly flat cathode. Thus, the film thickness of the organic light-emitting layer 14 becomes uniform, making it possible to realize a display device and an organic EL device 16 having light emission uniform within the device and within the pixel area.

Moreover, in the Y direction, the pixel electrode 13 is separated by the second partitions 11 extending in the X direction, and, in the X direction, the pixel electrode 13 is separated by the first partitions 10 extending in the Y direction; the resolution of the pixel electrode 13 is not limited by a minimum resolution space of the inkjet device used in printing the pixel electrode 13, and is determined by the resolution of the first partition 10 and the second partition 11.

In other words, the partition, which is formed using a photosensitive resin such as photosensitive polyimide material, photosensitive acrylic material, etc., has a minimum line width of not more than 5 um. The minimum resolution space in an inkjet method when the partition is not used is 30-50 um, so that adopting the structure of the present embodiment makes it possible to achieve a realization of fabrication which has a several times finer design in the X and Y directions relative to the related art.

In the Y direction. the auxiliary electrode 18, which is for connecting the drain electrode 7 and the pixel electrode 13, is separated in a self-aligning manner by a line-shaped partition which extends in the X direction, so that it may be formed such that the length in the X direction has the length sufficient to protrude into the aperture 12 formed by the first partitions 10 and the second partitions 11. Therefore, in the X direction, a distance between the auxiliary electrodes 18 may be arranged such that it is greater than the distance between the pixel electrodes 13 in the eleventh embodiment as described above, making it possible to substantially reduce shorting between neighboring auxiliary electrodes 18, or, in other words as a function, shorting between neighboring pixel electrodes 13.

Also in FIG. 34, the selector line, the signal line, the power line, and the capacitor are omitted in order to simplify the figure, but in order to put in the 2-transistor, 1-capacitor structure and the compensating circuit, etc., a structure is desirable which uses a larger number of TFTs 8 and capacitances.

Figures 36C, 36D:
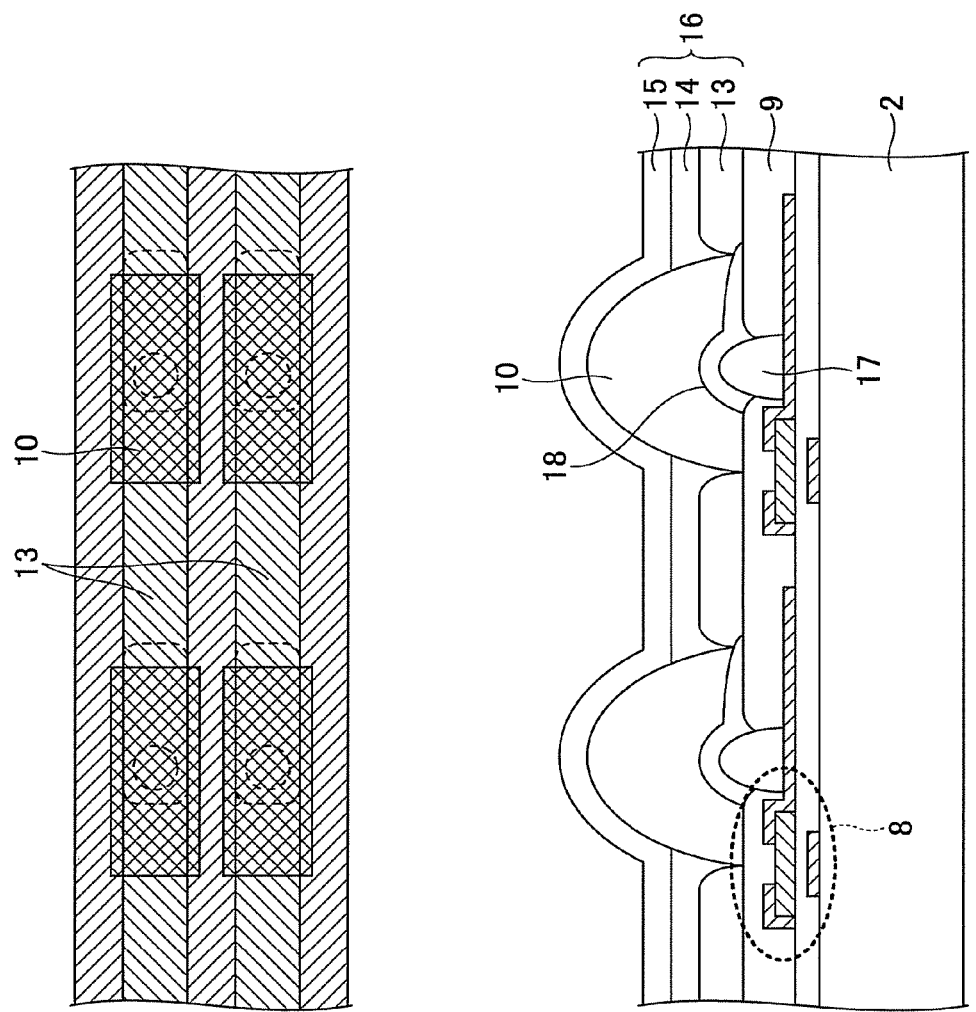
Figure 37:
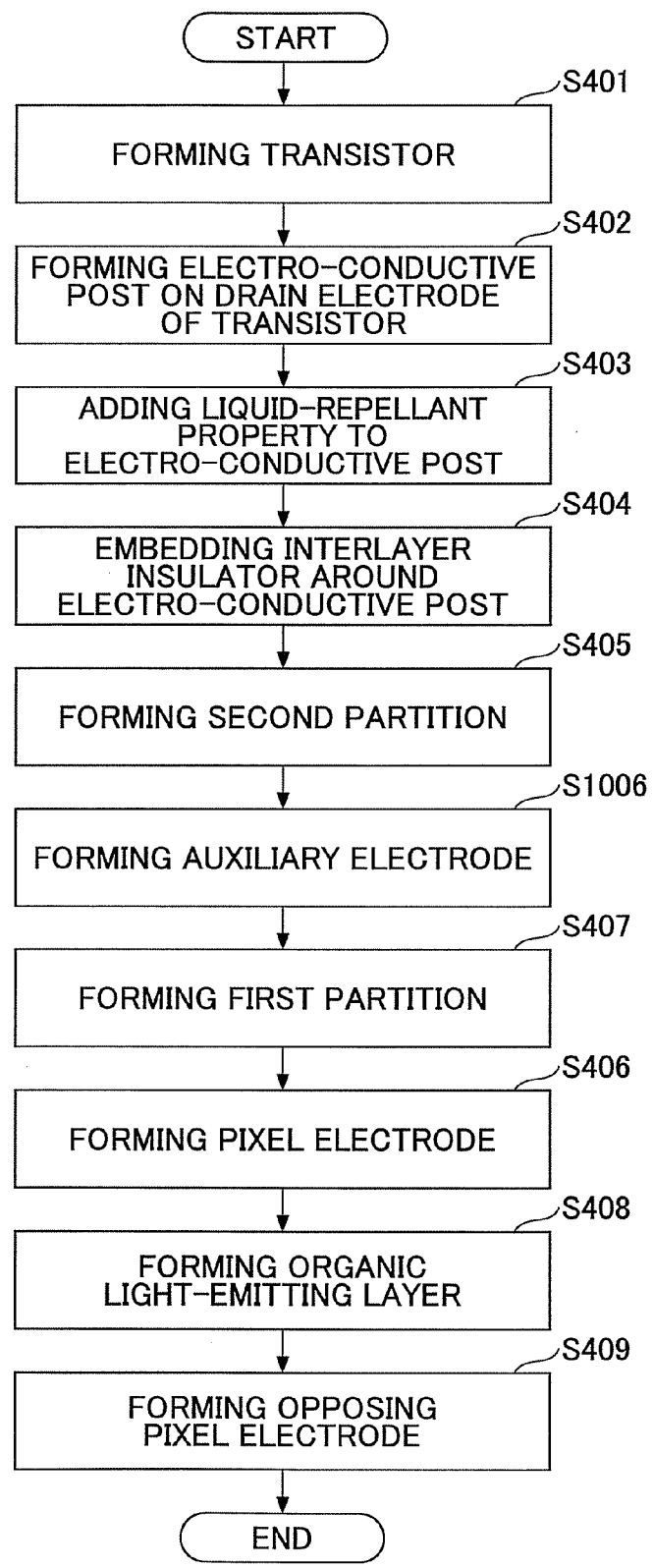
FIG. 37 is a flowchart illustrating the example of the method of manufacturing the display device of the thirteenth embodiment of the present invention.

Next, a method of manufacturing the display device according to the present embodiment is described according to FIGS. 27, 28, 36, and 37. FIGS. 36A through 36C show a plan view, while FIG. 36D shows a cross-sectional diagram. FIG. 37 is a flowchart of the above mentioned method of manufacturing.

First, as shown in FIG. 27A, using a method similar to the eleventh embodiment, on the substrate 2 as a glass substrate are formed TFTs 8, each of which has an amorphous silicon (a-Si) as an active layer 5 and which are arranged in a matrix shape with a density of 140 ppi (S401 in FIG. 37). Then, as shown in FIG. 27B, an electro-conductive post 17 is formed on the drain electrode 7 (S402 in FIG. 37). Next, as shown in FIG. 27C, a micro-contact print method is used to transfer a liquid-repellant material having a liquid-repellant property to a liquid material used in forming process of the interlayer insulator 9 in the following process, and a liquid-repellant film 19 is formed on the electro-conductive post 17 (S403 of FIG. 37). When the angle of contact of the liquid-repellant film with respect to pure water is set to 70-130 degrees or above, desirably 90-110 degrees, a satisfactory liquid-repellant property may be realized, and the electro-conductive post 17 is not buried in the interlayer insulator 9 in forming the interlayer insulator 9 in the following process.

Next, as shown in FIG. 27D, after forming the liquid-repellant film 19, around the electro-conductive post is applied insulating ink such that a polyimide precursor is dissolved in N-methylpyrrolidone, gamma-butyrolactone, etc., using an inkjet method, and then curing at 200 degrees Celsius is conducted for 30 minutes to form the interlayer insulator 9. Then, heating, UV ozone processing, or $O_2$ plasma processing, etc., are conducted to remove the liquid-repellant membrane 19 (S404 in FIG. 37).

Again in the present embodiment, as the liquid-repellant film 19 is formed at the top of the head of the electro-conductive post 17, the insulating ink is repelled, so that the electro-conductive post 17 protrudes from the surface of the interlayer insulator 9. Moreover, after removing the liquid-repellant section, even when a void occurs at an interface of the electro-conductive post 17 and the interlayer insulator 9, it occurs only at a relatively upper portion of the interlayer insulator 9, so that the void is filled with the electro-conductive ink easily in forming process of the auxiliary electrode 18 in the following process; thus, a contact hole structure having high long-term reliability may be realized.

Next, as shown in FIG. 28A, after the interlayer insulator 9 is formed, a water-repellant photosensitive resin is applied, exposure is performed using a photo mask which has a pattern of a second partition 11, development is performed using a tetramethyl ammonium solution, and thermal curing is performed to form a second partition 11 (S405 in FIG. 37). The second partition 11 is shaped as a line extending in the X direction; alignment of a photo mask having a pattern of the second partition 11 is performed such that the electro-conductive post 17 is arranged between the second partitions 11. The second partition 11 is arranged to have a width of 10-30 um and a film thickness of 1-3 um.

Then, a sample is UV ozone treated, and only the surface of the interlayer insulator 9 is hydrophilized, while maintaining the liquid-repellant property of the surface of the second partitions 11. Taking account of printing of an auxiliary electrode 18 by the inkjet method in the following process, the hydrophilicity of the interlayer insulator 9 is preferably such that an angle of contact with respect to pure water is not more than 30 degrees, and desirably not more than 20 degrees, and the liquid repellant property of the second partition 11 is such that an angle of contact with respect to pure water is between 50 to 130 degrees or above, and desirably between 60 to 110 degrees. As the water-repellant photosensitive resin, a material used in the eleventh embodiment may be used.

Thereafter, as shown in FIG. 36A, using an inkjet machine, ink in which nano Ag particles are dispersed in a polar solvent is printed between the second partitions 11, and burning thereof is conducted to form an auxiliary electrode 18 (S1006 in FIG. 37). The auxiliary electrode 18 covers the electro-conductive post 17, and a portion thereof is formed such that it protrudes into the aperture 12 surrounded by the first partitions 10 and the second partitions 11 that are formed after a formation of the first partitions 10 in the following process. The film thickness of the auxiliary electrode 18 is arranged to be 30-100 nm.

In the Y direction, the surface of the second partition 11 is water repellant, so that the edge of the nano Ag ink stops at the second partition 11 and is separated in a self-aligning manner. In the present embodiment, the width of the second partition 11 is arranged to be 10-30 um. On the other hand, there is no partition in the X direction, so that the space between the auxiliary electrodes 18 must be made larger than the minimum resolution space of the inkjet machine. In the present embodiment, the space between the auxiliary electrodes 18 in the X direction is arranged to be 125-140 um.

The polar solvent used for the third electro-conductive ink in the present embodiment includes alcohol, ethylene glycol, ethylene glycol ether, etc., in a manner similar to the second electro-conductive ink used in printing the pixel electrode 13 of the eleventh embodiment. Moreover, as the electro-conductive fine particles to be dispersed in the polar solvent, known electro-conductive fine particles such as nano Au, nano Pd, and nano Cu, nano ITO, etc. besides nano Ag may be used.

As shown in FIG. 36B, after the auxiliary electrode 18 is formed, a water-repellant photosensitive resin is applied again, exposure is performed using a photo mask having a pattern of the first partition 10, development is performed using a tetramethyl ammonium solution, and thermal curing is performed to form the first partitions 10 (S407 in FIG. 37). The first partition 10 is a dot shape arranged in the Y direction; alignment is performed of a photo mask having a pattern of the first partition 10 such that the electro-conductive posts 17 are covered between the second partitions 11. The first partition 10 is arranged to have a width of 20-30 um in the X direction and a film thickness of 1-3 um.

Then, a sample is UV ozone processed again to hydrophilize the surface of the interlayer insulator 9 that is in a region not covered with the auxiliary electrode 18 in the aperture 12, and the auxiliary electrode 18, while maintaining the liquid-repellant property of the surface of the first partitions 10 and the second partitions 11.

Again in the present embodiment, taking account of printing of an organic light-emitting layer 14, and a pixel electrode 13 by the inkjet method in the following process, the hydrophilicity of the surface of the interlayer insulator that is in the region not covered with the auxiliary electrode 18 in the aperture 12 and the auxiliary electrode 18 is preferably such that an angle of contact with respect to pure water is not more than 30 degrees, and desirably not more than 20 degrees, and the liquid repellant property of the second partition 11 is preferably such that an angle of contact with respect to pure water is between 50 to 130 degrees or above, and desirably between 60 to 110 degrees. As the water-repellant photosensitive resin, a material used in the eleventh embodiment may be used.

Next, as shown in FIG. 36C, after the first partition 10 is formed, a pixel electrode 13 is formed using an inkjet device within an aperture 12 surrounded by the first partitions 10 and the second partitions 11 (S406 of FIG. 37). For printing the pixel electrode 13, it suffices to print and burn the second electro-conductive ink such that nano Ag particles are dispersed in a polar solvent. The film thickness of the pixel electrode 13 is arranged to be 50-200 nm.

The polar solvent used for the second electro-conductive ink in the present embodiment includes alcohol, ethylene glycol, and ethylene glycol ether, etc., as in the eleventh embodiment. Moreover, as the electro-conductive fine particle to be dispersed in the polar solvent, known electro-conductive fine particles such as nano Au, nano Pd, and nano Cu, nano ITO, etc., besides nano Ag may be used.

Flatness of the cathode may decrease somewhat due to a part of the auxiliary electrode 18 protruding into the aperture 12, so that the decrease is much smaller relative to the dent of the cathode by a contact hole, that has been a problem of the prior art. From the point of view of the uniformity of the image quality, taking account of an alignment margin, it is desirable that the auxiliary electrode 18 be arranged not to significantly protrude into the aperture as much as possible. In the embodiment of the present embodiment, the length of the auxiliary electrode 18 which protrudes into the aperture 12 is arranged to 5-15 um.

As shown in FIG. 36D, after the pixel electrode 13 is formed, the organic light-emitting layer 14 is formed using the inkjet method (S408 in FIG. 37). The organic light-emitting layer 14 is formed such that each of three types that emit light of R, G, and B, are separately applied for each column in the Y direction. For the organic light-emitting layer 14, as in the eleventh embodiment, a common high molecular light-emitting material may be used; for example, polythiophenes, polyparaphenylenes, polyparaphenylene vinylenes, polyfluorenes, iridium complexes, etc., may be dissolved in the polar solvent to yield ink, and the organic light-emitting layer may be formed by printing, drying, and thermal curing using the ink jet device. The film thickness of the organic light-emitting later 14 is arranged to vary between 50 and 150 nm, taking into account the light-emitting efficiency of R, G, and B.

Then, using sputtering method, on the whole face of the partitions and the organic light-emitting layer 14 is deposited, as an opposing electrode 15, a transparent electro-conductive film including $In_2O_3.SnO_2$ (S409 in FIG. 37). The opposing electrode 15 is a common electrode, so that it is patterned using a shadow mask in sputtering process. The film thickness of the pixel electrode 15 is arranged to be 50-200 nm.

For increasing the efficiency of carrier injection, it is more desirable to form an electron injecting layer between the pixel electrode 13 and the organic light-emitting layer 14, and a hole injecting layer between the organic light-emitting layer 14 and the opposing electrode 15.

For the electron injecting layer, known materials such as a cyclopentadien derivative, an oxadiazole derivative, a bistyrylbenzene derivative, etc. may be used, while, for the hole injecting layer, PEDOT/PSS, etc., may be used. The electron injecting layer and the hole injecting layer may also be formed by printing, by an inkjet machine, a solution which is made into ink by dissolving in the polar solvent, and then perform drying thereof.

Finally, a display device 1, which layers the organic EL device 16 on the TFT 8 is completed by applying light-curing epoxy resin to an outer periphery portion of a sample, and adhering cap glass for sealing (not shown).

The display device manufactured with the present method has a larger width of the pixel electrode 13 in the X direction relative to the display device of the eleventh embodiment, so that an expansion of the light-emitting region due to a higher aperture rate can be achieved. Moreover, when the display device manufactured according to the present embodiment is observed by the OBIRCH, a void is not observed around the electro-conductive post, and a highly reliable contact hole structure can be realized.

Moreover, when the display device manufactured with the present embodiment is provided with a flexible tape on which a driving IC is mounted using an anisotropic electro-conductive film, and an image evaluation test is performed, as in the eleventh embodiment, uneven light emission due to the electro-conductive post 17 (contact hole) is not observed at all, so that, relative to the eleventh embodiment, light emission at a higher brightness and at a same level of uniformity within the display area is confirmed.

Furthermore, while, in the present embodiment, the first partition 10 and the second partition 11 are formed by the photolithography method using a water-repellant photosensitive resin, at least one of the partitions may be formed using a printing method such as nozzle print method, micro-contact print method, inkjet method, etc., which uses ink containing water-repellant high molecular resin depending on the line width and shape of the first partition 10 and the second partition 11, or at least one of the partitions may be formed using a printing method such as the nozzle print method, the micro-contact print method, or the inkjet method using ink containing high molecular resin, and then made liquid-repellant by $CF_4$ plasma process, etc.

Moreover, while, in the present embodiment, the auxiliary electrode is covered with the electro-conductive post, it suffices that the electro-conductive post and the auxiliary electrode are connected, and the electro-conductive post may penetrate the auxiliary electrode. Furthermore, as an interlayer insulator, as in the eleventh embodiment and the variations 1 and 2 thereof, a room temperature cured glass and a non-solvent high molecular resin liquid material may be used, and the interlayer insulator may be formed with the method of manufacturing of the variations 1 and 2 of the eleventh embodiment.

Fourteenth Embodiment

Next, the fourteenth embodiment of the present invention is described. While in the eleventh through the thirteenth embodiments, a display device 1 using an organic EL device 16 is described, with the present structure, a pixel electrode 13 having a high aperture rate may be realized, so that a high aperture rate is obtained even in a display device 1 having a display functional layer on the pixel electrode 13 and an opposing electrode 15 on the display function layer in lieu of the opposing electrode 15 and the organic light-emitting layer 14, making it possible to obtain a satisfactory image. As the display functional layer, an electrophoretic particle layer, an electrochromic layer, a liquid crystal layer, etc., may be adopted.

Figure 38A:
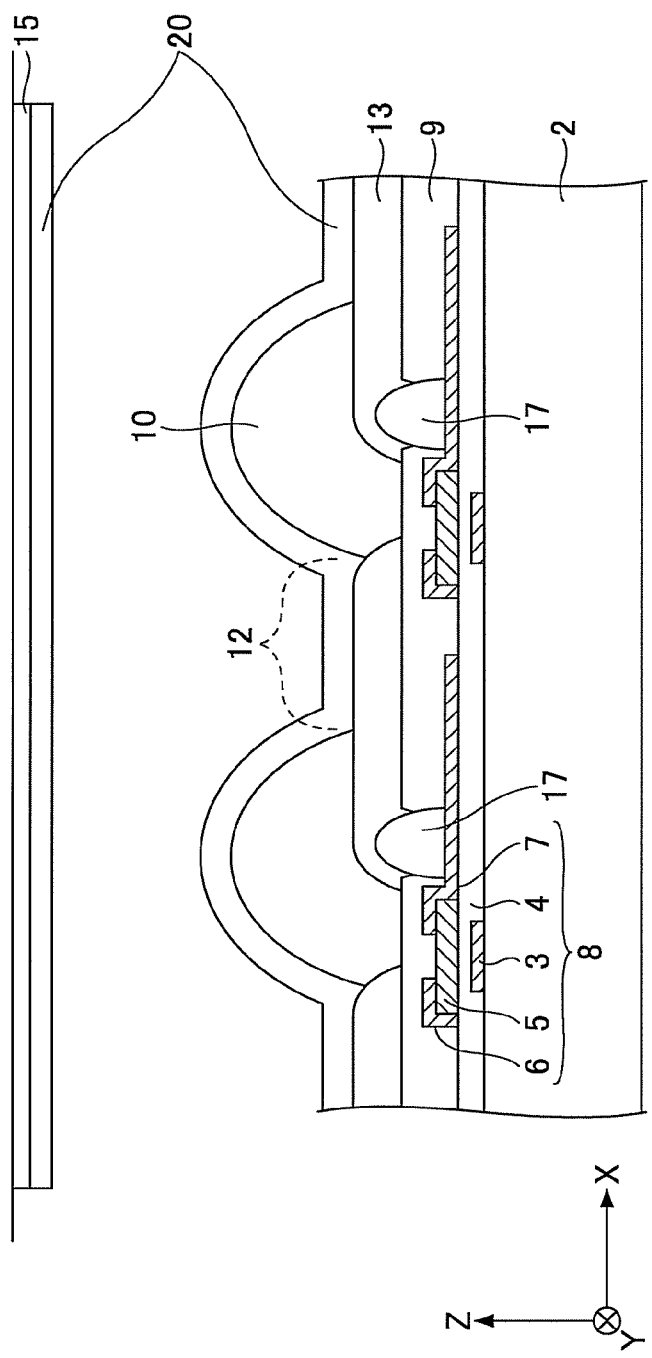
FIGS. 38A through 38C are cross-sectional diagrams of the display device according to a fourteenth embodiment of the present invention.

FIG. 38A shows an example of the display device 1 which layers the liquid crystal display device according to the present embodiment. The substrate 2 has arranged thereon in a matrix shape TFTs 8, each of which includes a gate electrode 3, a gate insulator 4, an active layer 5, a source electrode 6, and a drain electrode 7. Moreover, the TFT 8 is covered with the interlayer insulator 9, on which is formed line-shaped first partitions 10, and line-shaped second partitions 11 arranged to intersect with the first partitions 10; and furthermore, apertures 12 which are formed by the second partitions 11 and the first partitions 10 are arranged in a matrix shape. The first partition 10 and the second partition 11 may intersect with each other in a generally orthogonal manner or a slanted manner.

Furthermore, in each of the apertures 12 arranged in a matrix shape, a pixel electrode 13, which is separated in the Y direction by the second partition 11 extending in the X direction, is connected to the drain electrode 7 of the individual TFT 8 by the electro-conductive post 17 which is formed such that it penetrates the interlayer insulator 9. The electro-conductive post 17, which includes an electro-conductive material, is covered with a portion of the first partition 10. Furthermore, an alignment film 20 including rubbed polyimide is formed on the first partition 10 and the second partition 11.

Moreover, a transmissive opposing electrode 15 is formed on the opposing substrate 2, and another alignment film 20 including rubbed polyimide is also formed on the transmissive opposing electrode 15. Rubbing direction on the transmissive opposing electrode 15 side is arranged to be orthogonal with the pixel electrode 13 side.

In between the two opposing alignment films is filled nematic liquid crystal. When the TFT 8 is turned on by a potential applied to the gate electrode 3 of the TFT 8, a potential of the pixel electrode 13 changes through the electro-conductive post 17, so that the alignment state of the nematic liquid crystal changes, acting as a shutter function to display an image.

Figure 38B:
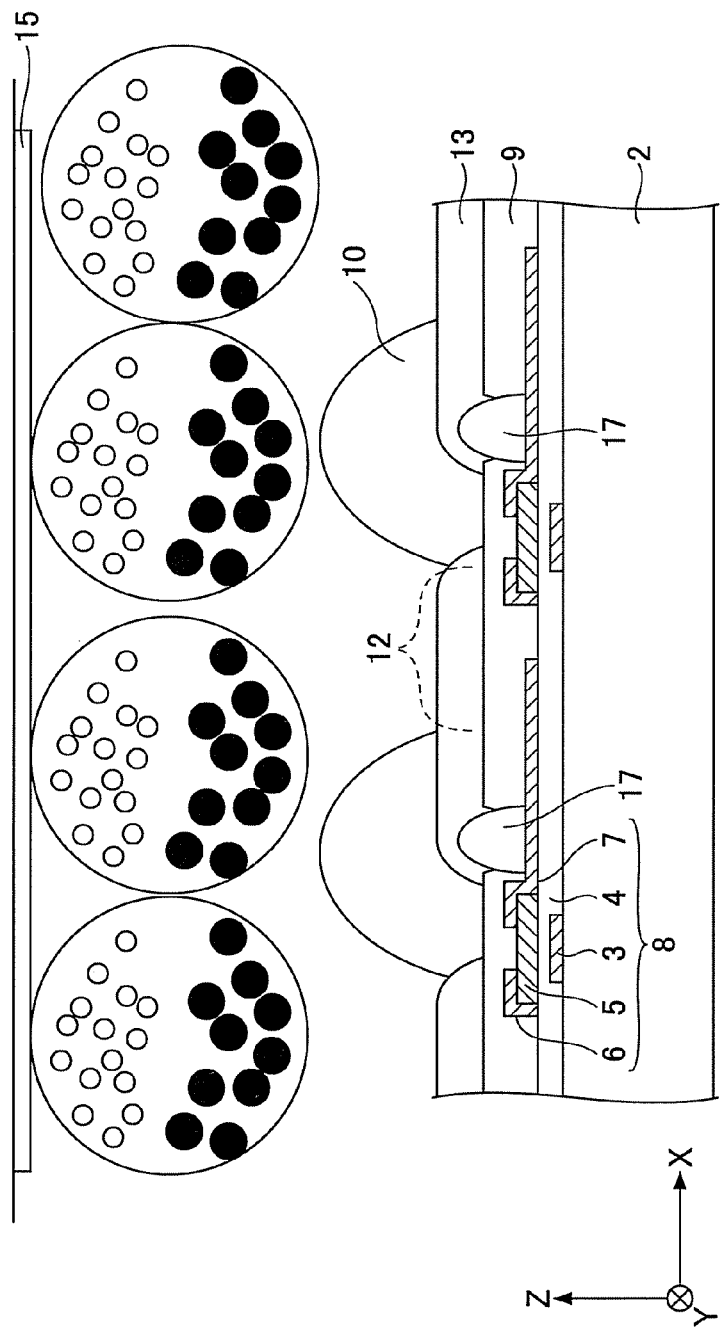

FIG. 38B shows an example of the display device 1 which layers the electrophoretic device according to the present embodiment. The substrate 2 has arranged thereon in a matrix shape TFTs 8, each of which includes a gate electrode 3, a gate insulator 4, an active layer 5, a source electrode 6, and a drain electrode 7. Moreover, the TFT 8 is covered with the interlayer insulator 9, on which is formed line-shaped first partitions 10, and line-shaped second partitions 11 arranged to intersect with the first partitions 10; furthermore, apertures 12 which are formed by the second partitions 11 and the first partitions 10 are arranged in a matrix shape. Furthermore, in an aperture 12 is arranged in a matrix shape a pixel electrode 13, which is separated in the Y direction by the second partition 11 extending in the X direction and which is connected to the drain electrode 7 of the individual TFT 8 by the electro-conductive post 17, which is formed such that it penetrates the interlayer insulator 9. The electro-conductive post 17, which includes an electro-conductive material, is covered with a portion of the first partition 10.

On the opposing substrate 2 is formed a transmissive opposing electrode 15, on which is fixed, by electrodeposition, microcapsules such that white particles which include positive-charged $TiO_2$ and black particles which include negative-charged carbon that are dispersed in silicone oil, and which are arranged to have a structure adhered onto the pixel electrode 13 by an adhesive.

In the present embodiment, when the TFT 8 is turned on by a potential applied to the gate electrode 3 of the TFT 8, the potential of the pixel electrode 13 changes through the electro-conductive post 17, and the white and the black particles are attracted onto the pixel electrode 13 or are attracted to the transmissive opposing electrode 15 side, making it possible to display a high-contrast black and white image.

Figure 38C:
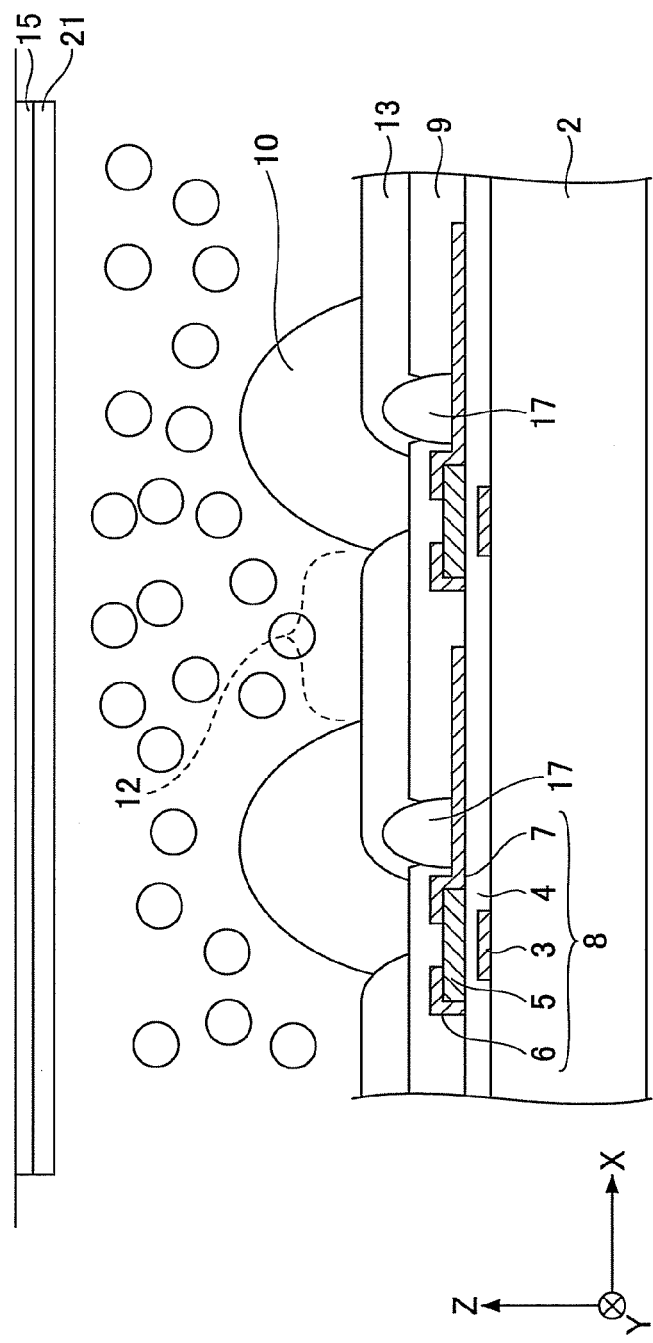

FIG. 38C shows an example of the display device 1 which layers the electrochromic device according to the present embodiment. The substrate 2 has arranged thereon in a matrix shape TFTs 8, each of which includes a gate electrode 3, a gate insulator 4, an active layer 5, a source electrode 6, and a drain electrode 7. Moreover, the TFT 8 is covered with the interlayer insulator 9, on which is formed line-shaped first partitions 10, and line-shaped second partitions 11 arranged to intersect with the first partitions 10; and, furthermore, apertures 12 which are formed by the second partitions 11 and the first partitions 10 are arranged in a matrix shape.

Furthermore, in an aperture 12 is arranged in a matrix shape a pixel electrode 13, which is separated in the Y direction by the second partition 11 extending in the X direction and which is connected to the drain electrode 7 of the individual TFT 8 by the electro-conductive post 17 which is formed such that it penetrates the interlayer insulator 9. The electro-conductive post 17, which includes an electro-conductive material, is covered with a portion of the first partition 10.

On the opposing substrate 2 is formed a transmissive opposing electrode 15, on which an electrochromic layer 21 is layered, and which is structured so that a space in between the electrochromic layer 21 and the pixel electrode 13 is filled with an electrolytic solution such that $TiO_2$ particles are dispersed. In the present embodiment, when the TFT 8 is turned on by a potential applied to a gate electrode 3 of the TFT 8, current flows into the pixel electrode 13 through the Electro-conductive post 17, so that reduction-oxidation reaction occurs at the electrochromic layer 21 to color or decolor, making it possible to display a two-color image.

The above-described display device using the liquid crystal device, the display device using the electrophoretic device, and the display device using the electrochromic device also have a high aperture rate.

The present embodiment is structured to be similar to the eleventh embodiment, but may be structured to be similar to the twelfth and thirteenth embodiments.

The above-described embodiments and variations thereof are preferred embodiments and variations of the present invention, so that various changes in embodying the same are possible thereto without departing from the spirit of the present invention.

The present application is based on the Japanese Priority Applications No. 2009-207087 filed on Sep. 8, 2009, No. 2010-035335 filed on Feb. 19, 2010, and No. 2010-190369 filed on Aug. 27, 2010.

The invention claimed is:

1. A display apparatus, comprising:
   a substrate;
   a transistor formed on the substrate;
   an interlayer insulator formed on the transistor;
   a pixel electrode formed on the interlayer insulator;
   a first partition located above a contact hole which penetrates the interlayer insulator; and
   a second partition which intersects with the first partition, or which is located on a straight line intersecting with the first partition, and which brings a width value of the pixel electrode to a predetermined value.

2. The display apparatus as claimed in claim 1, further comprising an auxiliary electrode formed across the interlayer insulator and the contact hole at a location between the contact hole and the first partition, wherein an end of the auxiliary electrode is located below the pixel electrode.

3. The display apparatus as claimed in claim 1, wherein the contact hole is an electro-conductive post including an electro-conductive material.

4. The display apparatus as claimed in claim 3, wherein the electro-conductive post protrudes from a surface of the interlayer insulator.

5. The display apparatus as claimed in claim 1, wherein the first partition is a partition formed on the second partition.

6. The display apparatus as claimed in claim 1, wherein one or both of the first partition and the second partition have a liquid-repellant property.

7. The display apparatus as claimed in claim 1, wherein the second partition is a partition which is located such that it is generally orthogonal to the first partition, and such that it brings a width value of the pixel electrode to a predetermined value.

8. The display apparatus as claimed in claim 1, further comprising an organic EL device which includes an organic light-emitting layer and an opposing electrode formed on the pixel electrode and neighboring the first partition.

9. The display apparatus as claimed in claim 1, further comprising a display functional layer on the pixel electrode, and an opposing electrode on the display functional layer, wherein the display functional layer is one of an electrophoretic particle layer, an electrochromic layer, and a liquid crystal layer.

* * * * *